US009556353B2

(12) United States Patent
Cheng et al.

(10) Patent No.: US 9,556,353 B2
(45) Date of Patent: Jan. 31, 2017

(54) ORIENTATION CONTROL MATERIALS FOR BLOCK COPOLYMERS USED IN DIRECTED SELF-ASSEMBLY APPLICATIONS

(71) Applicant: International Business Machines Corporation, Armonk, NY (US)

(72) Inventors: Joy Cheng, Taipei (TW); Anindarupa Chunder, San Jose, CA (US); Melia Tjio, San Jose, CA (US); Ankit Vora, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/526,884

(22) Filed: Oct. 29, 2014

(65) Prior Publication Data

US 2016/0122571 A1    May 5, 2016

(51) Int. Cl.

| | |
|---|---|
| *C09D 125/14* | (2006.01) |
| *G03F 1/00* | (2012.01) |
| *G03F 7/00* | (2006.01) |
| *G03F 7/038* | (2006.01) |
| *C08F 12/22* | (2006.01) |
| *C08F 212/08* | (2006.01) |

(Continued)

(52) U.S. Cl.
CPC ............ *C09D 125/14* (2013.01); *C08F 12/22* (2013.01); *C08F 212/08* (2013.01); *C08F 293/005* (2013.01); *C09D 125/18* (2013.01); *G03F 1/00* (2013.01); *G03F 7/0002* (2013.01); *G03F 7/038* (2013.01); *C08F 2438/01* (2013.01)

(58) Field of Classification Search
USPC ........................................ 524/548; 525/327.3
See application file for complete search history.

(56) References Cited

U.S. PATENT DOCUMENTS

| | | | |
|---|---|---|---|
| 6,899,983 | B2 | 5/2005 | Tamoto et al. |
| 7,521,090 | B1 | 4/2009 | Cheng et al. |
| (Continued) | | | |

OTHER PUBLICATIONS

Jackson, et al., "The formation of core cross-linked star polymer and nanogel assembliesfacilitated by the formation of dynamic covalent imine bonds", Polym. Chem., 2011, 2, 2500.

(Continued)

*Primary Examiner* — Peter D Mulcahy
*Assistant Examiner* — Henry Hu
(74) *Attorney, Agent, or Firm* — Michael R. Roberts

(57) ABSTRACT

An orientation control layer (OCL) for self-assembly of block copolymers comprises a random copolymer comprising a first repeat unit having an ethylenic backbone functional group and a side chain aromatic ring, a second repeat unit comprising an ethylenic backbone functional group and a side chain polycarbonate, and a third repeat unit comprising an ethylenic backbone functional group and a side chain ester or amide bearing an active group capable of forming a covalent bond with a substrate surface (e.g., a silicon wafer). The OCLs are neutral wetting to block copolymers having a high Flory-Huggins interaction parameter chi ($\chi$) ("high-chi" block copolymers) such as a block copolymer comprising a polystyrene block and a polycarbonate block. The neutral OCL wetting properties allow for formation of lamellar domain patterns of the self-assembled high-chi block copolymers to be oriented perpendicular to the OCL surface.

27 Claims, 20 Drawing Sheets

(51) Int. Cl.
 C08F 293/00 (2006.01)
 C09D 125/18 (2006.01)

(56) References Cited

U.S. PATENT DOCUMENTS

| | | | |
|---|---|---|---|
| 7,807,332 | B2 | 10/2010 | Huang et al. |
| 8,017,194 | B2 | 9/2011 | Colburn et al. |
| 8,080,615 | B2 * | 12/2011 | Millward ............ B81C 1/00031 525/108 |
| 8,623,458 | B2 | 1/2014 | Cheng et al. |
| 8,691,925 | B2 * | 4/2014 | Wu ....................... C08F 293/00 430/296 |
| 2012/0088188 | A1 | 4/2012 | Trefonas et al. |
| 2012/0322006 | A1 | 12/2012 | Kato et al. |
| 2013/0274380 | A1 | 10/2013 | Cheng et al. |
| 2014/0273476 | A1 * | 9/2014 | Cheng ................. B81C 1/00031 438/703 |
| 2015/0329664 | A1 * | 11/2015 | Cheng ................. C09D 169/00 427/256 |

OTHER PUBLICATIONS

Keen, et al., "Control of the Orientation of Symmetric Poly(styrene)-blockpoly(D,L•lactide) Block Copolymers Using Statistical Copolymers of Dissimilar Composition," Langmuir 2012, 28, 15876-15888; Published: Oct. 22, 2012.

Kim, et al., "Consequences of Surface Neutralization in Diblock Copolymer Thin Films", ACSNano, 2013, vol. 7, p. 9905-9919; published online Oct. 16, 2013.

Koulic, et al., "Premade versus in situ formed compatibilizer at the PS/PMMA interface: contribution of the Raman confocal microscopy to the fracture analysis", Polymer 42 (2001) 2947±2957.

Men'Shikov, et al., "Determination of the Flory-Huggins Parameter for a Pair of Polymer Units from AFM Data for Thin Films of Block Copolymers", Protection of Metals and Physical Chemistry of Surfaces, 2009, vol. 45, No. 3, pp. 295-299. © Pleiades Publishing, Ltd., 2009.

Pratt, et al., "Exploration, Optimization, and Application of Supramolecular Thiourea-Amine Catalysts for the Synthesis of Lactide (Co)polymers", Macromolecules 2006, 39, 7863-7871; Published on Web Oct. 18, 2006.

Vora, et al., "Directed Self Assembly of Topcoat-free, Integration-friendly High-c Block Copolymers", slides of talk given at Photopolymer Conference, Jul. 2014, Chiba, Japan.

Yasukawa, et al., "Polymer-Incarcerated Chiral Rh/Ag Nanoparticles for Asymmetric 1,4-Addition Reactions of Arylboronic Acids to Enones: Remarkable Effects of Bimetallic Structure on Activity and Metal Leaching", J. Am. Chem. Soc. 2012, 134, 16963-16966; Published: Sep. 24, 2012.

* cited by examiner

CL-1, Example 25

CL-2, Example 26

CL-3, Example 27

CL-4, Example 28

CL-5, Example 29

CL-6, Example 35 (comp)

CL-9, Example 38 (comp)

CL-9, Example 39 (comp)

CL-11, Example 45 (comp)

CL-12, Example 46 (comp)

CL-13, Example 47 (comp)

CL-14, Example 48 (comp)

CL-15, Example 49 (comp)

CL-16, Example 51 (comp)

CL-17, Example 52 (comp)

1. Coat
2. Optional PAB

1. Coat
2. Optional PAB

Self-Assemble

Selective Domain Removal

Coat

Self-Assemble

Selective Domain Removal

Transfer

Transfer

Selective Domain Removal

Transfer

ORIENTATION CONTROL MATERIALS FOR BLOCK COPOLYMERS USED IN DIRECTED SELF-ASSEMBLY APPLICATIONS

STATEMENT REGARDING PRIOR DISCLOSURES BY THE INVENTOR OR A JOINT INVENTOR

The following disclosure is submitted under 35 U.S.C. 102(b)(1)(A): Vora, A., et al., a presentation entitled "Directed Self Assembly of Topcoat-free, Integration-friendly High-χ Block Copolymers", Photopolymer 2014 Conference at Chiba, Japan, Jul. 8, 2014.

BACKGROUND

The present invention relates to orientation control materials for block copolymers used in directed self-assembly applications, and more specifically orientation-control materials for high-chi ($\chi$) block copolymers prepared by ring opening of cyclic carbonate monomers.

Block copolymers (BCPs) find many applications in solution, bulk and thin films. Thin film applications of BCPs are particularly attractive for nanolithography and patterning due to the ability of some BCPs to form periodic self-assembled structures ranging in feature size from 5 nm to 50 nm. The thin-film self-assembly property of BCPs can be utilized with existing photolithographic techniques to provide a unique approach to long range order for semiconductor applications. This approach, called directed self-assembly (DSA) of block copolymers, promises to extend the patterning capabilities of conventional lithography.

BCPs for directed self-assembly (DSA) applications comprise two or three polymer blocks that can phase separate into domains characterized by ordered nanoscopic arrays of spheres, cylinders, gyroids, and lamellae. The ability of a BCP to phase separate depends on the Flory Huggins interaction parameter chi ($\chi$). Polystyrene-block-poly(methyl methacrylate) (PS-b-PMMA) is the most widely used block copolymer for DSA. For PS-b-PMMA block copolymers, perpendicular orientation of BCP lamellar domains is obtained by forming a layer of the BCP on an orientation control layer followed by annealing the BCP thin film to induce phase separation. Typically for PS-b-PMMA the orientation control layer is a crosslinkable or a brush-type random copolymer formed with styrene and methyl methacrylate. The neutrality of the orientation control layer (underlayer) can be controlled by adjusting the composition of styrene and methyl methacrylate in the final crosslinkable or brush-type random copolymer to enable perpendicular orientation of the BCP.

The minimum half-pitch of PS-b-PMMA is limited to about 10 nm because of lower interaction and interaction parameter chi ($\chi$) between PS and PMMA. To enable further feature miniaturization, block copolymers having a high interaction parameter chi between two blocks ("high-chi") are desirable. Several block copolymers having high interaction parameter between the two blocks have been studied to obtain smaller feature sizes. Of particular interest are block copolymers comprising a block derived from ring opening of a cyclic carbonyl monomer from a reactive end-group on the first polymer block. Block copolymers derived by ring opening polymerization (ROP) of cyclic monomers (e.g., lactides, lactones, ethylene oxide) have been used to generate sub-10 nm feature size for patterning application.

For block copolymers where both blocks are synthesized by a vinyl polymerization reaction, the corresponding orientation control materials can be easily synthesized by free radical or controlled-radical polymerization techniques. However, for block copolymers where one block is synthesized by vinyl addition and the second block by ring opening polymerization, simple techniques like radical polymerization cannot be used to make random copolymers of the corresponding monomers.

There exists a need to develop crosslinkable or brush-type random copolymers as orientation control materials for block copolymers wherein one block is made by a vinyl addition reaction and the second block is made by a ring opening polymerization.

SUMMARY

Accordingly, a polymer is disclosed, comprising:
i) a divalent first repeat unit of formula (A-1):

wherein
$R^x$ is a monovalent radical selected from the group consisting of H, methyl, ethyl, and trifluoromethyl (*—$CF_3$), and
$R^b$ is a monovalent radical comprising an aromatic ring;
ii) a divalent second repeat unit of formula (A-2):

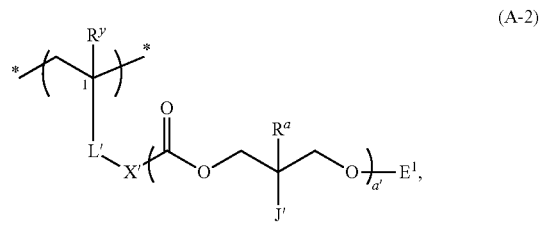

wherein
a' represents numbers of repeat units enclosed by the parentheses and has an average value of 1 or more,
$E^1$ is a monovalent end group independently selected from the group consisting of hydrogen and groups comprising 1-10 carbons,
each J' is an independent monovalent radical selected from the group consisting of hydrogen and groups comprising 1 to 10 carbons,
L' is an independent divalent linking group comprising 1 to 10 carbons,
each $R^a$ is an independent monovalent radical selected from the group consisting of hydrogen, methyl, and ethyl,
$R^y$ is a monovalent radical selected from the group consisting of H, methyl, ethyl, and trifluoromethyl (*—$CF_3$), and
X' is an independent divalent radical selected from the group consisting of *—O—*, *—S—*, *—N(H)—*, and *—N(R")—*, wherein R" is a monovalent radical comprising 1 to 6 carbons; and iii) a divalent third repeat unit of formula (A-3):

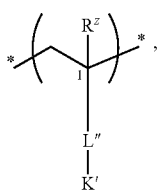
(A-3)

wherein $R^z$ is a monovalent radical selected from the group consisting of H, methyl, ethyl, and trifluoromethyl (*—$CF_3$), L" is an independent divalent linking group comprising 1 to 10 carbons, and K' is a monovalent electrophilic group capable of reacting with a nucleophile to form a covalent bond;

and wherein the first repeat unit, the second repeat unit, and the third repeat of the polymer are linked covalently in a random distribution.

Also disclosed is a method, comprising:

forming an initial layer disposed on a surface of a substrate, the initial layer comprising an above-described polymer and a solvent; and treating the initial layer to remove the solvent, thereby forming an article (modified substrate) comprising an orientation control layer disposed on the surface of the substrate, wherein i) the orientation control layer comprises a derivative of the polymer which is covalently linked to the substrate and ii) the orientation control layer is suitable for a lithographic process that includes self-assembly of a block copolymer disposed on the orientation control layer, the block copolymer comprising a polycarbonate block.

Further disclosed is an article (modified substrate), comprising:

a substrate; and an orientation control layer disposed on a surface of the substrate, the orientation control layer comprising a polymer which is covalently linked to the surface of the substrate, wherein the polymer comprises:

i) a divalent first repeat unit of formula (A-1):

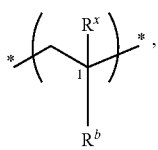
(A-1)

wherein $R^x$ is a monovalent radical selected from the group consisting of H, methyl, ethyl, and trifluoromethyl (*—$CF_3$), and $R^b$ is a monovalent radical comprising an aromatic ring;

ii) a divalent second repeat unit of formula (A-2):

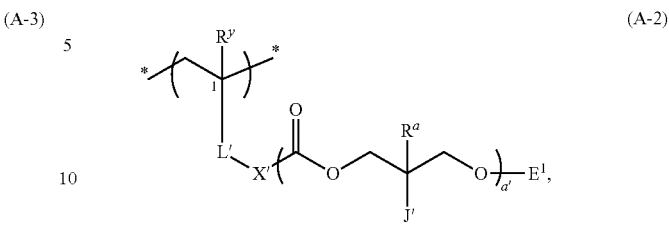
(A-2)

wherein a' represents numbers of repeat units enclosed by the parentheses and has an average value of 1 or more, $E^1$ is a monovalent end group independently selected from the group consisting of hydrogen and groups comprising 1-10 carbons, each J' is an independent monovalent radical selected from the group consisting of hydrogen and groups comprising 1 to 10 carbons, L' is an independent divalent linking group comprising 1 to 10 carbons, each $R^a$ is an independent monovalent radical selected from the group consisting of hydrogen, methyl, and ethyl, $R^y$ is a monovalent radical selected from the group consisting of H, methyl, ethyl, and trifluoromethyl (*—$CF_3$), and X' is an independent divalent radical selected from the group consisting of *—O—*, *—S—*, *—N(H)—*, and *—N(R")—*, wherein R" is a monovalent radical comprising 1 to 6 carbons; and (iii) a trivalent third repeat unit of formula (A-8):

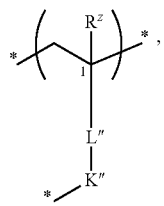
(A-8)

wherein $R^z$ is a monovalent radical selected from the group consisting of H, methyl, ethyl, and trifluoromethyl (*—$CF_3$), L" is an independent divalent linking group comprising 1 to 10 carbons, and K" is a divalent linking group, and the starred bond of K" is covalently linked to a surface group of the substrate;

and wherein the first repeat unit and the second repeat unit are randomly distributed in the polymer, and the orientation control layer is neutral wetting with respect to a block copolymer comprising a polycarbonate block.

Also disclosed is a method of self-assembly, comprising:

forming a layer comprising a block copolymer disposed on the orientation control layer of the above-described article, wherein the block copolymer comprises a polycarbonate block for self-assembly and the orientation control layer is neutral wetting to the block copolymer; and inducing the block copolymer to self-assemble, thereby forming a layered structure comprising a pattern of phase separated lamellar domains of the block copolymer disposed on the orientation control layer, wherein the orientation control layer is in contact with each block of the block copolymer.

Also disclosed is a method of generating a domain pattern of a self-assembled polycarbonate-containing block copolymer, comprising:

forming a thin layer over a substrate, by coating and baking a solution containing at least an above-described polymer;

fixing the thin layer on the substrate by baking and/or irradiating the thin layer, and optionally rinsing the fixed thin layer;

forming a layer comprising the block copolymer over the fixed thin layer, wherein at least one block of the block copolymer is a polycarbonate; and annealing the block copolymer layer to generate the domain pattern comprising phase separated domains of the block copolymer.

The above-described and other features and advantages of the present invention will be appreciated and understood by those skilled in the art from the following detailed description, drawings, and appended claims.

DETAILED DESCRIPTION

Figure 1:
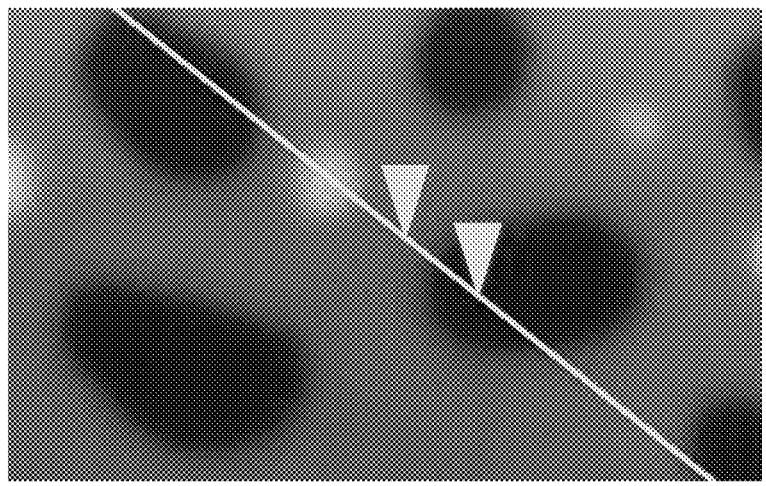
FIG. 1 is an atomic force microscopy (AFM) image of the self-assembled BCP-1 thin-film of composite layer CL-1 (Example 25). The AFM analysis indicates a step height of 18.6 nm (~1 Lo). This indicates that underlayer UL-1 (Example 20) formed with random copolymer G1-3 (Example 5) is a non-neutral underlayer composition for the self-assembled domains of block copolymer BCP-1 (Example 18).

Disclosed are random copolymers for preparing orientation control layers (underlayers) used in a lithographic process that includes self-assembly of block copolymers (BCPs). Herein, a random copolymer is a polymer comprising a random distribution of the repeat units making up the polymer backbone. The random copolymers comprise a repeat unit that comprises an ethylenic backbone portion and a side chain portion comprising a polycarbonate chain. The polycarbonate chain can comprise 1 or more carbonate repeat units, preferably 2 to about 40 carbonate repeat units. Also disclosed are methods of forming a lamellar domain pattern comprising a self-assembled block copolymer disposed on the underlayers. The BCP also comprises a polycarbonate block. The carbonate repeat units of the polymer of the orientation control layer can have chemical structures that are the same as or different than the carbonate repeat units of the polycarbonate block of the block copolymer. The domain patterns prepared from the BCP can have a bulk periodicity, Lo ("L nought"), in the range of about 4 nm to about 40 nm, which is useful for producing line features having a half-pitch of about 2 nm to about 20 nm, respectively, more particularly about 2 nm to about 10 nm. The random copolymers are preferably random graft copolymers prepared by ring opening polymerization (ROP) of a cyclic carbonate using a polymeric macroinitiator having one or more pendant hydroxy groups capable of initiating the ROP.

Herein, the term "interface" refers to a contact boundary between two substantially immiscible phases. Each phase can independently be a solid, a liquid, or a gas.

Self-assembly (SA) refers to a process of polymer phase separation that produces a pattern of immiscible solid phase domains under suitable conditions (e.g., by annealing a layer of the SA material at a defined temperature for a suitable period of time). An "SA material" is a material capable of self-assembling to form phase separated domains (e.g., a block copolymer comprising immiscible blocks). For example, self-assembly of a diblock copolymer can produce a first domain containing substantially a first block of the diblock copolymer and a second domain containing substantially a second block of the diblock copolymer. In this instance, the first and second domains are linked by the covalent bond joining the blocks of the block copolymer. An "SA layer" is a layer containing an SA material. The SA layer comprises one or more of the disclosed BCPs capable of self-assembly and, optionally, one or more additives (e.g., auxiliary polymer, surfactant, and the like). The SA layer has a bottom surface in contact with the underlayer and a top surface in contact with air and/or another layer.

Herein, an "underlayer" (i.e., orientation control layer) is a layer that influences self-assembly of an SA material of the SA layer. An underlayer has a bottom surface in contact with a substrate and a top surface in contact with the SA layer.

The underlayer surface is said to be "preferential" to a referenced domain of a self-assembled SA material if the referenced domain can wet the underlayer surface. Otherwise, the underlayer is said to be "non-preferential" to the referenced domain of the SA material.

Herein, "symmetrical wetting" means the underlayer surface and the air are wetted by the same domain(s) of the self-assembled SA material. "Non-symmetrical" wetting means the underlayer surface and the air are wetted by different domain(s) of the self-assembled SA material.

The underlayer is said to be "neutral" to an SA material, or "neutral wetting" with respect to an SA material if each domain of the self-assembled SA material can wet the underlayer surface. In this instance, each domain of the self-assembled SA material can have contact with the underlayer surface. Otherwise, the underlayer is said to be "non-neutral" to the referenced SA material. For example, an underlayer is "neutral wetting" with respect to a diblock copolymer if self-assembly of the block copolymer results in a domain pattern in which each domain of the self-assembled block copolymer has contact with the underlayer surface.

The top surface of the underlayer ("underlayer surface") can guide self-assembly of the SA material if the underlayer is preferentially wetted by one domain of the self-assembled SA material. If the underlayer surface is neutral to the SA material, the underlayer surface allows orientation control, but does not guide self-assembly.

Lamellar domains can be oriented parallel or perpendicular to the underlayer surface. Perpendicular orientation of lamellar domains is desirable for forming high resolution line patterns by selective etching of a given lamellar domain. Parallel orientation is not desirable for forming high resolution line patterns.

Without being bound by theory, Scheme 1 is a schematic representation of what parallel oriented lamellar domains of a self-assembled BCP may look like. The plane of each lamellar domain is parallel to the plane of the underlayer.

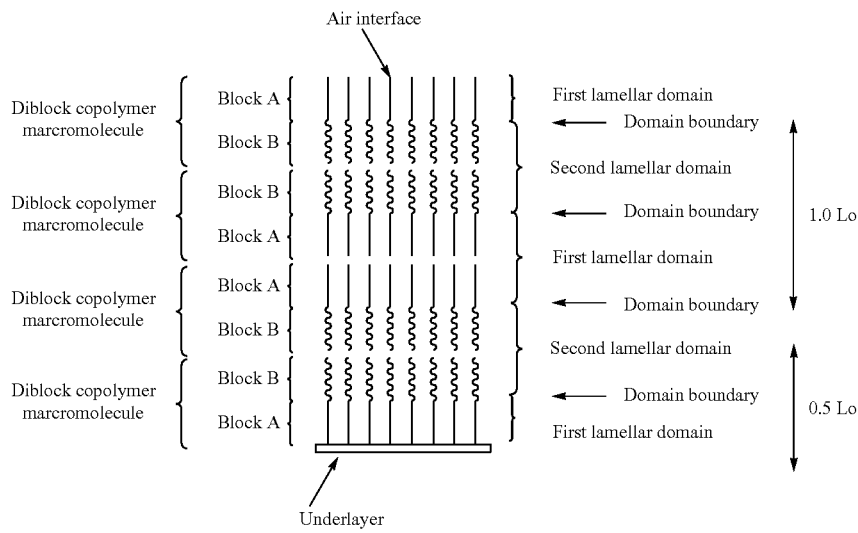

Scheme 1.

Scheme 1 shows the arrangement of blocks A and B of a diblock copolymer after self-assembly on an underlayer surface that is preferentially wetted by block A. In this example, the air interface is also preferentially wetted by block A. The first lamellar domain comprises block A, and the second lamellar domain comprises block B. The bulk periodicity of the domains is indicated by 1.0 Lo. The individual diblock copolymer macromolecules, domain boundaries, and 0.5 Lo are also indicated. In this example, the underlayer surface has contact only with block A of the self-assembled diblock copolymer. It should be understood that within a given lamellar domain (e.g., the second lamellar domain of Scheme 1) blocks from different polymer macromolecules (e.g., B blocks) can be arranged end-to-end (shown) and/or interwoven (not shown). Each block can have a backbone that is rigid, non-rigid, or of intermediate rigidity. Each block can have any suitable coiling, rotational and/or flexural capability.

For commercial purposes, the underlayer and the air interface (or another layer) must both be neutral to the SA material in order to obtain perpendicularly oriented lamellar domains when no other chemical or topographical features are available to influence self-assembly of the block copolymer. If only one interface is neutral to the SA material, the lamellar domains orient parallel to the underlayer surface resulting in island/hole morphology having 0.5 Lo step height. If only the underlayer is neutral, both BCP domains initially wet the underlayer surface with 0.5 Lo perpendicular lamellae, but eventually form parallel morphology as the air is non-neutral, resulting in island/holes with parallel lamellae having 0.5 Lo step height.

Without being bound by theory, Scheme 2 is a schematic representation of what perpendicular oriented lamellar domains of a self-assembled BCP may look like.

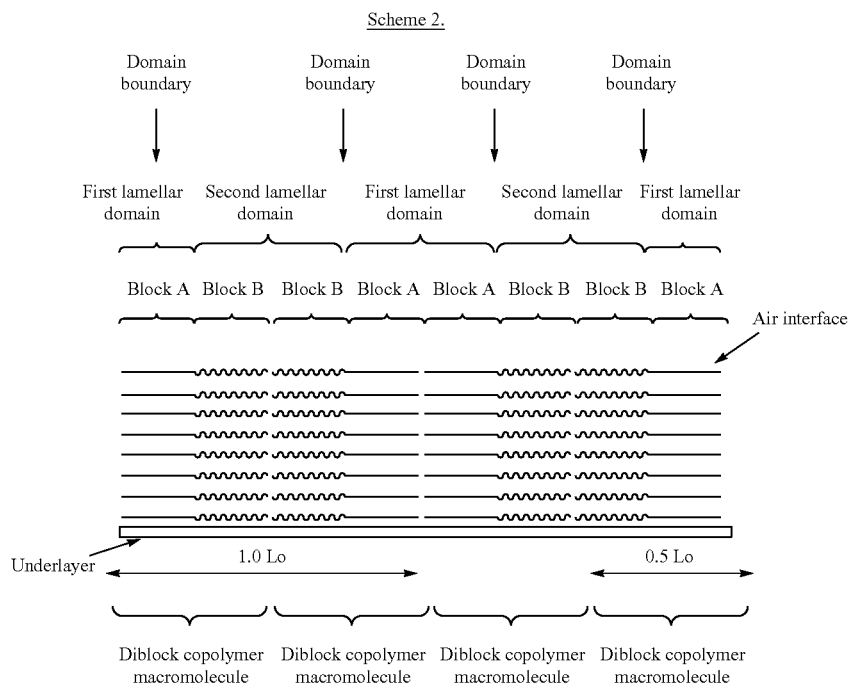

Scheme 2.

In Scheme 2, the lamellar domains are oriented perpendicular to the underlayer surface (i.e., to the plane of the underlayer). Both domains are in contact with the air interface and surface. The bulk periodicity, Lo, is indicated, as well as 0.5 Lo. In this example, the underlayer surface has contact with block A and block B of the self-assembled diblock copolymer.

For purposes of the present invention, the air interface is always a non-neutral interface due to the BCPs of interest, which are characterized by a relatively high Flory-Huggins interaction parameter chi ($\chi$). These BCPs are also referred to as "high-chi" BCPs. An SA layer consisting essentially of a high-chi BCP in contact with air will almost certainly undergo self-assembly to form islands and holes whose boundaries represent a disruption in parallel oriented lamellae. This occurs regardless of whether the underlayer is neutral or non-neutral to the BCP. The islands and hole boundaries have a height difference with the surrounding SA material that is referred to herein as the "step height".

The examples further below demonstrate the formation of islands and holes using a high-chi polystyrene-polycarbonate diblock copolymer. Parallel oriented lamellar domains are formed in each instance, including those examples in which the underlayer is neutral to the diblock copolymer. This occurs because the air interface is non-neutral to the diblock copolymer (only the polystyrene domain of the examples wets the air interface).

For purposes of demonstrating an improvement in underlayer performance, it is sufficient to show that the underlayer is neutral to a high-chi BCP. However, the neutrality of the underlayer is difficult to determine when the BCP self-assembles to form parallel oriented lamellae. To overcome this challenge, atomic force microscopy (AFM) was used to measure the step heights at the boundaries of the island and holes, which differs for neutral and non-neutral underlayers. The step height is also related to the bulk periodicity Lo of the lamellar domains.

Herein, if an SA layer comprising a self-assembled BCP exhibits islands and/or holes having a step height by AFM of about 1.0 Lo, the underlayer is non-neutral to the BCP (undesirable). If the step height by AFM is about 0.5 Lo, the underlayer is neutral to the BCP (desirable). If the SA layer exhibits no islands or holes (i.e., has a step height about 0.0 Lo), the SA layer is also non-neutral to the BCP (undesirable).

Thus, a desirable underlayer composition for the disclosed high-chi BCPs is one that directs self-assembly of the BCP to produce islands and/or holes having a step height of about 0.5 Lo by AFM.

Without being bound by theory, Scheme 3 is a schematic representation of what parallel oriented lamellar domains of a self-assembled BCP may look like when the air interface is non-neutral, and results in the formation of islands and holes.

Scheme 3.

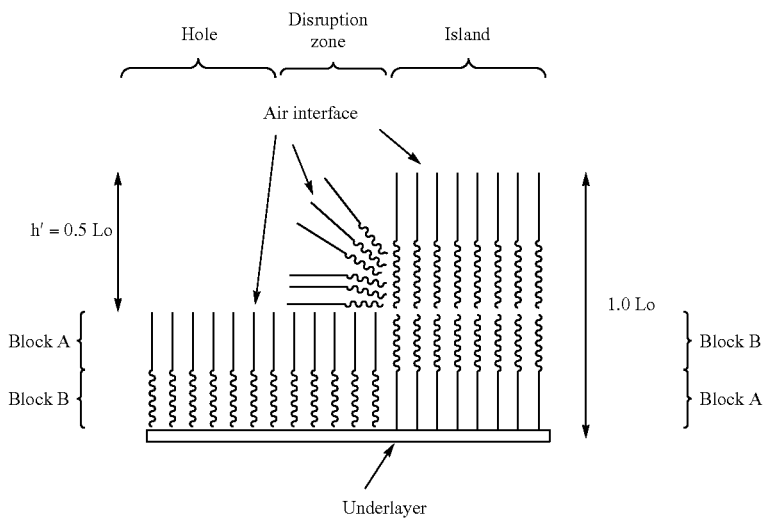

In Scheme 3, the underlayer surface is wetted by both blocks A and B, and the air interface is wetted only by block A. The neutral (non-preferential) wetting properties of the underlayer surface causes disruptions in the parallel oriented lamellar domains, resulting in formation of islands and holes having a step height h' by AFM of about 0.5 Lo. It should be understood that block A preferentially contacts the air interface in the disruption zone of the lamellar domain (the boundary of the hole and the island). No attempt has been made to characterize the arrangement of blocks B in the disruption zone of Scheme 3.

Random Copolymers for Orientation Control

Herein, random copolymers names can include an "-r-" or "-random-" separating the abbreviated monomer names used to prepare the polymer. The random copolymers have a polymer backbone that is a single branch, non-cyclic structure having two end groups (i.e, the backbone is not a macrocycle).

The random copolymer comprises a first repeat unit of formula (A-1):

wherein $R^x$ is a monovalent radical selected from the group consisting of H, methyl, ethyl, and trifluoromethyl (*—$CF_3$), and $R^b$ is a monovalent radical comprising an aromatic ring.

Herein, a starred bond represents an attachment point, not a methyl group.

Non-limiting $R^b$ groups of formula (A-1) include substituted and unsubstituted aryl groups. Exemplary $R^b$ groups are listed in Scheme 4 below, where the starred bond of the carbonyl group or the aromatic ring is linked to carbon labeled 1 of formula (A-1).

Scheme 4.

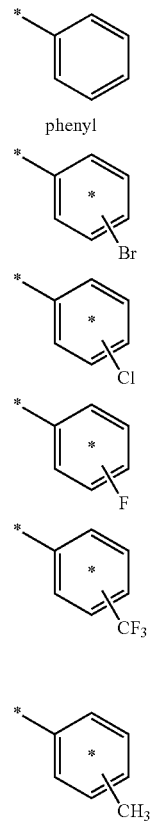

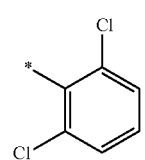

-continued

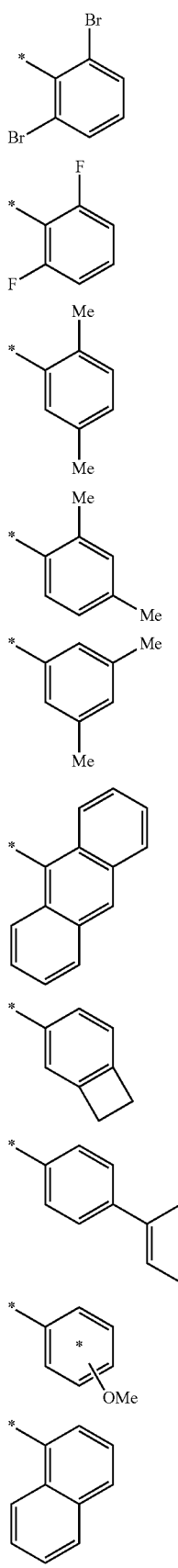

-continued

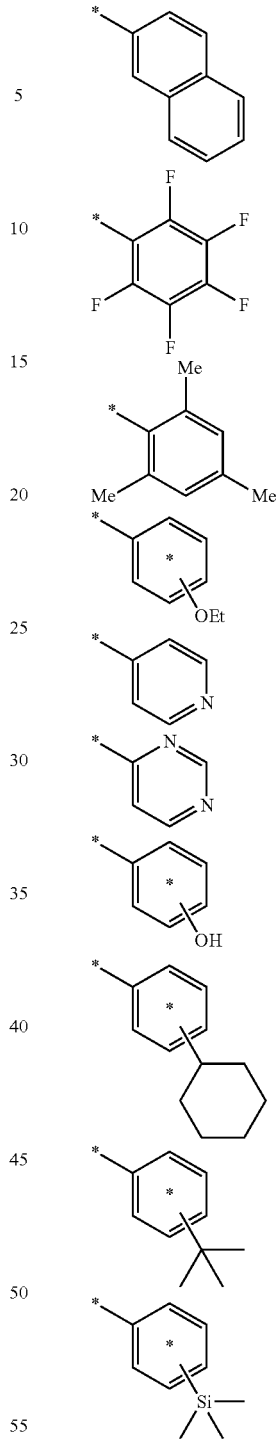

In an embodiment, $R^x$ of formula (A-1) is hydrogen, and $R^b$ is phenyl.

When a starred bond of a given group crosses a bond of a ring as shown above, the group can be present as any one of the available positional isomers of the ring or as a mixture of positional isomers of the ring. This convention is followed below also.

The random copolymers comprise a second repeat unit of formula (A-2):

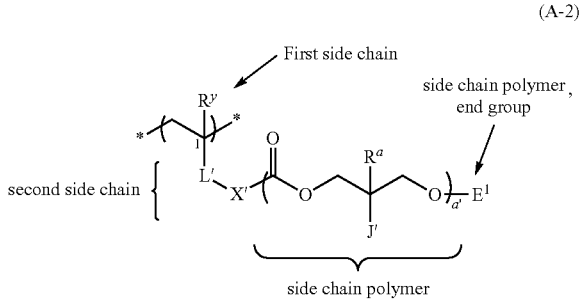

(A-2)

wherein a' is a positive number having an average value greater than 1, $E^1$ is a monovalent end group independently selected from the group consisting of hydrogen and groups comprising 1-10 carbons, each J' is an independent monovalent radical selected from the group consisting of hydrogen and groups comprising 1 to 10 carbons, L' is an independent divalent linking group comprising 1 to 10 carbons, each $R^a$ is an independent monovalent radical selected from the group consisting of hydrogen, methyl, and ethyl, $R^y$ is a monovalent radical selected from the group consisting of H, methyl, ethyl, and trifluoromethyl (*—$CF_3$), and X' is an independent divalent radical selected from the group consisting of *—O—*, *—S—*, *—N(H)—*, and *—N(R")—*, wherein R" is a monovalent radical comprising 1 to 6 carbons.

The two starred bonds of formula (A-2) represent attachment points of the random copolymer backbone.

The random copolymer can comprise the second repeat unit singularly or in combination with other second repeat units of formula (A-2).

$R^y$ of formula (A-2) represents a first side chain of the second repeat unit. The moiety

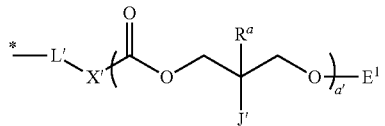

represents a second side chain of the second repeat unit. The moiety

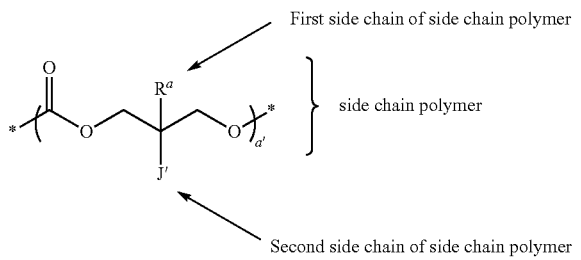

represents a divalent side chain polymer group of the second repeat unit of formula (A-2). This side chain polymer can be a homopolymer, random copolymer, and/or block copolymer comprising at least one repeat unit comprising a backbone carbonate group, as shown above. The side chain polymer can comprise one or more other repeat units comprising a backbone carbonate (polycarbonate copolymer) and/or or a backbone ester group (polyestercarbonate copolymer). The average degree of polymerization, a', of the side chain polymer can be 1 to about 40, more preferably about 1 to about 20. $R^a$ is a first side chain of the side chain polymer, and J' is a second side chain of the side chain polymer (shown above).

Non-limiting L' groups of formula (A-2) include ester, amide, aryl, arylester and arylamide groups. Exemplary L' groups include those listed in Scheme 5 below, where the starred bond of the carbonyl group or the aromatic ring is linked to carbon labeled 1 of formula (A-2).

Scheme 5.

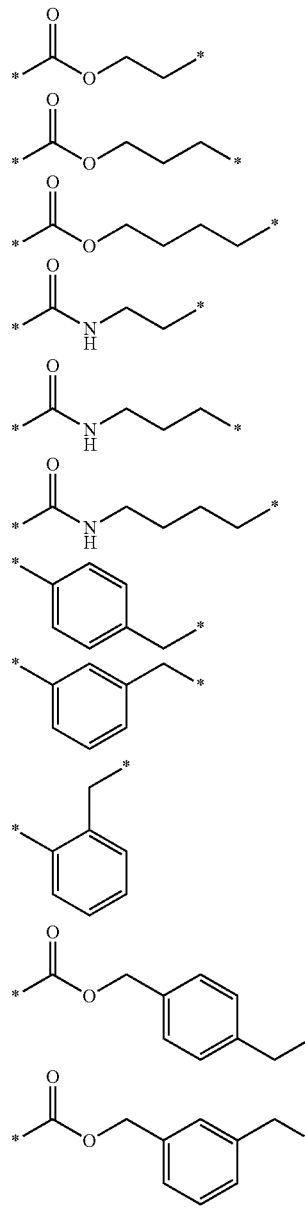

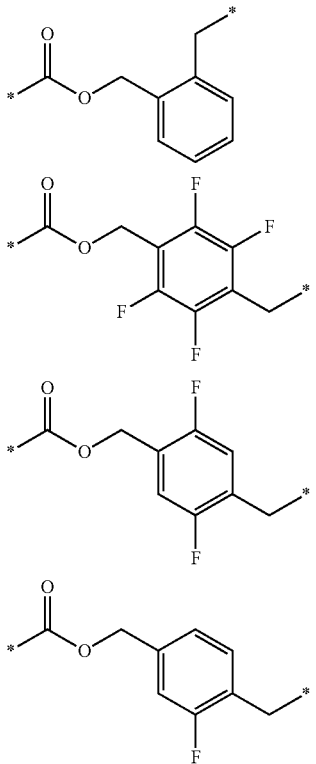

In an embodiment L'-X' is selected from the group consisting of

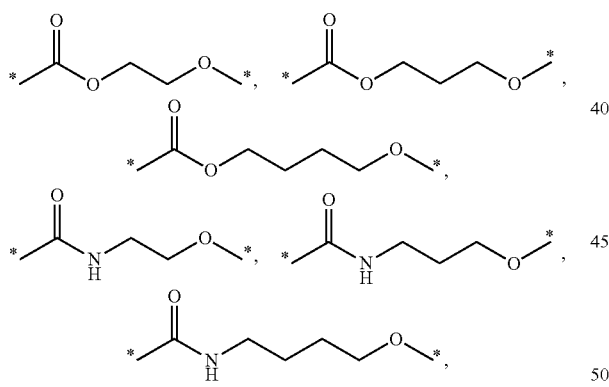

and combinations thereof.

Non-limiting monovalent J' groups of formula (A-2) include amide, aryl, arylester and arylamide groups. Exemplary J' groups are listed in Scheme 6.

Scheme 6.

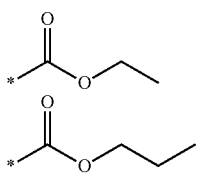

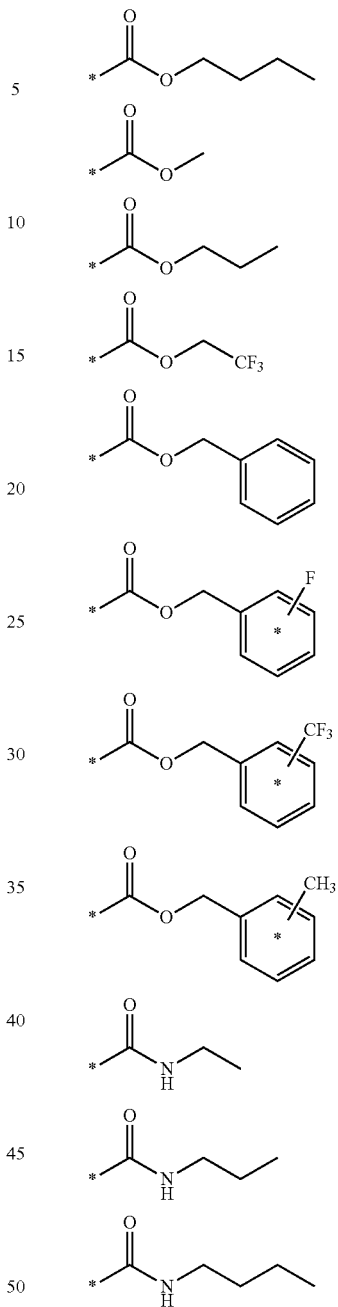

In an embodiment, $R^y$ is methyl, $R^a$ is hydrogen, J' is hydrogen, X' is oxygen (*—O—*), and a' has an average value of about 1 to about 40. In another embodiment, L' is

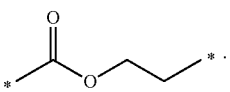

More specific examples of first repeat units of formula (A-2) include those of Scheme 7, wherein a' has an average value of about 1 to about 40, and $R^f$ is a group comprising 1 to 10 carbons.

Scheme 7.

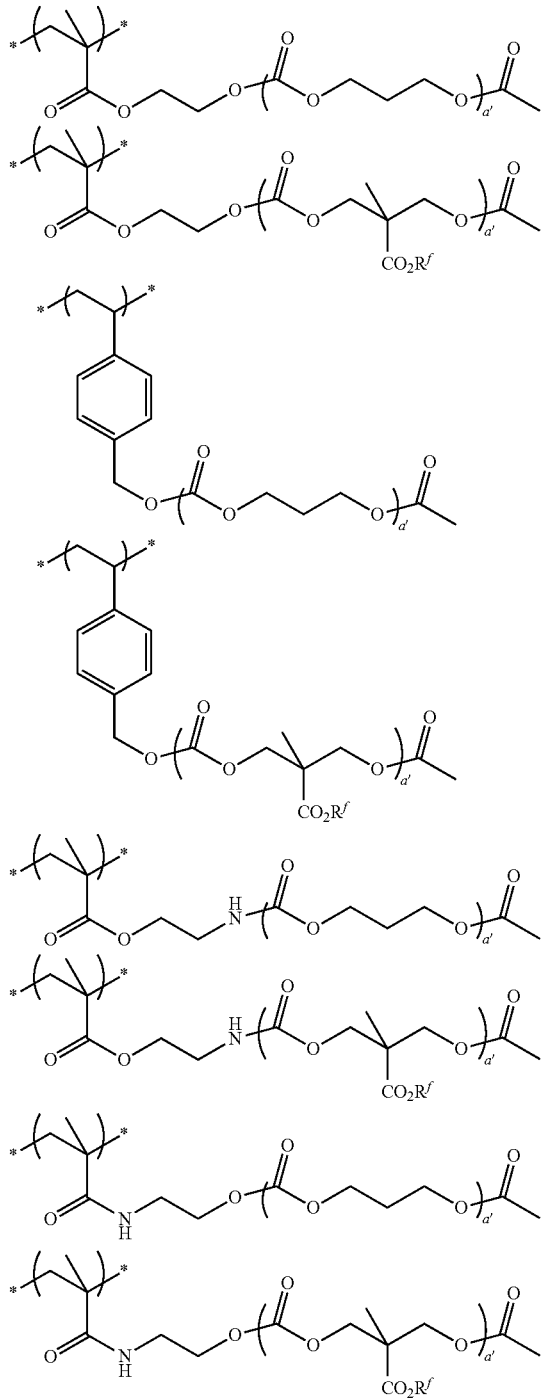

In an embodiment, the first repeat unit is selected from the group consisting of

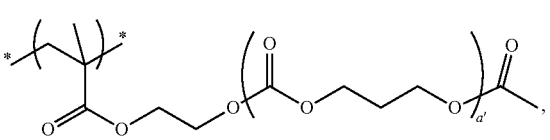

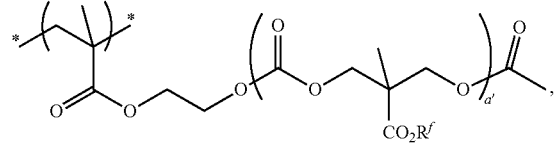

and combinations thereof, wherein a' has an average value of about 1 to about 40. In another embodiment, $R^f$ is a member of the group consisting of methyl, ethyl, propyl, phenyl, and benzyl.

In an embodiment, the random copolymer comprises the first repeat unit and the second repeat unit in a first repeat unit:second repeat unit mole ratio between 24:76 and 73:27.

The random copolymer also comprises a third repeat unit of formula (A-3):

(A-3)

wherein $R^z$ is a monovalent radical selected from the group consisting of H, methyl, ethyl, and trifluoromethyl (*—$CF_3$), L" is an independent divalent linking group comprising 1 to 10 carbons, and K' is a monovalent electrophilic group capable of reacting with a nucleophile to form a covalent bond.

Non-limiting L" groups of formula (A-3) include ester, amide, aryl, arylester and arylamide groups. Exemplary L" groups include those listed in Scheme 8 below, where the starred bond of the carbonyl group or the aromatic ring (i.e., the left-most starred bond in each structure) is linked to carbon labeled 1 of formula (A-3).

Scheme 8.

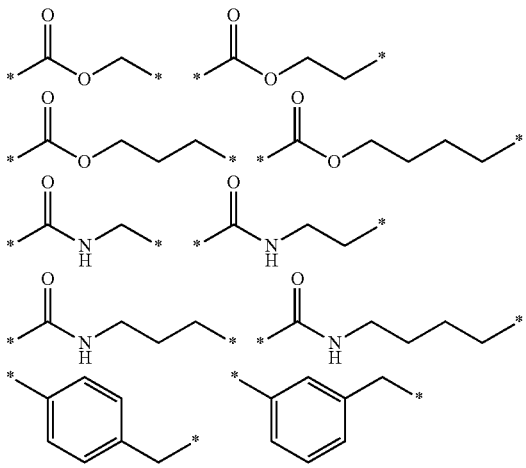

-continued

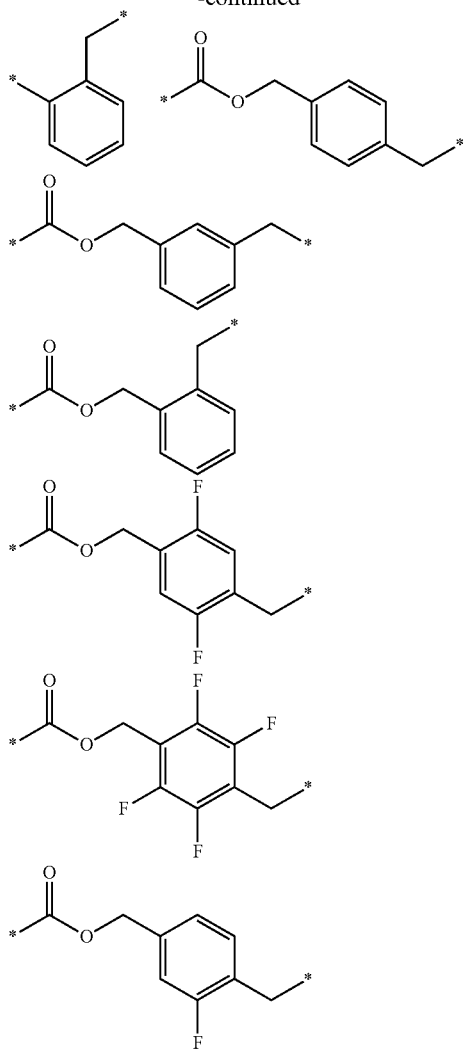

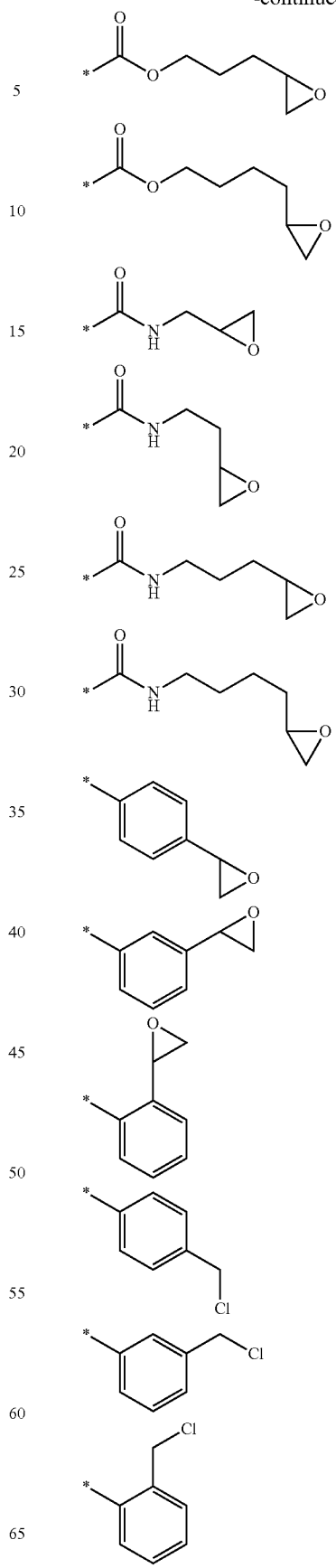

K' can comprise an electrophilic group selected from the group consisting of active carboxylic ester groups (e.g., p-nitrophenyl ester, pentafluorophenyl ester), halide groups (e.g., chloride, bromide, and iodide), sulfonate esters (e.g., p-toluenesulfonates, mesylates), groups containing an epoxide group, and the like. In an embodiment, K' comprises an epoxide group.

More specific L"-K' groups include those of Scheme 9, wherein the starred bond from the carbonyl group or the aromatic ring is linked to carbon labeled 1 of formula (A-3).

Scheme 9.

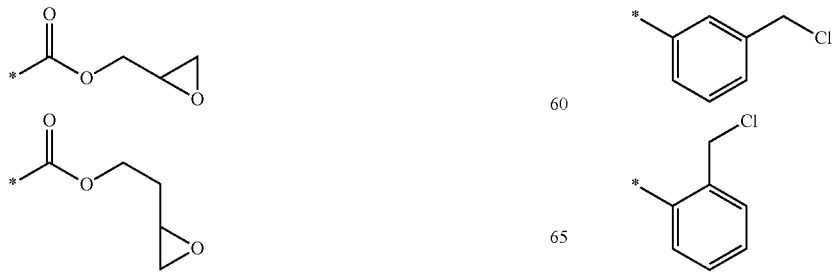

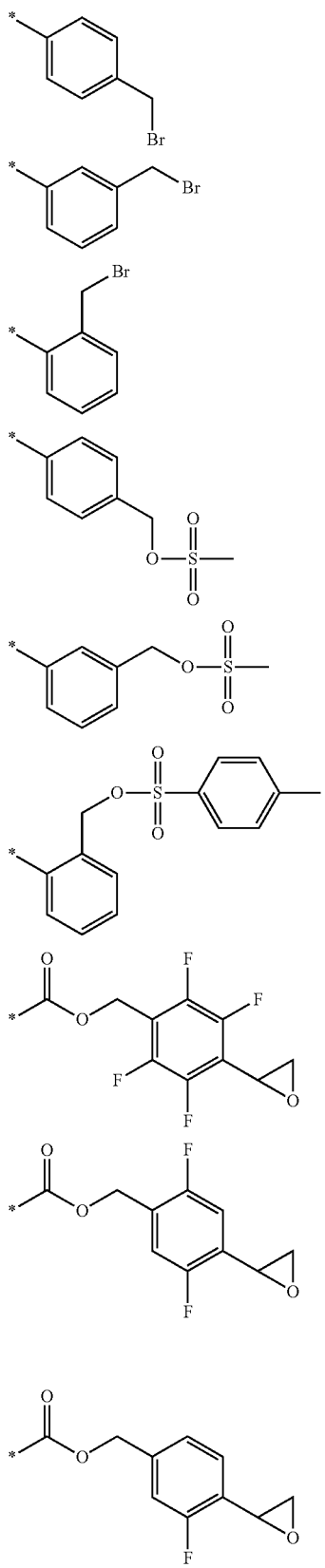

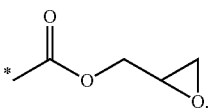

More specific random copolymers have a structure in accordance with formula (A-4):

(A-4)

$$E'{-}{\left(\!\!\begin{array}{c}R^x\\|\\{-}{-}\\|\\R^b\end{array}\!\!\right)}_{\!x'}\!{\left(\!\!\begin{array}{c}R^y\\|\\{-}{-}\\|\\\end{array}\!\!\right)}_{\!y'}\!{\left(\!\!\begin{array}{c}R^z\\|\\{-}{-}\\|\\L''\\|\\K'\end{array}\!\!\right)}_{\!z'}\!\!{-}E''$$

$$L'{-}X'{-}\underset{\underset{O}{\|}}{C}{-}O{-}CH_2{-}\underset{\underset{J'}{|}}{\overset{\overset{R^a}{|}}{C}}{-}CH_2{-}O{\left.\!\!\right)}_{\!a'}\!{-}E^1,$$

wherein each of x', y', and z' represents an average number of repeat units enclosed in the respective parentheses and independently has an average value greater than 1, a' represents an average number of repeat units enclosed in the parentheses and has an average value of 1 to 40, E' and E'' are monovalent end groups independently selected from the group consisting of hydrogen, halides, and groups comprising 1-10 carbons, $E^1$ is a monovalent end group independently selected from the group consisting of hydrogen and groups comprising 1-10 carbons, each J' is an independent monovalent radical selected from the group consisting of hydrogen and groups comprising 1 to 10 carbons, each K' is a monovalent radical capable of reacting with a substrate surface to form a covalent bond, each L' is an independent divalent linking group comprising 1 to 10 carbons, each L'' is an independent divalent linking group comprising 1 to 10 carbons, each $R^a$ is an independent monovalent radical selected from the group consisting of hydrogen, methyl, and ethyl, each $R^b$ is an independent monovalent radical comprising 1 or more aromatic rings, each of $R^x$, $R^y$, and $R^z$ is a monovalent radical independently selected from the group consisting of hydrogen, methyl, ethyl, and trifluoromethyl (*—$CF_3$), and each X' is an independent divalent radical selected from the group consisting of *—O—*, *—S—*, *—N(H)—*, and *—N(R'')—*, wherein R'' is a monovalent radical comprising 1 to 6 carbons.

In an embodiment, each $R^x$ is hydrogen, each $R^y$ is methyl, each $R^z$ is methyl, each $R^a$ is hydrogen, each $R^b$ is phenyl, and each J' is hydrogen.

In an embodiment, $R^z$ is methyl of formula (A-3) and L''-K' is of formula (A-3) is Formula A-4 can be written as formula (A-5):

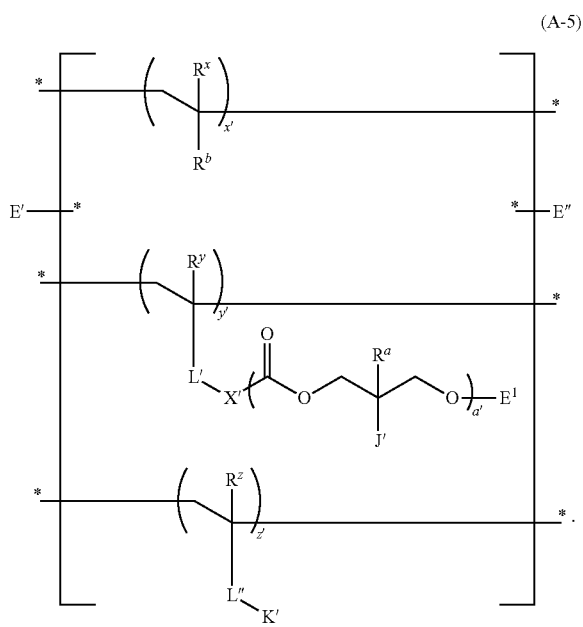

(A-5)

The vertical stacking of the repeat units indicates a random distribution of the repeat units in the polymer chain. In a random distribution of the repeat units, a given repeat unit whose starred bond overlaps the left square bracket can be linked to an atomic center of a different repeat unit whose starred bond overlaps the right square bracket, or an end group E'. Likewise, a given repeat unit whose starred bond overlaps the right squared bracket can be linked to an atomic center of a different repeat unit whose starred bond overlaps the left square bracket, or to end group E". End group E' can be linked to any one of the repeat units having a starred bond overlapping the left square bracket. End group E" can be linked to any one of the repeat units having a starred bond overlapping the right square bracket.

More specific random copolymers for orientation control layers have a structure according to formula (A-6):

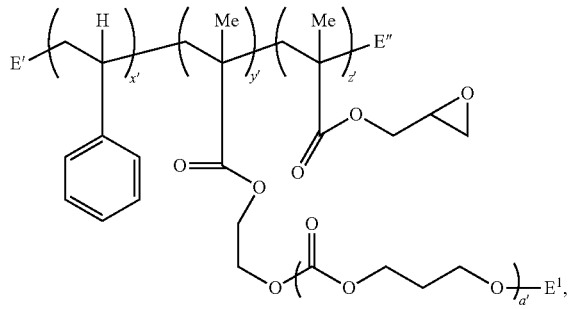

(A-6)

wherein
x', y', and z' represent numbers of respective repeat units, and independently have an average value greater than 1,
a' represents numbers of respective repeat units and has an average value of 1 or more,
E' and E" are monovalent end groups independently selected from the group consisting of hydrogen, halides, and groups comprising 1-10 carbons, and $E^1$ is a monovalent end group independently selected from the group consisting of hydrogen and groups comprising 1-10 carbons.

In another embodiment, $E^1$ is acetyl. Preferably, x' is 20 to 80, y' is 1 to 20, z' is 1 to 5, and a' is 1 to 40. In an embodiment, a' is about 1 to about 10.

The structure of formula (A-6) can also be represented by the formula (A-7):

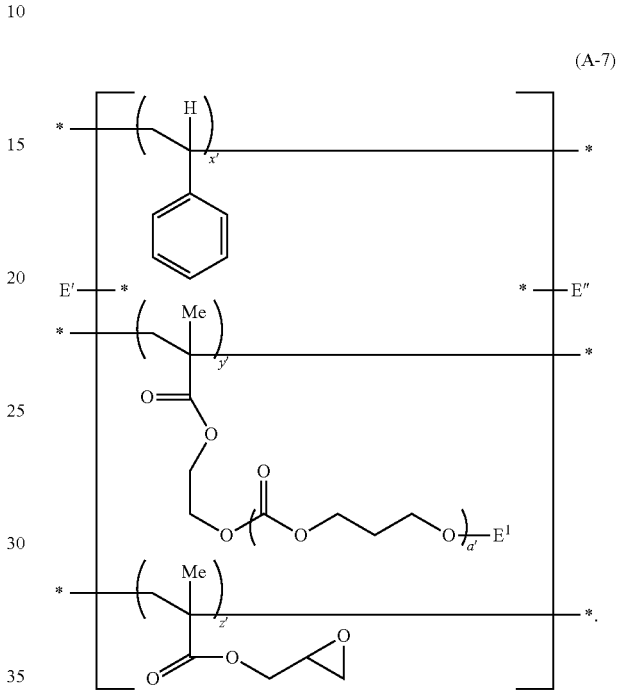

(A-7)

Preparation of Random Copolymers for Orientation Control Layers

A random copolymer for orientation control can be prepared by copolymerization of a pre-formed first vinyl polymerizable monomer comprising a pendant polycarbonate or polyestercarbonate chain, a second vinyl polymerizable monomer comprising an aromatic ring, and a third vinyl polymerizable monomer comprising an electrophilic group capable of reacting with a nucleophile to produce a covalent bond. This method is illustrated in Scheme 10 below using the monomers styrene (Sty), HEMA-PTMC, and glycidyl methacrylate (GMA). Catalysts for the vinyl polymerization include radical initiators (e.g., azobisisobutyronitrile (AIBN)).

Scheme 10.

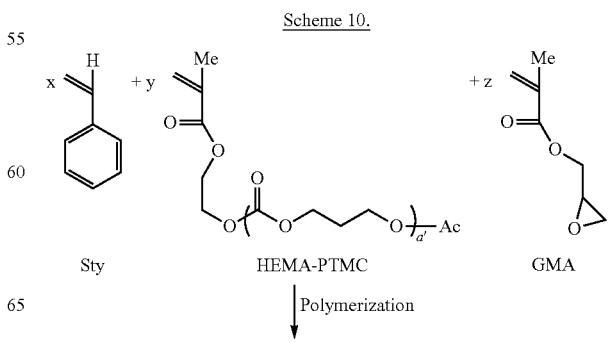

Sty     HEMA-PTMC     GMA

↓ Polymerization

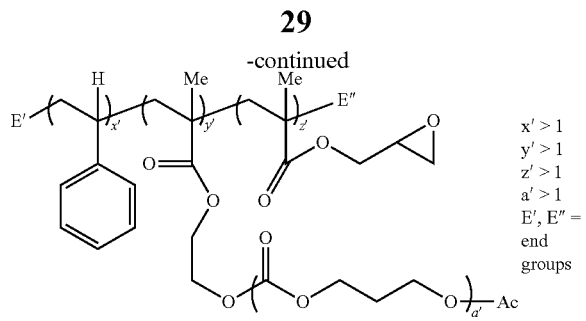

x' > 1
y' > 1
z' > 1
a' > 1
E', E'' = end groups

HEMA-PTMC can be prepared by an organocatalyzed ring opening polymerization (ROP) of trimethylene carbonate (TMC) using hydroxyethyl methacrylate (HEMA) as the polymerization initiator, and endcapping the resulting polycarbonate with acetyl chloride, as shown in Scheme 11 below. Catalysts for the ROP include organic bases (e.g., 1,8-diazabicyclo[5,4,0]undec-7-ene (DBU)) and phosphate esters (e.g., diphenyl phosphate (DPP)).

Scheme 11.

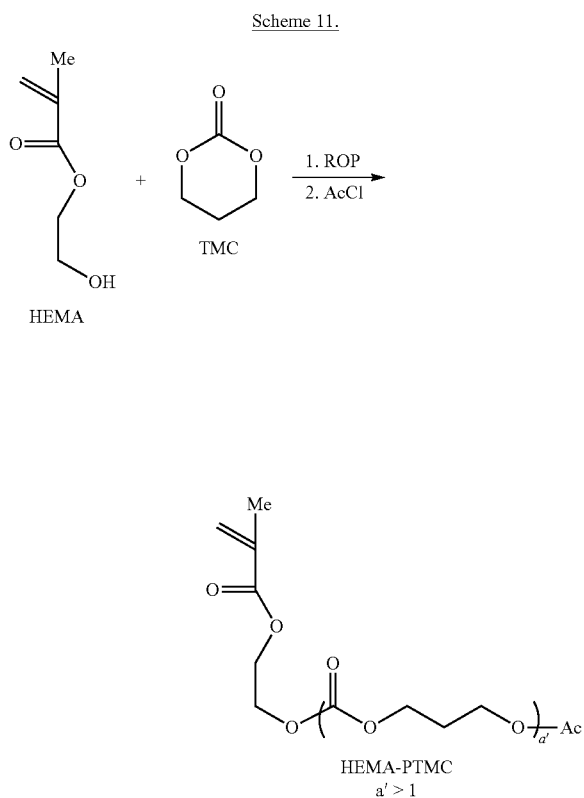

HEMA-PTMC
a' > 1

A second method of preparing the random copolymer for orientation control comprises growing a polycarbonate or polyestercarbonate chain by ring opening polymerization onto a side chain nucleophilic site of a pre-formed random copolymer, as illustrated in Scheme 12.

Scheme 12.

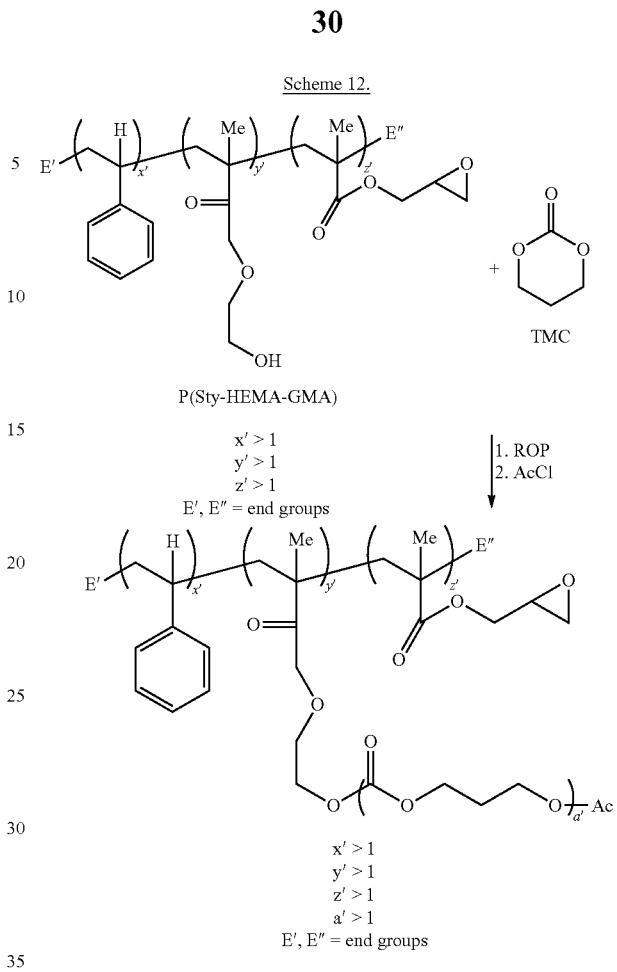

In this example, the random copolymer of styrene (Sty), hydroxyethyl methacrylate (HEMA), and glycidyl methacrylate GMA), referred to as P(Sty-HEMA-GMA), is a macroinitiator for the ring opening polymerization of TMC. Each nucleophilic hydroxy group of the macroinitiator P(Sty-HEMA-GMA) serves as a potential initiating site for ROP of TMC. The resulting polymer is a random graft copolymer comprising a plurality of side chains bearing a polycarbonate chain.

Block Copolymers for Self-Assembly

Block copolymer names can include a "-b-" or "-block-" separating the abbreviated monomer names used to prepare the polymer. The block copolymers for self-assembly can comprise two or three blocks.

The following discussion is directed to diblock polymers (A-B) but can be applied to triblock polymers.

A first block (block A) comprises a backbone comprising repeating functionalized ethylene units. A second block (block B) comprises at least one carbonate repeat unit. The blocks are selected so as to be substantially immiscible with one another. Additionally, the first block and the second block of the block polymer have the following solubility properties with respect to a solvent mixture used to precipitate the block polymer: i) the first block and the second block are substantially insoluble in a first solvent of the solvent mixture, ii) the first block is substantially insoluble in a second solvent of the solvent mixture, and iii) the second block is soluble in a second solvent of the solvent mixture. That is, the first solvent is a non-solvent for the first block and the second block, the second solvent is a non-solvent for the first block, and the second solvent is a solvent for the second block.

The specific structural units formed by self-assembly of the final block polymer are determined by the volume ratio of the first block to the second block. The volume of a given block means the volume occupied by the block, which depends on molecular mass of the block. For example, when the volume ratio of the first block to the second block component B is greater than about 80:20, the final block polymer can form an ordered array of spheres composed of the second block in a matrix composed of the first block. When the volume ratio of the first block to the second block is in a range of about 80:20 to about 60:40, the final block polymer can form an ordered array of cylinders composed of the second block in a matrix composed of the first block. When the volume ratio of the first block to the second block is less than about 60:40 to about 40:60, the final block polymer can form alternating lamellae (i.e., an array of domains composed of the first block alternating with domains composed of the second block). The volume ratio between the first block and the second block can be adjusted by controlling the average molecular weight of each block.

More specifically, the volume ratio of the first block to second block can be about 15:85 to about 85:15, based on the average total volume of the final block polymer macromolecule. Preferably, for alternating lamellae formation, the volume ratio of the first block to second block can be about 40:60 to about 60:40, more preferably 45:55 to 55:45, and most preferably 48:52 to 52:48. For cylinder formation, the volume ratio of the first block to second block can be about 74:26 to about 63:37, and more preferably about 72:28 to about 65:35.

One of the blocks of the final block polymer can be selectively removed (e.g., by lithographic etching techniques) relative to the other block to form structural features composed of the remaining block. The structural features can have any suitable form such as, for example, a line pattern, a hole pattern, and/or other patterns.

The ROP polymeric initiator is preferably the product of a vinyl polymerization. Vinyl polymerizable monomers include styrenes, acrylates, methacrylates, substituted derivatives thereof, and the like. The vinyl polymerizable monomers can be used singularly or in combination to form the ROP polymeric initiator using any suitable polymerization technique, including but not limited to free radical polymerization, anionic polymerization, cationic polymerization, atom transfer radical polymerization (ATRP), nitroxide mediated polymerization (NMP), and/or reversible addition-fragmentation chain transfer (RAFT) polymerization.

More specifically, the first block of the diblock copolymer comprises a repeat unit of formula (B-1):

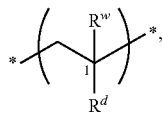

(B-1)

wherein $R^w$ is a monovalent radical selected from the group consisting of H, methyl, ethyl, and trifluoromethyl (*—CF$_3$), and $R^d$ is a monovalent radical comprising an aromatic ring.

Non-limiting $R^d$ groups of formula (B-1) include substituted and unsubstituted aryl groups. Exemplary $R^d$ groups are listed in Scheme 13 below, where the starred bond of the carbonyl group or the aromatic ring is linked to carbon labeled 1 of formula (B-1).

Scheme 13.

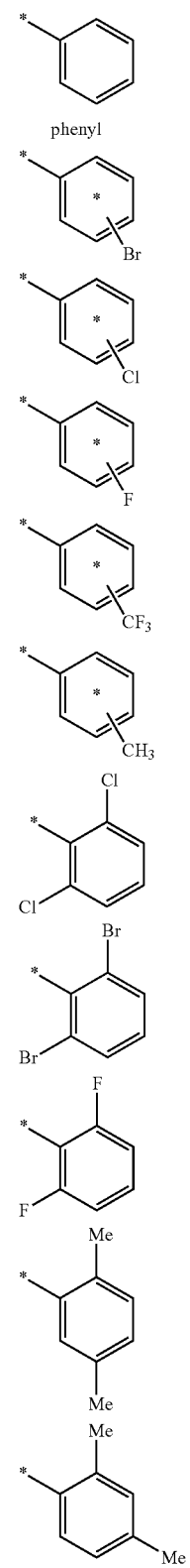

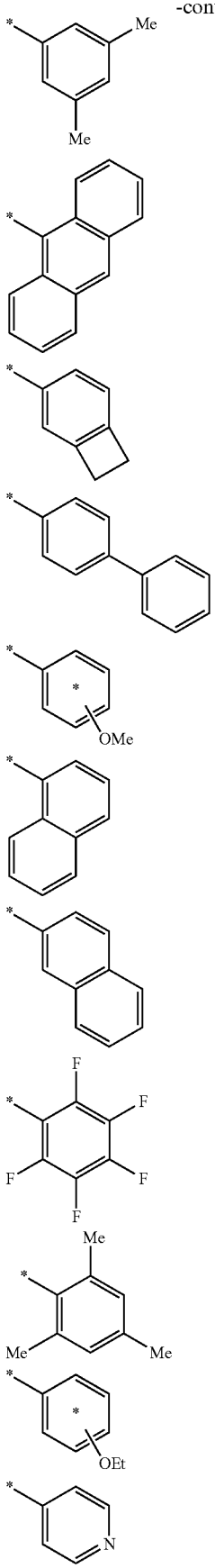

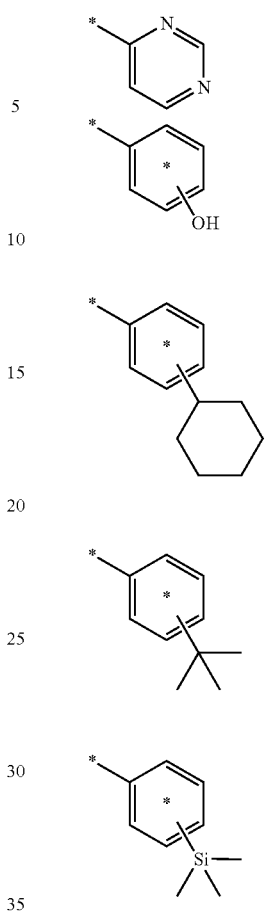

In an embodiment, $R^w$ of formula (B-1) is hydrogen, and $R^d$ is phenyl. Repeat units of formula (B-1) can be present singularly or in combination.

The first block can be a homopolymer of a repeat unit of formula (B-1) or a random copolymer chain comprising a combination of repeat units of formula (B-1) and/or a second repeat unit.

The second block of the diblock copolymer comprises at least one carbonate repeat unit of formula (B-2):

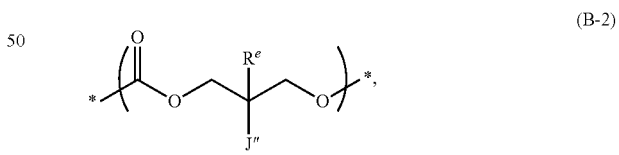

wherein $R^e$ is an independent monovalent radical selected from the group consisting of hydrogen, methyl, and ethyl, and $J''$ is an independent monovalent radical selected from the group consisting of hydrogen and groups comprising 1 to 10 carbons.

More specific block copolymers for self-assembly and directed self-assembly have a structure according to formula (B-3), wherein the square brackets represent separate blocks A and B of the block copolymer:

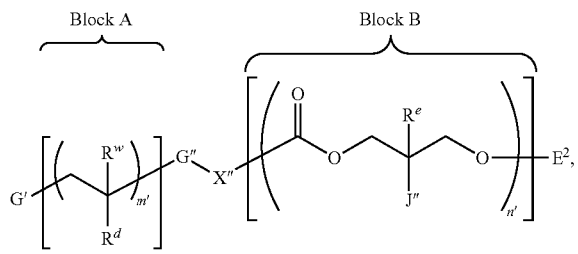

(B-3)

Block A, Block B wherein subscripts m' and n' represent numbers of respective repeat units enclosed in parentheses, m' and n' independently have an average value greater than 1, $E^2$ is a monovalent end group selected from the group consisting of hydrogen and groups comprising 1-10 carbons, G' is a monovalent end group selected from the group consisting of hydrogen, halides, and groups comprising 1-10 carbons, G" is a divalent linking group comprising 1-10 carbons, each J" is an independent monovalent radical selected from the group consisting of hydrogen and groups comprising 1 to 10 carbons, each $R^d$ is an independent monovalent radical comprising an aromatic ring, each $R^w$ is an independent monovalent radical selected from the group consisting of H, methyl, ethyl, and trifluoromethyl (*—$CF_3$), each $R^e$ is an independent monovalent radical selected from the group consisting of hydrogen, methyl, and ethyl, and each X" is an independent divalent radical selected from the group consisting of *—O—*, *—S—*, *—N(H)—*, and *—N(R")—*, wherein R" is a monovalent radical comprising 1 to 6 carbons.

In an embodiment, each J" is hydrogen, each $R^e$ is hydrogen, each $R^w$ is hydrogen, each $R^d$ is phenyl, $E^2$ is acetyl, and X" is *—O—*.

A more specific example of a block copolymer for self-assembly has a structure according to formula (B-4):

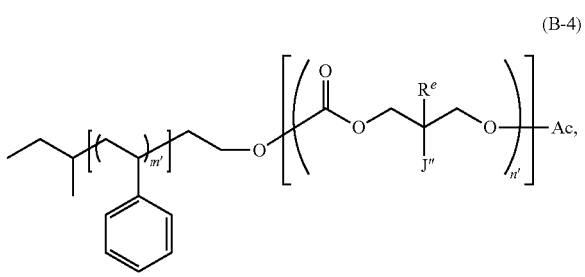

(B-4)

wherein subscripts m' and n' represent numbers of respective repeat units enclosed in parentheses, m' and n' independently have an average value greater than 1, each $R^e$ is an independent monovalent radical selected from the group consisting of hydrogen, methyl, and ethyl, and each J" is an independent monovalent radical selected from the group consisting of hydrogen and groups comprising 1 to 10 carbons.

In an embodiment, each $R^e$ is hydrogen and each J" is hydrogen. In another embodiment, each $R^e$ is methyl and each J" is *—$CO_2$Et.

Preparation of the Block Copolymers for Self-Assembly

The block copolymers for self-assembly are preferably prepared by ring opening polymerization of a cyclic carbonate monomer using a polymeric initiator having a backbone derived from a vinyl polymerizable monomer. The polymeric initiator also comprises 1 or 2 nucleophilic groups (e.g., *—OH, *—$NH_2$) capable of initiating the ROP of the cyclic carbonyl monomer. The ROP reaction mixture comprises a cyclic carbonyl monomer, a ROP catalyst, a solvent, and the polymeric initiator. The ROP catalyst is preferably an acid catalyst (e.g., diphenyl phosphate).

The following methods of forming a diblock copolymer can be applied to the preparations of triblock polymers. The methods provide a block copolymer that is substantially free of any polycarbonate homopolymer and/or polycarbonate random copolymer.

Method 1

This method utilizes a solvent mixture to fractionate an initial block polymer formed when the ROP is conducted for a duration time corresponding to about 50% to 100%, more particularly about 85% to 100% consumption of a cyclic carbonate monomer. For a given set of reaction conditions (e.g., temperature, solvent, type of atmosphere, relative molar amounts, and other reaction parameters), the consumption of the cyclic carbonate monomer can be monitored using any suitable analytical technique (e.g., proton nuclear magnetic resonance ($^1$H NMR)).

The ROP produces an initial block polymer containing a living end group, which is a nucleophilic group capable of undergoing further chain growth and/or initiating a ROP of a different cyclic carbonyl monomer. Preferably, the active living end group is deactivated by addition of an endcapping agent to the reaction mixture, thereby terminating the polymerization and forming an endcapped initial block polymer containing a protected nucleophilic end group. The endcapped initial block polymer is not capable of initiating a ROP. As an example, a polycarbonate formed by ROP of a cyclic carbonate monomer has a living end containing a nucleophilic hydroxy group, which can be deactivated by addition of a suitable acylating agent (e.g., acetic anhydride) to form a protected hydroxy group (e.g., as an acetyl ester).

The isolated initial block polymer or the endcapped initial block polymer ("crude block polymer") can contain polymeric impurities derived from the cyclic carbonyl monomer that are not covalently linked to the polymeric initiator. Polymeric impurities can include polycarbonate homopolymer initiated by traces of water, and/or cyclic polycarbonate formed by backbiting of the living hydroxy end group on the polycarbonate backbone of the initial block polymer. These impurities can adversely affect the self-assembly properties of the initial block polymer.

The polymeric impurities can be removed by the following fractionation process. A first solution is prepared containing the initial block polymer dissolved in a minimal amount of a solvent (e.g., THF) capable of dissolving each block of the block polymer. The first solution contains the initial block polymer at a concentration of about 20 wt % based on total weight of the first solution. The first solution is then added to an excess amount (about 200 to 400 times the amount of crude polymer by weight) of a solvent mixture comprising a first solvent and a second solvent in a volume ratio of about 40:60 to about 60:40, respectively, wherein the first solvent is a non-solvent for the first block and the second block, and the second solvent is a non-solvent for the first block and a solvent for the second block. In an embodiment, the first solvent is MeOH and the second solvent is acetonitrile. The solvent mixture selectively dissolves the polymeric impurities, allowing the final block polymer to precipitate as a solid that can be substantially free of the polymeric impurities. The fractionation procedure can be repeated one or more times as necessary to form the block polymer used for self-assembly applications.

Method 2

In a second method, a trial ROP is performed using the given set of reaction conditions that includes the polymeric initiator. The amount of consumed cyclic carbonyl monomer is monitored (e.g., % consumption) as a function of ROP duration time t as in Method 1, allowing the ROP to proceed to 85% to 100% consumption of the cyclic carbonyl monomer. A graph is plotted of the percent consumption of the cyclic carbonate as a function of ROP duration time t in minutes.

From the scatter plot of the collected data points, a second order polynomial function F(t) (i.e., a trendline) can be fitted to the plotted points, wherein F(t) expresses the amount of consumed cyclic carbonyl monomer as a function of ROP duration time t. The $R^2$ (R-squared) coefficient for F(t) preferably has a value of about 0.85 to 1.0, more preferably 0.9 to 1.0.

Using the expression of F(t), a time $t_1$ corresponding to 50% consumption of the cyclic carbonyl monomer can be calculated.

The first derivative of F(t), denoted F'(t), is then calculated for each measurement time t.

The value of F'(t) at 50% cyclic monomer conversion is then determined. Using the value of $F'(t_1)$ at 50% cyclic monomer conversion, ROP duration times $t_2$ and $t_3$ are determined corresponding to a slope change of −10% and −20% relative to the slope at 50% consumption of cyclic carbonyl monomer.

The ROP is then conducted using the given reaction conditions, stopping the ROP at duration time (t'), wherein $t_1 \le t' \le t_3$, and more preferably $t_2 \le t' \le t_3$. Using these modified reaction conditions, a block polymer for self-assembly can be obtained directly that is free of, or substantially free of, polymer impurities that do not comprise a block derived from the polymeric initiator. Optionally, the block polymer can be further treated with the solvent mixture as described above under Method 1 to remove any remaining polymeric impurities.

Method 3

In Method 3, the mathematical expression for F'(t) is obtained as described above under Method 2. The value of F'(t) is then calculated for each ROP duration time t. Using the values of F'(t), the change in F'(t) between adjacent ROP duration times is calculated for each ROP duration time greater than 0. For example, the change in F'(t) at duration time $t_n$, denoted as $\Delta F'(t_n)$, is equal to $F'(t_n)-F'(t_{n-1})$, where n is a positive integer and $t_n>0$.

A second order polynomial trendline D(t) is obtained for a scatter plot of $\Delta F'(t)$ as a function of t having the shape of an inverted parabola. D(t) has a first derivative D'(t) equal to zero at some ROP duration time t">0 that is less than the duration time corresponding to 100% consumption of the cyclic carbonyl monomer.

The ROP is repeated using the given reaction conditions, terminating the ROP at 0.8t" to about t". The resulting final block polymer can be free of, or substantially free of, polymer impurities that do not comprise a block derived from the polymeric initiator. Optionally, the block polymer can be further treated with the solvent mixture as described above under Method 1 to remove any polymeric impurities present.

Cyclic Carbonyl Monomers

Exemplary cyclic carbonyl monomers include cyclic carbonate compounds of Scheme 14, which can be used, for example, to form a polycarbonate block of the initial block polymer.

Scheme 14.

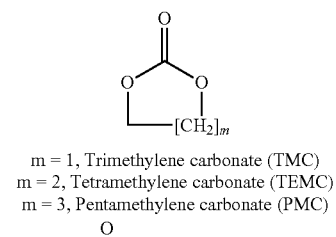

m = 1, Trimethylene carbonate (TMC)
m = 2, Tetramethylene carbonate (TEMC)
m = 3, Pentamethylene carbonate (PMC)

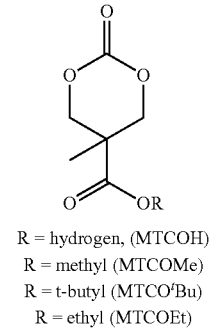

R = hydrogen, (MTCOH)
R = methyl (MTCOMe)
R = t-butyl (MTCO$^t$Bu)
R = ethyl (MTCOEt)

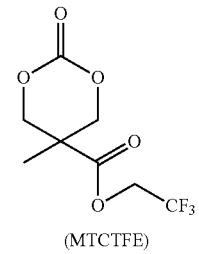

(MTCTFE)

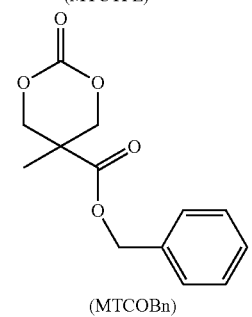

(MTCOBn)

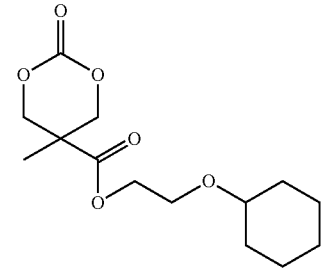

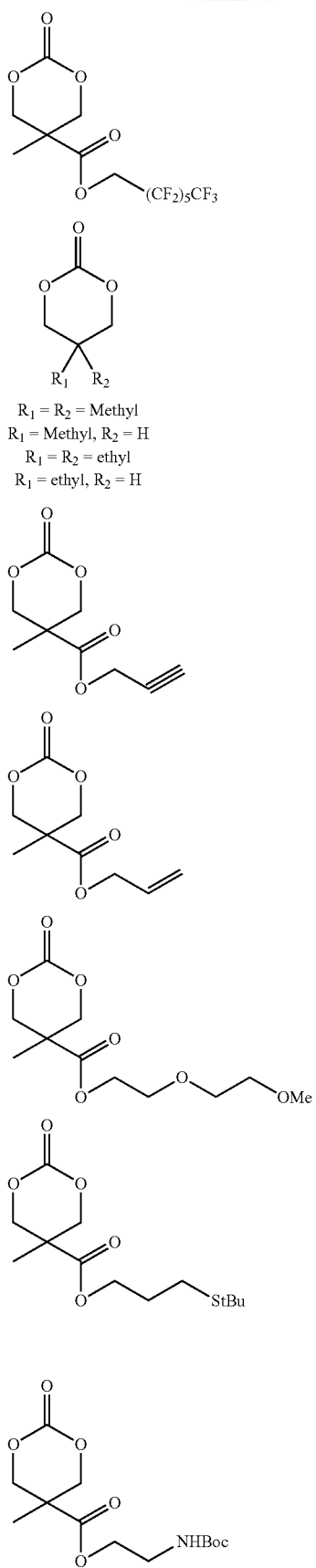
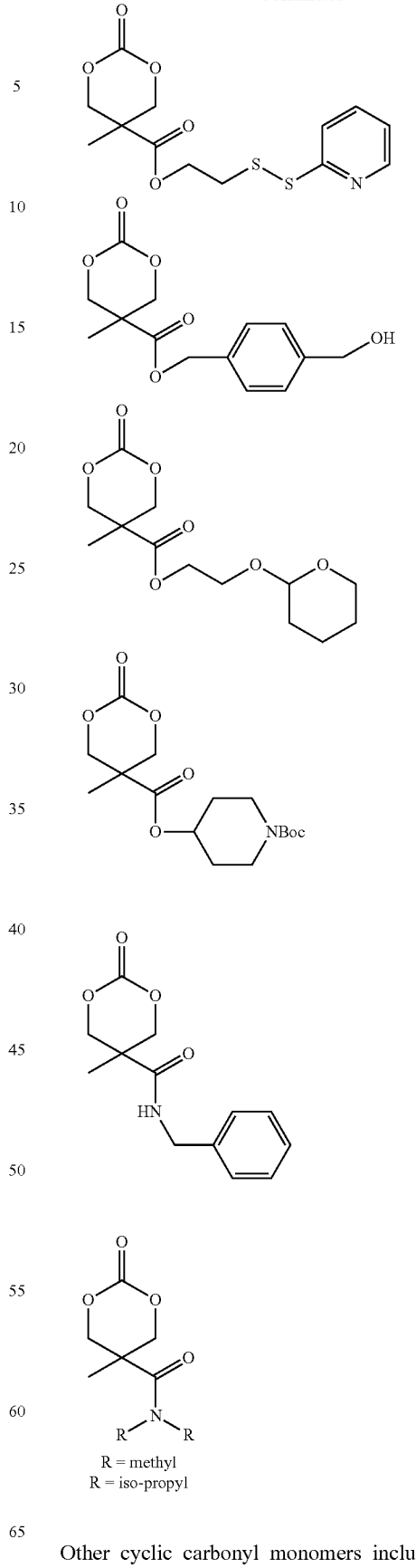
Other cyclic carbonyl monomers include cyclic esters (lactones), such as the compounds of Scheme 15.

Scheme 15.

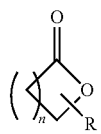

R = H, n = 1: beta-Propiolactone (b-PL)
R = H, n = 2: gamma-Butyrolactone (g-BL)
R = H, n = 3: delta-Valerolactone (d-VL)
R = H, n = 4: epsilon-Caprolactone (e-CL)
R = CH₃, n = 1: beta-Butyrolactone (b-BL)
R = CH₃, n = 2: gamma-Valerolactone (g-VL)

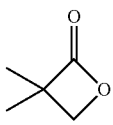

Pivalolactone (PVL)

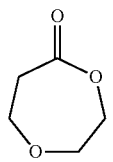

1,5-Dioxepan-2-one
(DXO)

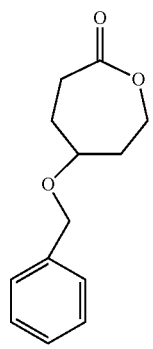

5-(Benzyloxy)oxepan-2-one
(BXO)

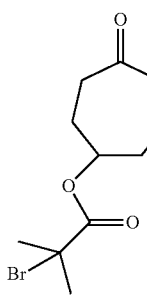

7-Oxooxepan-4-yl 2-bromo-2-
methylpropanoate
(BMP-XO)

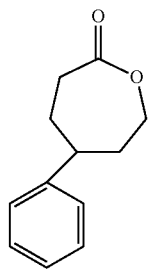

5-Phenyloxepan-2-one
(PXO)

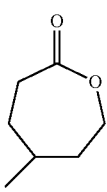

5-Methyloxepan-2-one
(MXO)

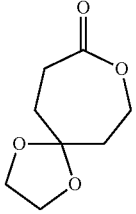

1,4,8-Trioxa(4,6)spiro-9-undecane
(TOSUO)

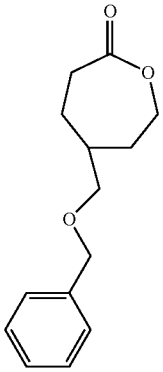

5-(Benzyloxymethyl)oxepan-2-one
(BOMXO)

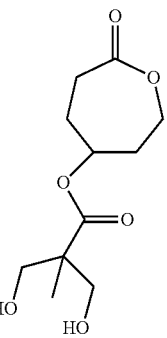

7-Oxooxepan-4-yl 3-hydroxy-
2-(hydroxymethyl)-2-methylpropanoate
(OX-BHMP)

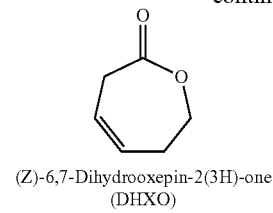

(Z)-6,7-Dihydrooxepin-2(3H)-one
(DHXO)

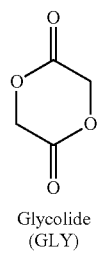

Glycolide
(GLY)

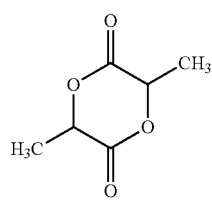

D-Lactide (DLA)
L-Lactide (LLA)
racemic Lactide, 1:1 D:L forms (DLLA)

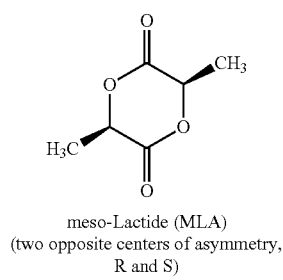

meso-Lactide (MLA)
(two opposite centers of asymmetry,
R and S)

The above cyclic carbonyl monomers can be purified by recrystallization from a solvent such as ethyl acetate or by other known methods of purification, with particular attention being paid to removing as much water as possible from the monomer.

ROP Initiators for the Block Copolymers

Initiators for ring opening polymerizations generally include nucleophilic groups such as alcohols, primary amines, secondary amines, and thiols. Herein, the ROP initiator for the block copolymer is a polymeric initiator comprising a polymer backbone derived from a polymerizable vinyl monomer (styrenes, methacrylates, acrylates, methacrylamides, acrylamides, vinyl esters). An exemplary polymeric initiator is the functionalized polystyrene initiator PS-OH shown below.

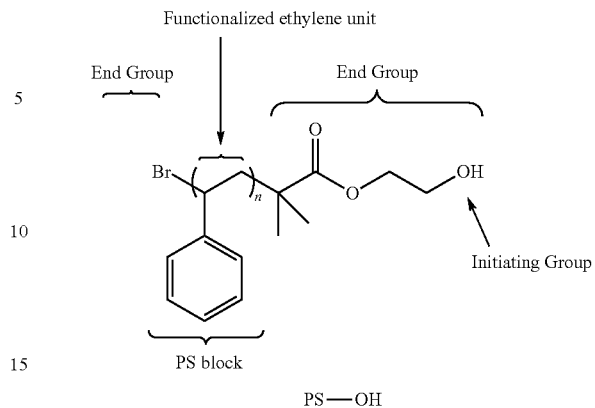

PS—OH

The polymeric initiator preferably comprises one or two nucleophilic hydroxy groups for initiating a ROP and forming diblock and triblock polymers, respectively. The number average molecular weight of the polymeric initiator can be from 1000 to 1,000,000, more specifically 1000 to 100,000, and even more specifically, 1000 to 50,000.

An exemplary non-limiting reaction to form a block copolymer is illustrated in Scheme 16 using another macroinitiator AZPS-OH.

Scheme 16.

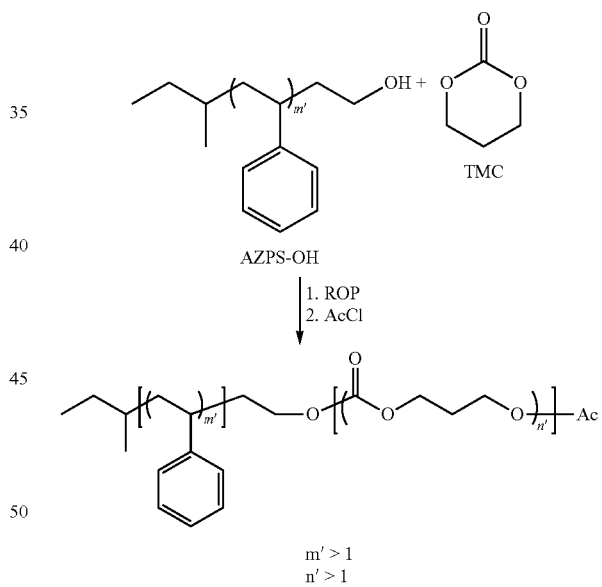

$m' > 1$
$n' > 1$

Ring Opening Polymerizations (ROP)

The following description of methods, conditions and materials for ring opening polymerizations is applicable to the preparation of the random copolymer for orientation control material and/or the block polymer for self-assembly.

The ring-opening polymerization can be performed at a temperature that is about ambient temperature or higher, 15° C. to 100° C., and more specifically ambient temperature. Reaction times vary with solvent, temperature, agitation rate, pressure, and equipment, but in general the polymerizations are complete within about 1 hour to about 48 hours.

The ROP reaction can be performed with or without the use of a solvent, preferably with a solvent. Exemplary solvents include dichloromethane, chloroform, benzene, toluene, xylene, chlorobenzene, dichlorobenzene, benzotrifluoride, petroleum ether, acetonitrile, pentane, hexane, heptane, 2,2,4-trimethylpentane, cyclohexane, diethyl ether, t-butyl methyl ether, diisopropyl ether, dioxane, tetrahydrofuran, or a combination comprising one of the foregoing solvents. When a solvent is present, a suitable monomer concentration is about 0.1 to 5 moles per liter, and more particularly about 0.2 to 4 moles per liter.

Whether performed in solution or in bulk, the ROP polymerizations are conducted using an inert (i.e., dry) atmosphere, such as nitrogen or argon, and at a pressure of from 100 to 500 MPa (1 to 5 atm), more typically at a pressure of 100 to 200 MPa (1 to 2 atm). At the completion of the reaction, the solvent can be removed using reduced pressure.

ROP Catalysts

No restriction is placed on the ROP catalyst. Less preferred catalysts for the ROP polymerization include metal oxides such as tetramethoxy zirconium, tetra-iso-propoxy zirconium, tetra-iso-butoxy zirconium, tetra-n-butoxy zirconium, tetra-t-butoxy zirconium, triethoxy aluminum, tri-n-propoxy aluminum, tri-iso-propoxy aluminum, tri-n-butoxy aluminum, tri-iso-butoxy aluminum, tri-sec-butoxy aluminum, mono-sec-butoxy-di-iso-propoxy aluminum, ethyl acetoacetate aluminum diisopropylate, aluminum tris(ethyl acetoacetate), tetraethoxy titanium, tetra-iso-propoxy titanium, tetra-n-propoxy titanium, tetra-n-butoxy titanium, tetra-sec-butoxy titanium, tetra-t-butoxy titanium, tri-iso-propoxy gallium, tri-iso-propoxy antimony, tri-iso-butoxy antimony, trimethoxy boron, triethoxy boron, tri-iso-propoxy boron, tri-n-propoxy boron, tri-iso-butoxy boron, tri-n-butoxy boron, tri-sec-butoxy boron, tri-t-butoxy boron, tri-iso-propoxy gallium, tetramethoxy germanium, tetraethoxy germanium, tetra-iso-propoxy germanium, tetra-n-propoxy germanium, tetra-iso-butoxy germanium, tetra-n-butoxy germanium, tetra-sec-butoxy germanium and tetra-t-butoxy germanium; halogenated compounds such as antimony pentachloride, zinc chloride, lithium bromide, tin(IV) chloride, cadmium chloride and boron trifluoride diethyl ether; alkyl aluminum such as trimethyl aluminum, triethyl aluminum, diethyl aluminum chloride, ethyl aluminum dichloride and tri-iso-butyl aluminum; alkyl zinc such as dimethyl zinc, diethyl zinc and diisopropyl zinc; tertiary amines such as triallylamine, triethylamine, tri-n-octylamine and benzyldimethylamine; heteropolyacids such as phosphotungstic acid, phosphomolybdic acid, silicotungstic acid and alkali metal salts thereof; zirconium compounds such as zirconium acid chloride, zirconium octanoate, zirconium stearate and zirconium nitrate. More particularly, the zirconium catalyst can be zirconium octanoate, tetraalkoxy zirconium or a trialkoxy aluminum compound.

Preferred ROP catalysts are organocatalysts whose chemical formulas contain no metal. Base organocatalysts for ROPs of cyclic carbonyl monomers include tertiary amines such as triallylamine, triethylamine, tri-n-octylamine and benzyldimethylamine 4-dimethylaminopyridine, phosphines, N-heterocyclic carbenes (NHC), bifunctional aminothioureas, phosphazenes, amidines, and guanidines.

A thiourea ROP organocatalyst is N-(3,5-trifluoromethyl)phenyl-N'-cyclohexyl-thiourea (TU):

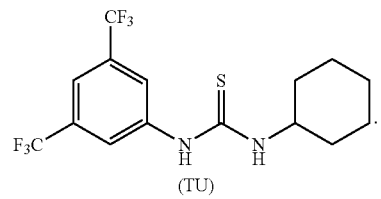

(TU)

Other ROP organocatalysts comprise at least one 1,1,1,3,3,3-hexafluoropropan-2-ol-2-yl (HFP) group. Singly-donating hydrogen bond catalysts have the formula (C-1):

wherein $R^2$ represents a hydrogen or a monovalent radical having from 1 to 20 carbons, for example an alkyl group, substituted alkyl group, cycloalkyl group, substituted cycloalkyl group, heterocycloalkyl group, substituted heterocycloalklyl group, aryl group, substituted aryl group, or a combination thereof. Exemplary singly-donating hydrogen bonding catalysts are listed in Scheme 17.

Scheme 17.

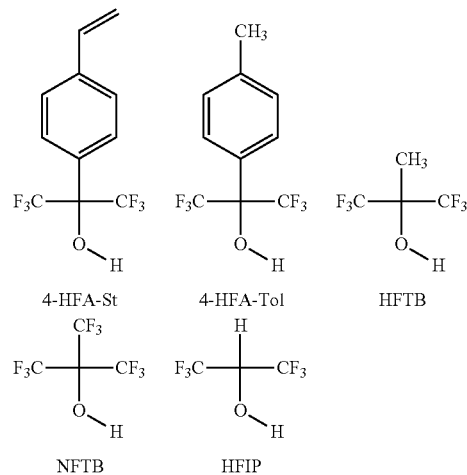

Doubly-donating hydrogen bonding catalysts have two HFP groups, represented by the general formula (C-2):

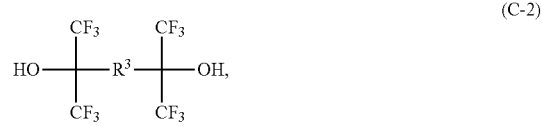

wherein $R^3$ is a divalent radical bridging group containing from 1 to 20 carbons, such as an alkylene group, a substituted alkylene group, a cycloalkylene group, substituted cycloalkylene group, a heterocycloalkylene group, substituted heterocycloalkylene group, an arylene group, a substituted arylene group, or a combination thereof. Representative double hydrogen bonding catalysts of formula (C-2) include those listed in Scheme 18. In a specific embodiment, $R^2$ is an arylene or substituted arylene group, and the HFP groups occupy positions meta to each other on the aromatic ring.

Scheme 18.

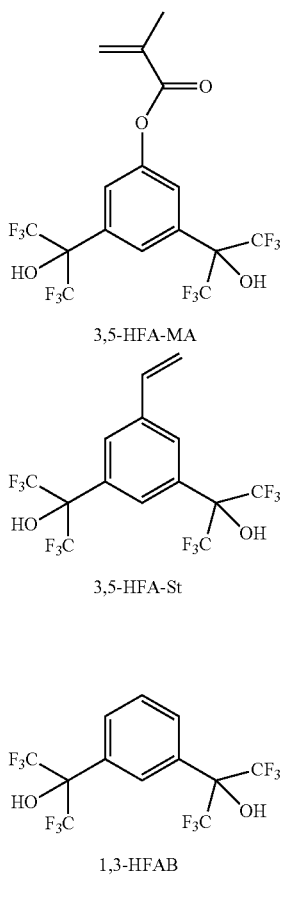

3,5-HFA-MA 3,5-HFA-St 1,3-HFAB 1,4-HFAB

Preferred Hydrogen Bonding Catalysts Include 4-HFA-St, 4-HFA-Tol, HFTB, NFTB, HPIP, 3,5-HFA-MA, 3,5-HFA-St, 1,3-HFAB, 1,4-HFAB, and combinations thereof.

The HFP catalyst can be bound to a support. In one embodiment, the support comprises a polymer, a crosslinked polymer bead, an inorganic particle, or a metallic particle. HFP-containing polymers can be formed by known methods including direct polymerization of an HFP-containing monomer (for example, the methacrylate monomer 3,5-HFA-MA or the styryl monomer 3,5-HFA-St). Functional groups in HFP-containing monomers that can undergo direct polymerization (or polymerization with a comonomer) include acrylate, methacrylate, alpha, alpha, alpha-trifluoromethacrylate, alpha-halomethacrylate, acrylamido, methacrylamido, norbornene, vinyl, vinyl ether, and other groups known in the art. Examples of linking groups include $C_1$-$C_{12}$ alkyl groups, $C_1$-$C_{12}$ heteroalkyl groups, ether groups, thioether groups, amino groups, ester groups, amide groups, and combinations thereof. Also contemplated are catalysts comprising charged HFP-containing groups bound by ionic association to oppositely charged sites on a polymer or a support surface.

Most preferably, the ROP catalyst is an acid organocatalyst (e.g., diphenylphosphate (DPP), triflic acid, and the like).

The ROP reaction mixture comprises at least one ROP catalyst and, when appropriate, several ROP catalysts together. The ROP catalyst is added in a proportion of 1/20 to 1/40,000 moles relative to the cyclic carbonyl monomers, and preferably in a proportion of 1/1,000 to 1/20,000 moles relative to the cyclic carbonyl monomers.

ROP Accelerators.

The ROP polymerization can be conducted in the presence of an optional accelerator, in particular a nitrogen base. Exemplary nitrogen base accelerators are listed below and include pyridine (Py), N,N-dimethylaminocyclohexane ($Me_2NCy$), 4-N,N-dimethylaminopyridine (DMAP), trans 1,2-bis(dimethylamino)cyclohexane (TMCHD), 1,8-diazabicyclo[5.4.0]undec-7-ene (DBU), 1,5,7-triazabicyclo[4.4.0]dec-5-ene (TBD), 7-methyl-1,5,7-triazabicyclo[4.4.0]dec-5-ene (MTBD), (−)-sparteine, (Sp) 1,3-bis(2-propyl)-4,5-dimethylimidazol-2-ylidene (Im-1), 1,3-bis(2,4,6-trimethylphenyl)imidazol-2-ylidene (Im-2), 1,3-bis(2,6-di-i-propylphenyl(imidazol-2-ylidene (Im-3), 1,3-bis(1-adamantyl)imidazol-2-ylidene (Im-4), 1,3-di-i-propylimidazol-2-ylidene (Im-5), 1,3-di-t-butylimidazol-2-ylidene (Im-6), 1,3-bis(2,4,6-trimethylphenyl)-4,5-dihydroimidazol-2-ylidene (Im-7), 1,3-bis(2,6-di-i-propylphenyl)-4,5-dihydroimidazol-2-ylidene, 1,3-bis(2,6-di-i-propylphenyl)-4,5-dihydroimidazol-2-ylidene (Im-8) or a combination thereof, shown in Scheme 19.

Scheme 19.

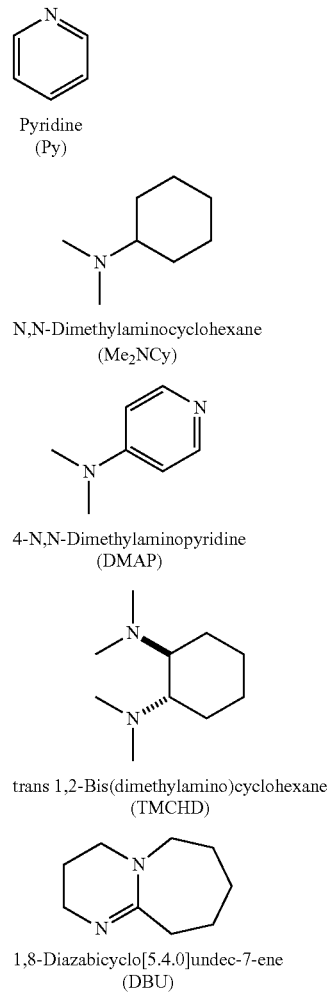

Pyridine (Py)

N,N-Dimethylaminocyclohexane ($Me_2NCy$)

4-N,N-Dimethylaminopyridine (DMAP)

trans 1,2-Bis(dimethylamino)cyclohexane (TMCHD)

1,8-Diazabicyclo[5.4.0]undec-7-ene (DBU)

-continued

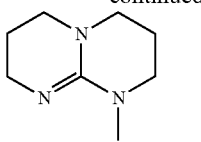

7-Methyl-1,5,7-triazabicyclo[4.4.0]dec-5-ene
(MTBD)

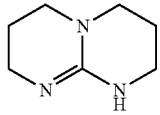

1,5,7-Triazabicyclo[4.4.0]dec-5-ene
(TBD)

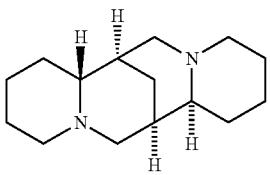

(−)-Sparteine
(Sp)

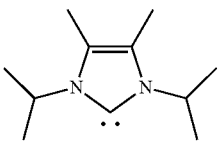

1,3-Bis(2-propyl)-4,5-dimethylimidazol-2-
ylidene
(Im-1)

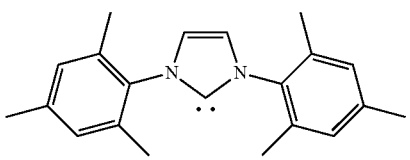

1,3-Bis(2,4,6-trimethylphenyl)imidazol-2-
ylidene
(Im-2)

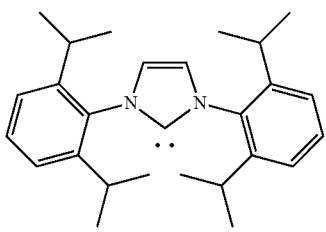

1,3-Bis(2,6-di-i-propylphenyl(imidazol-2-
ylidene
(Im-3)

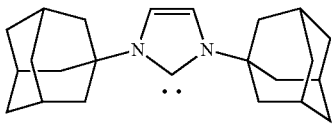

1,3-Bis(1-adamantyl)imidazol-2-yliden)
(Im-4)

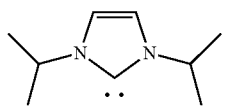

1,3-Di-i-propylimidazol-2-ylidene
(Im-5)

-continued

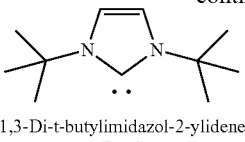

1,3-Di-t-butylimidazol-2-ylidene
(Im-6)

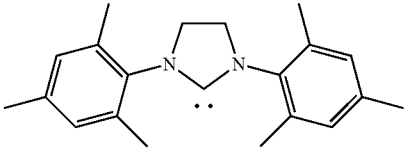

1,3-Bis(2,4,6-trimethylphenyl)-4,5-
dihydroimidazol-2-ylidene
(Im-7)

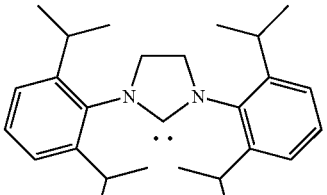

1,3-Bis(2,6-si-i-propylphenyl)-4,5-
dihydroimidazol-2-ylidene
(Im-8)

In an embodiment, the accelerator has two or three nitrogens, each capable of participating as a Lewis base, as for example in the structure (−)-sparteine. Stronger bases generally improve the polymerization rate.

The catalyst and the accelerator can be the same material. For example, some ring opening polymerizations can be conducted using 1,8-diazabicyclo[5.4.0]undec-7-ene (DBU) alone, with no another catalyst or accelerator present.

The catalyst is preferably present in an amount of about 0.2 to 20 mol %, 0.5 to 10 mol %, 1 to 5 mol %, or 1 to 2.5 mol %, based on total moles of cyclic carbonyl monomer.

The nitrogen base accelerator, when used, is preferably present in an amount of 0.1 to 5.0 mol %, 0.1 to 2.5 mol %, 0.1 to 1.0 mol %, or 0.2 to 0.5 mol %, based on total moles of cyclic carbonyl monomer. As stated above, in some instances the catalyst and the nitrogen base accelerator can be the same compound, depending on the particular cyclic carbonyl monomer.

The amount of initiator is calculated based on the equivalent molecular weight per nucleophilic initiator group in the dinucleophilic initiator. The initiator groups are preferably present in an amount of 0.001 to 10.0 mol %, 0.1 to 2.5 mol %, 0.1 to 1.0 mol %, and 0.2 to 0.5 mol %, based on total moles of cyclic carbonyl monomer. For example, if the molecular weight of the initiator is 100 g/mole and the initiator has 2 hydroxyl groups, the equivalent molecular weight per hydroxyl group is 50 g/mole. If the polymerization calls for 5 mol % hydroxyl groups per mole of monomer, the amount of initiator is 0.05×50=2.5 g per mole of monomer.

In a specific embodiment, the catalyst is present in an amount of about 0.2 to 20 mol %, the nitrogen base accelerator is present in an amount of 0.1 to 5.0 mol %, and the nucleophilic initiator groups of the initiator are present in an amount of 0.1 to 5.0 mol % based on the equivalent molecular weight per nucleophilic initiator group of the initiator.

The catalysts can be removed by selective precipitation or in the case of the solid supported catalysts, simply by filtration. The block polymer can comprise residual catalyst in an amount of 0 wt % (weight percent) or more, based on total weight of the block copolymer and the residual catalyst. The amount of residual catalyst can also be less than 20 wt %, less than 15 wt %, less than 10 wt %, less than 5 wt %, less than 1 wt %, or most specifically less than 0.5 wt % based on the total weight of the block copolymer and the residual catalyst.

Endcap Agents

An endcap agent can prevent further chain growth and stabilize the reactive end groups from unwanted side reactions, such as chain scission. Endcap agents include, for example, compounds for converting terminal hydroxyl groups to esters, such as acid anhydrides (e.g., acetic anhydride), acid chlorides (acetyl chloride), and/or active esters (e.g., p-nitrophenyl esters). Other endcap agents include alkyl and aryl isocyanates, which form carbamates (urethanes) with terminal hydroxy groups. Other endcap agents include alkylating agents capable of forming alkyl ethers, aromatic ethers including benzyl ethers, silyl ethers, acetals, ketals, and the like. Still other endcap agents include perhalogenated (e.g., perfluorinated) derivatives of any of the foregoing endcap agents. In an embodiment, the endcap agent is acetic anhydride, which converts reactive hydroxy end groups to acetate ester groups.

Average Molecular Weight.

The block polymer used for self-assembly preferably has a number average molecular weight Mn as determined by size exclusion chromatography of at least 1500 g/mol, more specifically 1500 g/mol to 1,000,000 g/mol, 4000 g/mol to 150000 g/mol, or 4000 g/mol to 50000 g/mol. In an embodiment, the final block polymer has a number average molecular weight Mn of 8,000 to 40,000 g/mole.

The block polymer used for self-assembly also preferably has a narrow polydispersity index (PDI), generally from 1.01 to 2.0, more particularly 1.01 to 1.30, and even more particularly 1.01 to 1.25.

Layered Structures

Directed self-assembly (DSA) can potentially extend current lithography by enhancing the spatial resolution and/or controlling the critical dimension variation of a predefined pattern on a substrate. DSA can be implemented by graphoepitaxy, chemical epitaxy, and/or the surface properties of the orientation control layer comprising the disclosed random copolymer. In graphoepitaxy, self-assembly (SA) of a material (e.g., a block polymer) is guided by topographical features of a lithographically pre-patterned surface (e.g., a resist pattern), where the surface properties of the pre-pattern features guide orientation of the resulting phase domains. In chemical epitaxy, self-assembly of an SA material is guided by lithographically defined chemical pre-patterns on a substrate surface. With the disclosed random copolymers for orientation control and a block polymer for self-assembly, a domain pattern comprising perpendicularly oriented lamellar domains can be prepared utilizing a lithographically generated topographic and/or chemical pre-pattern. In an embodiment, the block copolymer is a high-chi block copolymer comprising a polycarbonate block.

The term "substrate" refers to all layers underlying a structure on which the SA material layer is disposed, or if an orientation control layer is used, any layer or layers underneath the orientation control layer. The substrate can have one or more layers arranged in a stack. As non-limiting examples, the substrate can include a silicon wafer, a metal foil, a hard mask, a dielectric layer, and/or an anti-reflection layer (ARC).

The term "disposed" refers to a layer in contact with a surface of another layer. "Disposing" or "applying" refer to forming a layer to be in contact with a surface of another layer, without limitation as to the method employed unless otherwise stated, with the proviso that the desirable characteristics of the disposed or applied layer are obtained, such as uniformity and thickness. The term "casting" refers to forming a layer of a material by disposing a solution of the material dissolved in a solvent onto another layer, and removing the solvent.

Casting a solution of a material onto a layer (e.g., orientation control material, SA material, resist, topcoat) is understood to mean that the solution makes contact with the available surfaces of the layer on which it is cast (i.e., surfaces in contact with the surrounding atmosphere). These can include substrate surfaces, resist surfaces, block copolymer surfaces, orientation control surfaces, and/or topcoat surfaces). When referring to the chemical components, reactivity, solubility and/or surface properties of the SA layer, it should be understood that such reference is directed only to the SA layer unless otherwise stated. Likewise, when referring to the chemical components, chemical reactivity, solubility and/or surface properties of the substrate surface or a substrate layer, such reference is directed only to the substrate surface or the substrate layer unless otherwise stated. Further, when referring to the chemical components, chemical reactivity, solubility and/or surface properties of the underlayer or underlayer material, such reference is directed only to the underlayer or underlayer material unless otherwise stated.

Also disclosed are articles for lithographic patterning comprising a substrate and an orientation control layer disposed on a surface of the substrate. These articles are also referred to herein as "modified substrates". The orientation control layer of the modified substrate comprises a derivative of the above-described random copolymers that is linked by a covalent bond to the surface of the substrate. The covalently bound random copolymer comprises a divalent first repeat unit of formula (A-1), a divalent second repeat unit of formula (A-2), and a trivalent third repeat unit of formula (A-8):

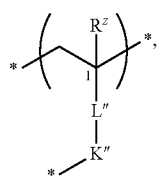

(A-8)

wherein $R^z$ is a monovalent radical selected from the group consisting of H, methyl, ethyl, and trifluoromethyl (*—$CF_3$), L" is an independent divalent linking group comprising 1 to 10 carbons, and K" is a divalent linking group, and the starred bond of K" is covalently linked to a surface group of the substrate, and the first repeat unit, second repeat unit, and third repeat are randomly covalently bound in the chemical structure of the random copolymer.

A method of forming an article (modified substrate) comprises forming an initial layer disposed on a surface of a substrate, the initial layer comprising an above-described random copolymer, a solvent, and optionally a member of the group consisting of thermal acid generators (TAGs), photo-acid generators (PAGs), catalysts, and combinations thereof. Treating the initial layer to remove the solvent (e.g., by a thermal bake and/or exposure to actinic light) results in the article (modified substrate) comprising an orientation control layer disposed on the surface of the substrate. The orientation control layer comprises a derivative of the random copolymer which is covalently bound linked to the substrate. Optionally, the article (modified substrate) can be rinsed with a solvent to remove any un-bound random copolymer. In an embodiment, the orientation control layer is neutral wetting with respect to a block copolymer for self-assembly that comprises a polycarbonate block. The thermal bake of the initial layer can be performed at a temperature of about 100° C. to about 250° C. for about 1 second to about 24 hours, preferably about 120° C. to about 250° C. for 1 minute to 5 minutes.

The following schematic diagrams illustrate methods of forming modified substrates comprising an orientation control layer and their use in forming self-assembled lamellar domain patterns of block copolymers.

FIGS. 18A to 18F are cross-sectional layer diagrams illustrating a process of directed self-assembly of a diblock copolymer resulting in formation of perpendicularly oriented lamellar domains without using a lithographically prepared topographic or chemical pre-pattern. It should be understood that the layers and features are not drawn to scale. In general this process applies to self-assembly materials having a low Flory-Huggins interaction parameter chi ($\chi$), which allows the air interface and the orientation control surface to be neutral to the SA material (i.e., each phase domain of the self-assembled SA materials wets the air interface and the orientation control surface).

Figure 18A:
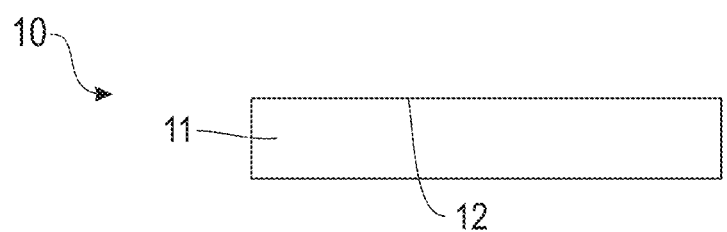
FIGS. 18A to 18F are cross-sectional layer diagrams showing a process of forming perpendicularly oriented lamellar domain pattern when the air interface and the orientation control layer are both neutral to the block copolymer (i.e., each block of the block copolymer wets the air interface and orientation control layer).
Figure 18B:
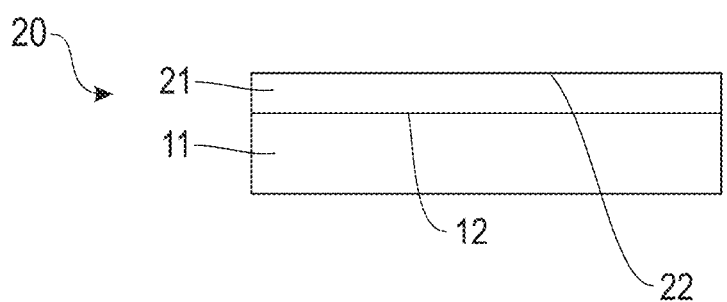

Layered structure 10 of FIG. 18A comprises substrate 11 having substrate surface 12. Substrate 11 can comprise one or more layers (not shown). A solution comprising a disclosed random copolymer for orientation control, which is dissolved in a suitable solvent, is applied to substrate surface 12 (e.g., by spin coating) to form an initial layer (not shown). Removal of any solvent from the initial layer (e.g., thermal bake or exposure to actinic light or both) results in layered structure 20 (FIG. 18B), also referred to herein as a "modified substrate" or "orientation control substrate". Layered structure 20 comprises orientation control layer 21, which comprises the random copolymer bound by at least one covalent bond to substrate 11. Optionally, layered structure 20 can be rinsed with a solvent to remove any un-bound random copolymer.

Figure 18C:
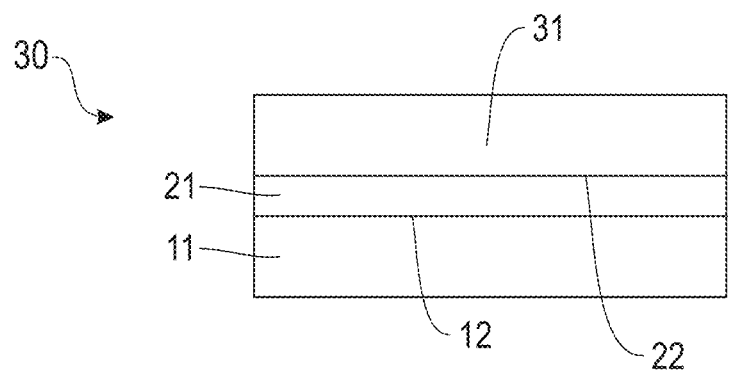
Figure 18D:
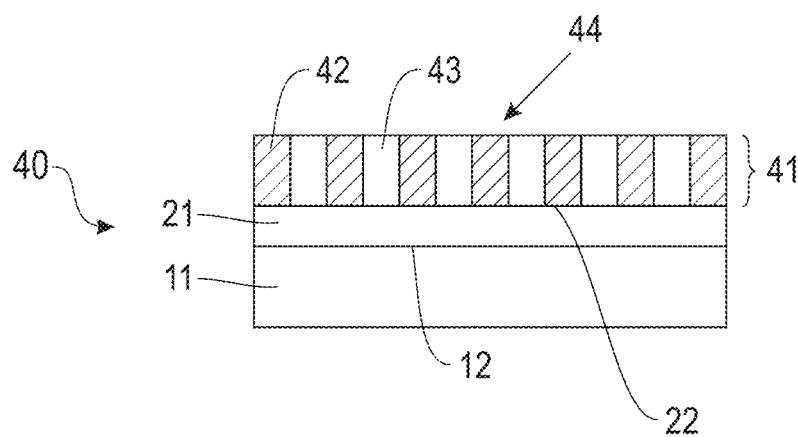
Figure 18E:
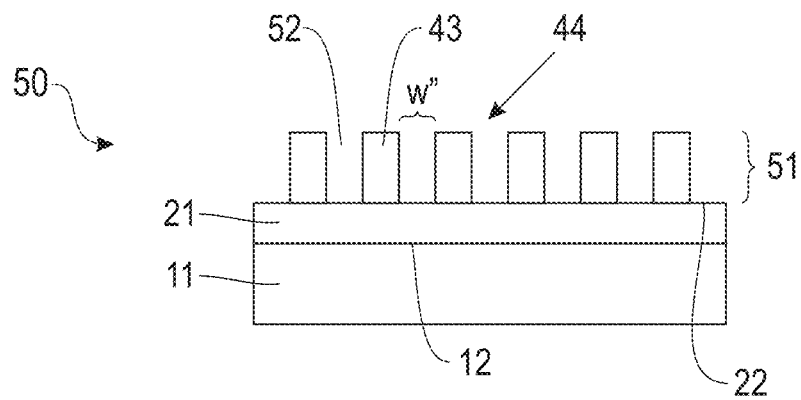
Figure 18F:
Figure 18F:
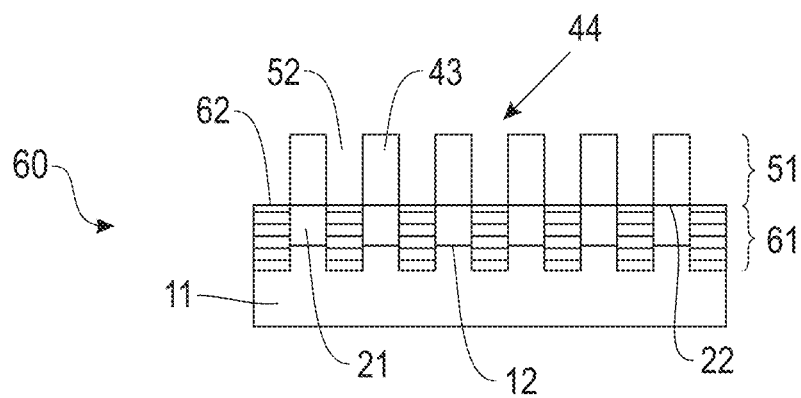

Orientation control layer 21 has orientation control surface 22. A solution comprising a disclosed block copolymer for self-assembly (SA material) dissolved in a solvent is applied to orientation control surface 22 (e.g., by spin coating). Removal of the solvent followed by an optional post-application bake (PAB) (e.g., 115° C. for 1 minute), results in layered structure 30 (FIG. 18C). Layered structure 30 comprises SA layer 31 comprising the block copolymer disposed on orientation control surface 22. SA layer 31 is then subjected to conditions effective in inducing the block copolymer to self-assemble (e.g., annealing layered structure 30 at a temperature of 120° C. to 250° C. for about 1 minute to about 24 hours), thereby forming layered structure 40 (FIG. 18D). Layered structure 40 comprises a perpendicularly oriented lamellar domain pattern 41 of self-assembled block copolymer disposed on orientation control surface 22. Domain pattern 41 comprises first lamellar domains 42 comprising a first block of the block copolymer (e.g., block A) and second lamellar domains 43 comprising a second block (e.g., block B) of the block copolymer. In this instance both blocks of the diblock copolymer wet the air interface 44 and orientation control surface 22 (i.e., air interface 44 and the orientation control surface 22 are neutral to the block copolymer).

One of the domains can be selectively removed (e.g., ion-etched) or modified in the presence of the other domain (s). As an example, first lamellar domains 42 can be selectively etched by modifying second lamellar domains 43 by i) sequential infiltration synthesis (SIS) to infuse metal oxide precursors or ii) by solution infiltration of second lamellar domains 43 with metal salts, followed by ion-etching.

Selective removal of one of the domains can also remove underlying orientation control material, producing layered structure 50 (FIG. 18E) comprising relief pattern 51. Relief pattern 51 comprises second lamellar domains 43 disposed on orientation control surface 22, and openings 52. Second lamellar domains 43 can have different dimensions after the selective removal of first lamellar domains 42 compared to the dimensions of second lamellar domains 43 before the selective removal. Openings 52 can have a width w" of about 0.5 Lo, (e.g., for low-chi SA materials, w" is about 12.5 nm to about 100 nm). The selective removal process may be carried out by a thermal bake (for thermally decomposable materials), a reactive ion etch process, dissolution in a selective solvent, or a combination thereof. A chemical modification may be accomplished by a variety of known methods. For example, domains may be selectively reacted with silanes or silyl chlorides to introduce silicon content into a domain and thereby increase its plasma etch resistance. Alternatively, chemical agents may be used to bind or chemically couple to functional groups that are exclusively located in one type of self-assembled domain, to effect, for example, increased solubility property differences that can advantageously be used to selectively remove one domain in the presence of the other domain.

Lastly, relief pattern 51 can be transferred to substrate 11, thereby forming layered structure 60 (FIG. 18F) comprising transfer pattern 61. Patterned region 61 can be a pattern of lines, holes, pits, and/or a chemically altered state of the orientation control layer 21 and/or substrate 11, which are represented by areas 62. Patterned region 61 can extend into one or more layers, including the orientation control layer 21 and/or the substrate 11 (shown). The pattern transfer process can further comprise removal of second lamellar domains 43 (not shown).

FIGS. 19A to 19E are cross-sectional layer diagrams illustrating DSA of a diblock copolymer by using a neutral orientation control layer and a lithographically prepared topographic pre-pattern prior to self-assembly. Layered structure 100 (FIG. 19A) comprises substrate 101, orientation control layer 102 disposed on substrate surface 103, and topographic pre-pattern 104 disposed on orientation control surface 105. Orientation control layer 102 comprises a form of the disclosed random copolymer bound by at least one covalent bond to substrate 101. Substrate 101 can comprise one or more sub-layers (not shown). Modified substrate 110 comprising substrate 101 and orientation control layer 102 is also indicated. Topographic pre-pattern 104 comprises topographical features 106. Features 106 have sidewalls 107, top surface 108, height h', and width w'. Features 106 are separated by trench areas 109 which include surface 112 of orientation control layer 102 in contact with air. Pre-pattern 104 can be formed by any suitable lithographic technique. Features 106 can comprise any suitable material 111 for directing self-assembly. For example, features 106 can comprise a resist material, which can be a positive and/or negative tone resist material.

The topography of pre-pattern 104 aids self-assembly of the disclosed diblock copolymer to form perpendicularly oriented domains. The diblock copolymer is allocated substantially or wholly within the trench areas 109 of features 106. For graphoepitaxy, the thickness (i.e., height h') of features 106 is typically greater than or comparable to the thickness of the block polymer undergoing self-assembly. In this example, sidewalls 107 are not neutral to the block copolymer (i.e., sidewalls 107 are preferentially wetted by one of the blocks of the block copolymer). In this instance, the air interface can also be non-neutral to the diblock copolymer. Surface 112 of orientation control layer 102 is neutral to the block copolymer (i.e., both blocks of the diblock copolymer wet the orientation control surface).

Figure 19A:
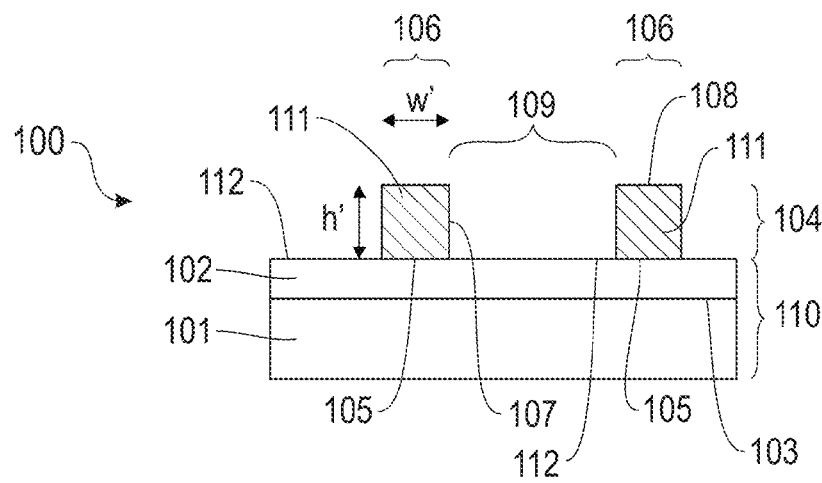
FIGS. 19A to 19E are cross-sectional layer diagrams showing a process of forming perpendicularly oriented lamellar domain pattern using a topographic pre-pattern to direct self-assembly of the block copolymer. In this example, the resist features and air interface are non-neutral to the block copolymer (i.e., preferentially wetted by one block of the block copolymer), and the orientation control layer is neutral to the block copolymer.
Figure 19B:
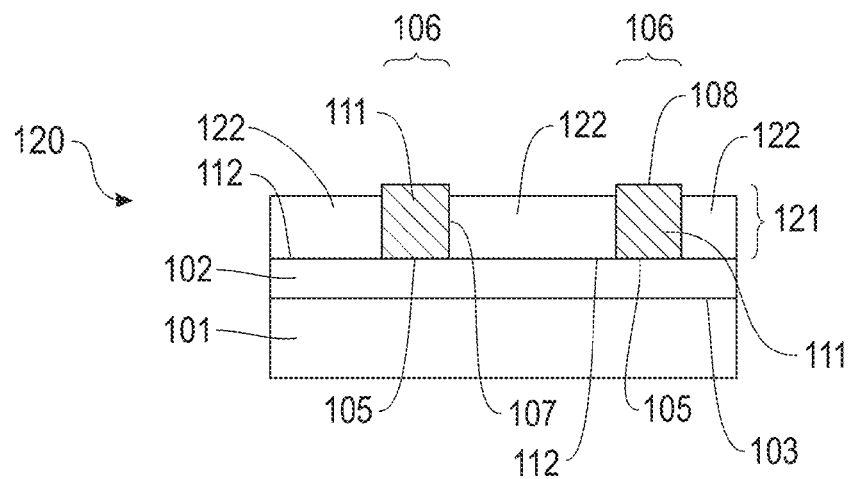
Figure 19C:
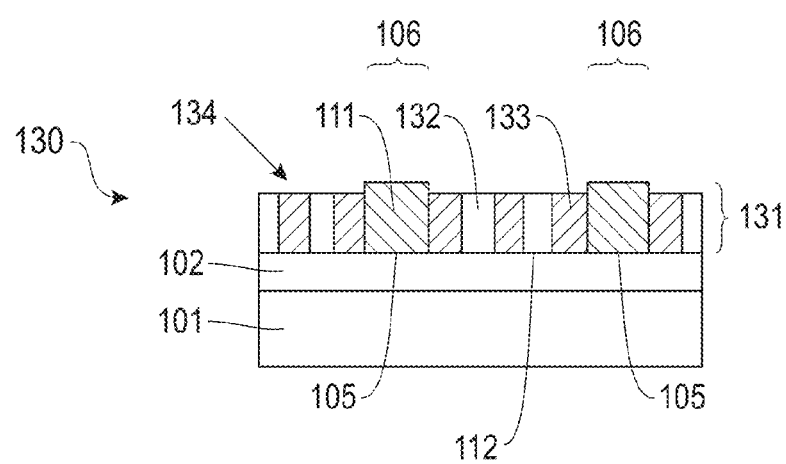

A coating mixture comprising the block copolymer, a suitable solvent, and any optional additives is applied to topographic pre-pattern 104 using any suitable technique (e.g., spin coating), thereby allocating the block polymer substantially in trench areas 109. Topographic pre-pattern 104 is insoluble in or substantially insoluble in the solvent used to prepare the coating mixture. Removal of the solvent from the applied coating mixture provides layered structure 120 comprising layer 121 (FIG. 19B). Layer 121 comprises features 106 and regions 122 comprising block copolymer disposed on surface 112 of trench areas 109.

Self-assembly of the block copolymer results in layered structure 130 (FIG. 19C) comprising perpendicularly oriented lamellar domain pattern 131. Self-assembly can be spontaneous and/or assisted by a thermally treating (annealing) layer 121. Domain pattern 131 comprises features 106 and first lamellar domains 132 and second lamellar domains 133 disposed on surface 112 of trench areas 109. Air interface 134 is indicated by the arrow. In this example, second lamellar domains 133 preferentially wet sidewalls 107 of features 106 and therefore are positioned in contact with sidewalls 107. Second lamellar domains 133 in contact with sidewalls 107 can have a width of about 0.5 Lo.

Figure 19D:
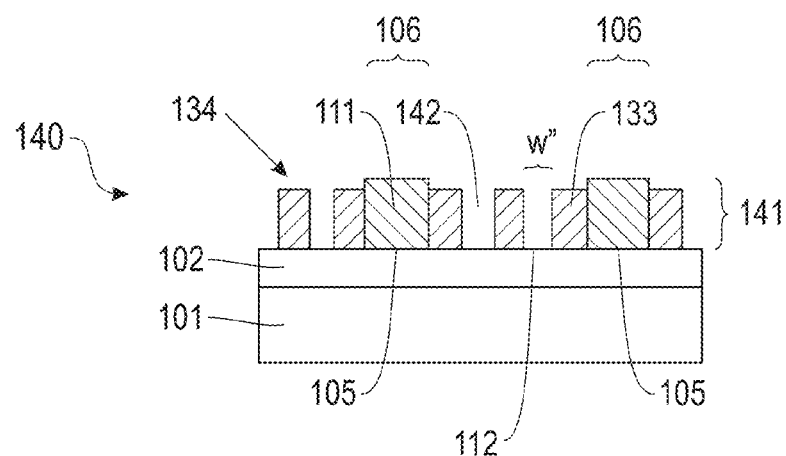

One of the domains, for example first domains 132, can be selectively removed (e.g., ion-etched) or modified in the presence of the second domains 133, to generate topographical or chemical contrast. Selective removal of one of the domains can also remove underlying orientation control material (not shown), producing layered structure 140 comprising relief pattern 141 (FIG. 19D). Relief pattern 141 comprises second domains 133 disposed on surface 112, openings 142, and features 106. Openings 142 can have a width w" of about 0.5 Lo (e.g., for a high-chi SA material, w" can be about 2 nm to about 10 nm). The selective removal process may be carried out by a thermal bake (for thermally decomposable materials), a reactive ion etch process, dissolution in a selective solvent, or a combination thereof. A chemical modification may be accomplished by a variety of known methods as discussed above. The selective removal process can further remove features 106 (not shown).

Figure 19E:
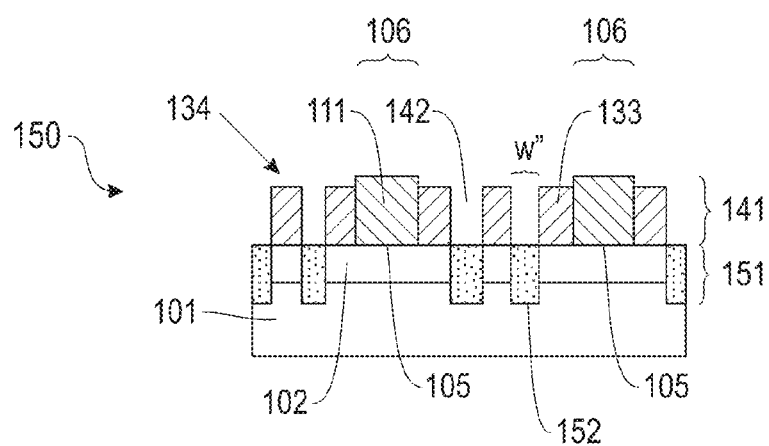

Finally, relief pattern 141 can be transferred to substrate 101, thereby forming layered structure 150 comprising patterned region 151 of substrate 101 (FIG. 19E). Patterned region 151 can be a pattern of lines, holes, pits, and/or a chemically altered state of the substrate material represented by altered areas 152. Patterned region 151 can extend into one or more layers of substrate 101. The pattern transfer can be accomplished, for example, by using a reactive ion etch process. Features 106 and second lamellar domains 133 can be removed concomitantly or subsequently to formation of altered areas 152. The height of relief pattern 141 after the transfer can be less than the height of relief pattern 141 before the transfer.

FIGS. 20A to 20D are cross-sectional layer diagrams illustrating another process of directed self-assembly using a topcoat disposed on the SA layer comprising the diblock copolymer. In this example, the topcoat and the orientation control layer are neutral to the diblock copolymer. DSA results in perpendicularly oriented lamellar domains without utilizing a lithographic pre-pattern to guide self-assembly of the block copolymer.

Figure 20A:
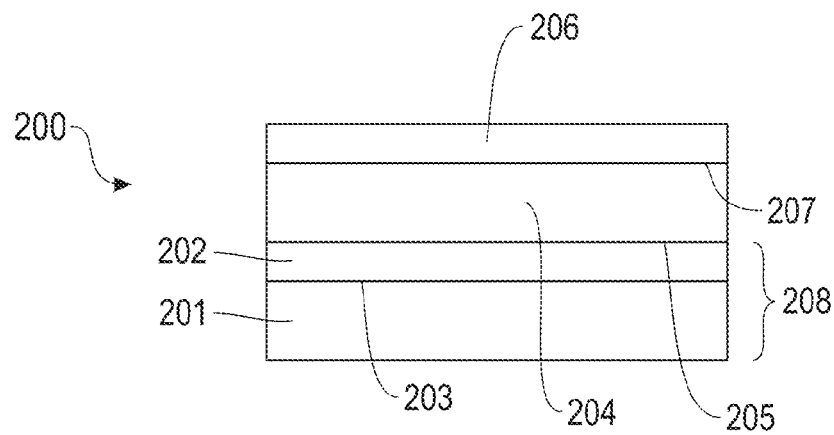
FIGS. 20A to 20D are cross-sectional layer diagrams showing a process of forming a perpendicularly oriented lamellar domain pattern using a topcoat on the SA layer to direct self-assembly of the block copolymer. In this example, the topcoat and the orientation control layer are both neutral to the block copolymer.

Layered structure 200 of FIG. 20A comprises substrate 201, orientation control layer 202 disposed on substrate surface 203, SA layer 204 comprising diblock copolymer disposed on orientation control surface 205, and topcoat 206 disposed on SA layer surface 207. Modified substrate 208 is also indicated. No restriction is placed on the composition of topcoat 206, providing topcoat 206 promotes self-assembly of the block copolymer to form perpendicularly oriented lamellar domains relative to orientation control surface 205 and does not adversely affect transfer of the resulting pattern to substrate 201. Substrate 201 can comprise one or more layers (not shown). Orientation control layer 202, SA layer 204, and topcoat 206 can be prepared using any suitable lithographic technique.

Figure 20B:
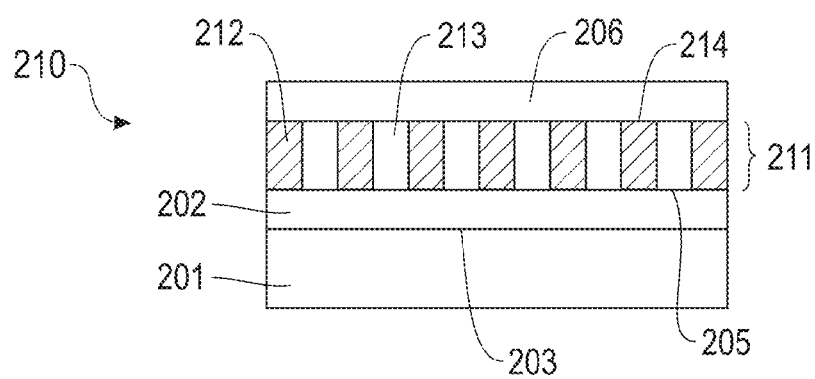
Figure 20C:
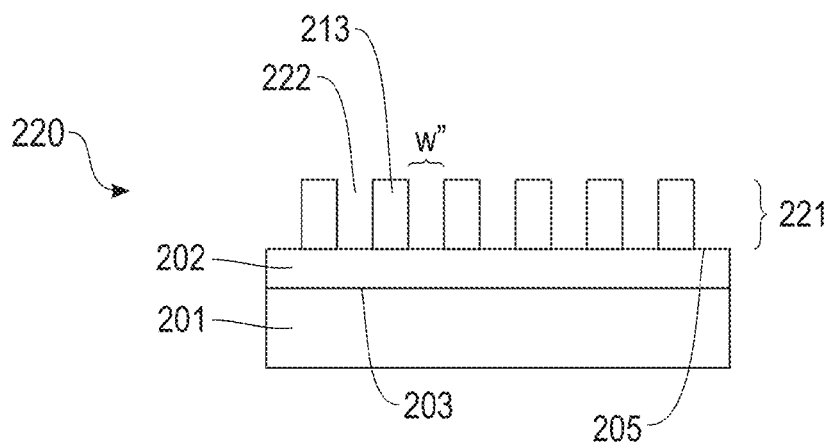
Figure 20D:
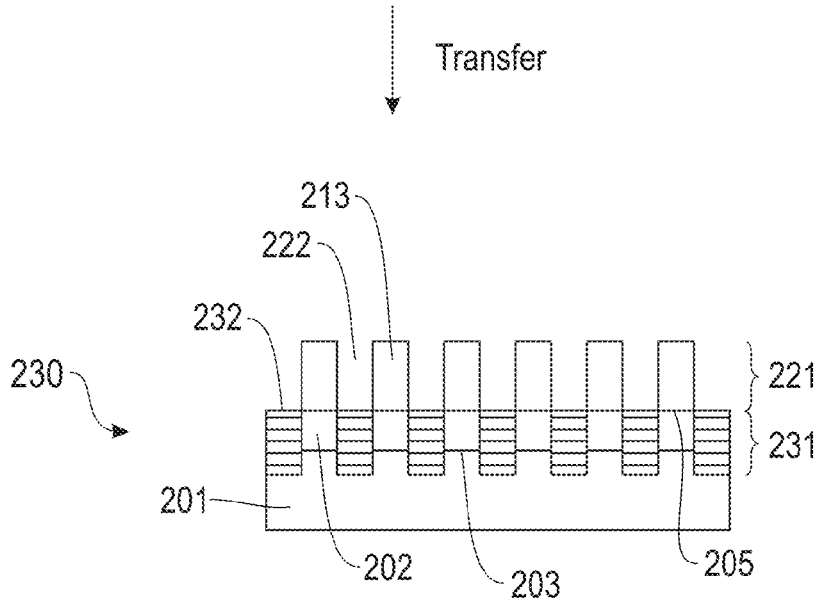

SA layer 204 is then subjected to conditions effective in causing the block copolymer to self-assemble (e.g., by annealing layered structure 200 at a given elevated temperature (e.g., 120° C. to 250° C.) for a suitable period of time (e.g., 1 minute to 24 hours), thereby forming layered structure 210 (FIG. 20B). Layered structure 210 comprises perpendicularly oriented lamellar domain pattern 211 comprising self-assembled block copolymer disposed on orientation control surface 205. Domain pattern 211 comprises first lamellar domains 212 comprising a first block of the block copolymer (e.g., block A) and second lamellar domains 213 comprising a second block (e.g., block B) of the block copolymer. In this example, topcoat surface 214 and orientation control surface 205 are both neutral to the diblock copolymer (i.e., both blocks of the diblock copolymer wet each surface).

The topcoat 206 and one of the domains such as, for example, first lamellar domains 212, can be selectively removed (e.g., ion-etched) or modified in the presence of the second domains 213. The first lamellar domains 212 can be removed simultaneously or sequentially with respect to topcoat 206. Selective removal of one of the domains can also remove underlying orientation control material (not shown). The result is layered structure 220 (FIG. 20C) comprising relief pattern 221 comprising second lamellar domains 213 disposed on orientation control surface 205 spaced by openings 222. Openings 222 can have a width w" of about 0.5 Lo (e.g., about 2 nm to about 10 nm for a high-chi block copolymer). The selective removal process may be carried out by a thermal bake (for thermally decomposable materials), a reactive ion etch process, dissolution in a selective solvent, or a combination thereof, as described above.

Lastly, relief pattern 221 can be transferred to substrate 201, thereby forming layered structure 230 (FIG. 20D) comprising transfer patterned region 231. Patterned region 231 can be a pattern of lines, holes, pits, or a chemically altered state of the orientation control layer 202 and/or substrate 201, which are represented by regions 232. Patterned region 231 can extend into one or more layers, including the orientation control layer 202 and/or the substrate 201 (shown). The pattern transfer process can further comprise removal of second lamellar domains 213 (not shown). The height of relief pattern 221 after the transfer can be less than the height of relief pattern 221 before the transfer.

FIGS. 21A to 21E are cross-sectional layer diagrams illustrating DSA of a disclosed diblock copolymer by using a neutral orientation control layer and a lithographically prepared chemical pre-pattern prior to self-assembly. Layered structure 300 (FIG. 21A) comprises substrate 301, orientation control layer 302 disposed on substrate surface 303, and chemical pre-pattern 304 (not drawn to scale) disposed on orientation control surface 305. Orientation control layer 302 comprises a disclosed random copolymer bound by at least one covalent bond to substrate 301. Substrate 301 can comprise one or more sub-layers (not shown). Modified substrate 310 is also indicated. Chemical pre-pattern 304 comprises chemical features 306. Features 306 have sidewalls 307 of height h' and top surface 308 having width w'. Features 306 are separated by trench areas 309 that include surface 312 of orientation control layer. In this instance height h' is small, and therefore sidewalls 307 have little or no influence on the orientation of the self-assembled domains. In this instance, top surface 308 and surface 312 influence orientation of the self-assembled domains. Chemical pre-pattern 304 can be formed by any suitable lithographic technique. Features 306 can comprise any suitable material 311 for directing self-assembly. For example, features 306 can comprise a resist material, which can be a positive and/or negative tone resist material.

The surface properties of chemical pre-pattern 304 directs self-assembly of a diblock copolymer to form perpendicularly oriented domains. In this instance, the diblock copolymer is allocated substantially uniformly over trench areas 309 and features 306. For chemical epitaxy, the thickness (i.e., height h') of features 306 is typically much less than the thickness of the layer comprising block polymer that undergoes self-assembly. In this example, top surfaces 308 are not neutral to the block copolymer (i.e., top surfaces 308 are preferentially wetted by one of the blocks of the block copolymer). The air interface can also be non-neutral to the diblock copolymer. In this instance, surface 312 is neutral to the block copolymer (i.e., both blocks of the diblock copolymer wet the orientation control surface).

Figure 21A:
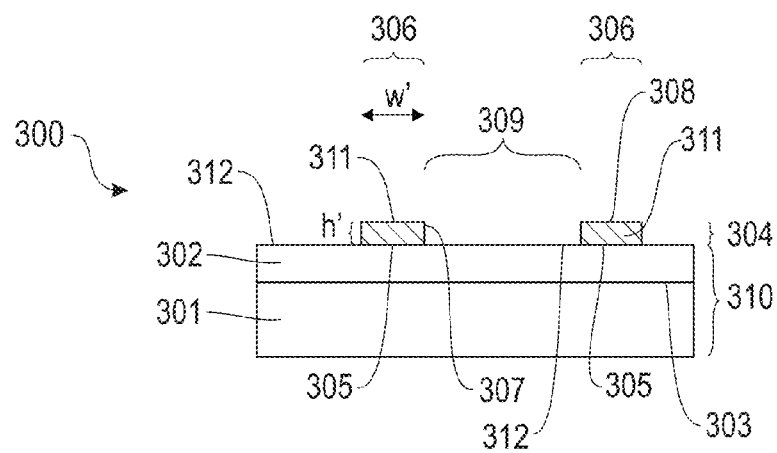
FIGS. 21A to 21E are cross-sectional layer diagrams showing a process of forming a perpendicularly oriented lamellar domain pattern using a chemical pre-pattern to direct self-assembly of the block copolymer. In this example, the pre-pattern features and air interface are non-neutral to the block copolymer (i.e., preferentially wetted by one block of the block copolymer), and the orientation control layer is neutral to the block copolymer.
Figure 21B:
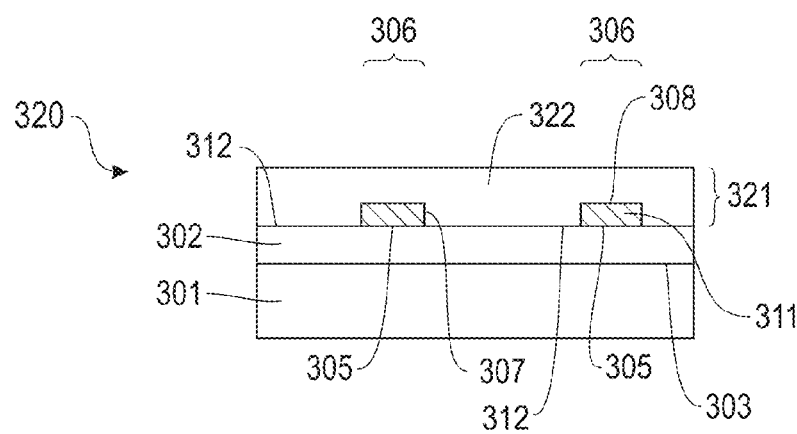
Figure 21C:
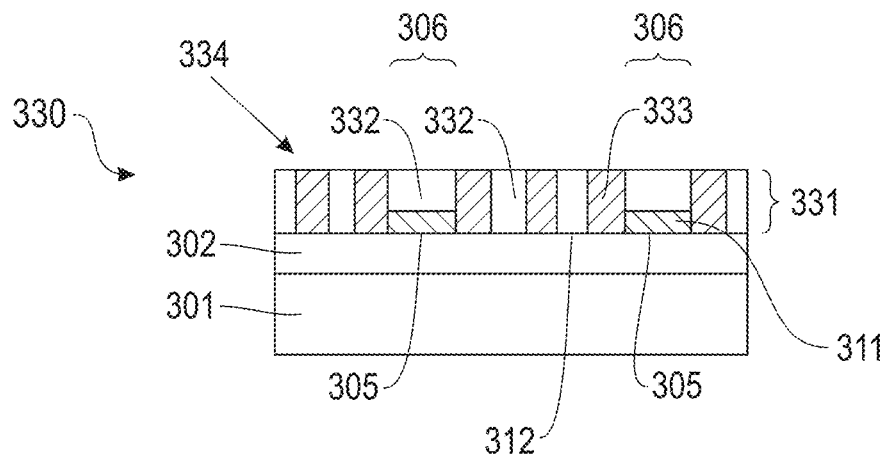

A coating mixture comprising the block copolymer, a suitable solvent, and any optional additives is applied to chemical pre-pattern 304 using any suitable technique (e.g., spin coating), thereby allocating the block polymer over trench areas 109 and top surfaces 308. Chemical pre-pattern 304 is insoluble in or substantially insoluble in the solvent used to prepare the coating mixture. Removal of the solvent from the applied coating mixture provides layered structure 320 comprising layer 321 (FIG. 21B). Layer 321 comprises block copolymer 322 disposed on surface 312 of trench areas 309 and on top surfaces 308 of features 306.

Self-assembly of the block copolymer results in layered structure 330 (FIG. 21C) comprising perpendicularly oriented lamellar domain pattern 331. Self-assembly can be spontaneous and/or assisted by a thermally treating (annealing) layer 321. Domain pattern 331 comprises features 306 and first lamellar domains 332 and second lamellar domains 333 disposed on surface 312 and surfaces 308 of features 306. Air interface 334 is indicated by the arrow. Preferably, the lateral dimension of features 306, first lamellar domains 332, and second lamellar domains 333 is about 0.5 Lo (i.e., the domain pattern preferably has a constant pitch).

Figure 21D:
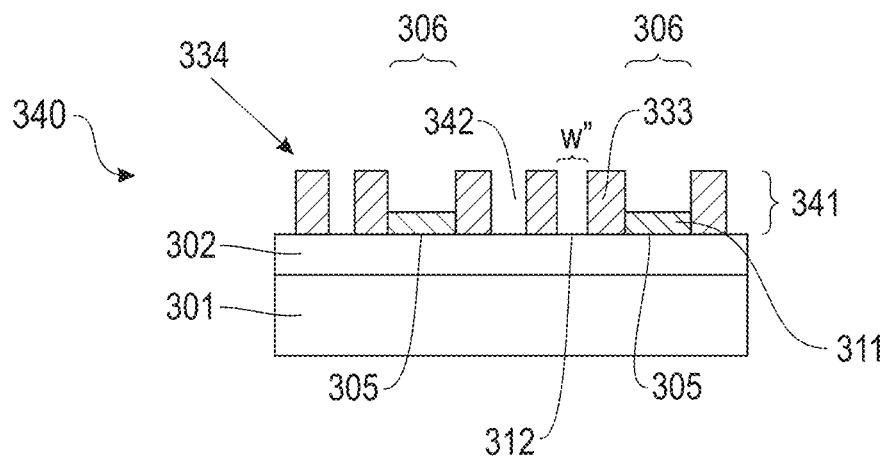

One of the domains, for example first domains 332, can be selectively removed (e.g., ion-etched) or modified in the presence of the second domains 333. Selective removal of one of the domains can also remove underlying orientation control material (not shown), producing layered structure 340 comprising relief pattern 341 (FIG. 21D). Relief pattern 341 comprises second domains 333 disposed on surface 312, openings 342, and features 306. Openings 342 can have a width w''' of about 0.5 Lo (e.g., about 2 nm to about 10 nm for a high-chi block copolymer). The selective removal process may be carried out by a thermal bake (for thermally decomposable materials), a reactive ion etch process, dissolution in a selective solvent, or a combination thereof. A chemical modification may be accomplished by a variety of known methods as discussed above. The selective removal process can further remove features 306 (not shown).

Figure 21E:
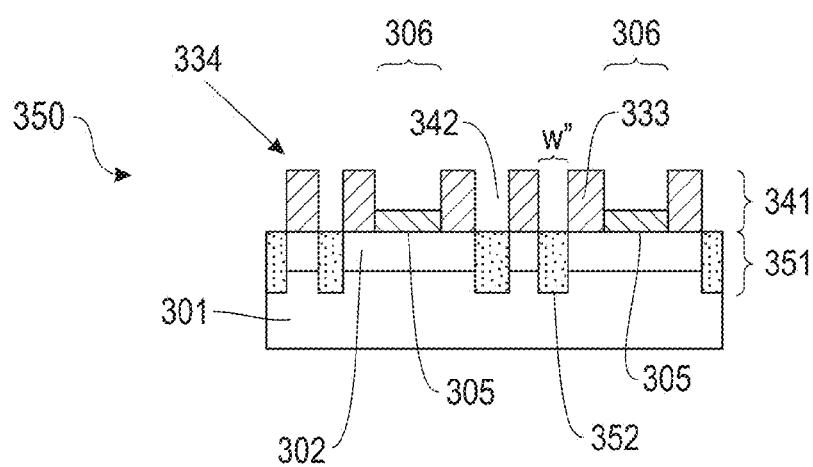

Finally, relief pattern 341 can be transferred to substrate 301, thereby forming layered structure 350 comprising patterned region 351 of substrate 301 (FIG. 21E). Patterned region 351 can be a pattern of lines, holes, pits, or a chemically altered state of the substrate material represented by altered areas 352. Patterned region 351 can extend into one or more layers of substrate 301, and include orientation control layer 302 (shown). The pattern transfer can be accomplished, for example, by using a reactive ion etch process. Features 306 and second lamellar domains 333 can be removed concomitant with or following formation of altered areas 352.

The substrate, and more particularly the surface of the substrate, can comprise inorganic or organic materials such as metals, carbon, or polymers. More particularly, the substrate can comprise a semiconducting material including, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein.

The substrate can have a top anti-reflection control layer (ARC layer) or a bottom ARC layer (BARC layer) to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

Auxiliary Polymers for Orientation Control and Topcoats

The orientation control layer and/or topcoat layer referred to above can include other polymers, referred to as auxiliary polymers.

The auxiliary polymers can comprise a hydroxyl group. These include hydroxyl-terminated polymers (e.g., hydroxyl-terminated poly(styrene-co-methyl methacrylate and blends of hydroxyl-terminated poly(styrene), hydroxyl-terminated poly(methyl methacrylate), and poly(styrene-b-methyl methacrylate)), hydroxyl-functionalized polymers (e.g., poly(styrene-co-methyl methacrylate-co-2-hydroxyethyl methacrylate)).

Other auxiliary polymers include materials comprising reactive groups, such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly(styrene-co-methyl methacrylate-co-vinyl benzocyclobutane), and poly(alpha-methyl styrene-co-methyl methacrylate)). The reactive polymers may react as a result of thermal or photochemical treatment either alone or in conjuction with an additional crosslinking agent. In particular, a catalytic species such as a strongly acidic species may be used to facilitate reaction. The strongly acidic species may be directly incorporated into a coating composition for an orientation control layer, which comprises a solvent and the disclosed random copolymer for prientation control material. Alternatively, a thermal acid generator or photoacid generator molecule may be used to generate an acidic species as a result of thermal or photochemical treatment, respectively.

Other non-limiting examples of auxiliary polymers for orientation control layers and topcoars include materials used in ARC layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (optical constants, surface energy). The polymer components can also contain a plurality of reactive sites distributed along the polymer for reaction with a crosslinking component. More specific materials used in ARC layers include polymers disclosed in US20090186294, including poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly(bisphenol AF)), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl end-capped poly(bisphenol A-co-epichlorohydrin), and silicon-containing anti-reflection coating A940 from Shin Etsu. Another more specific orientation control material described in U.S. Pat. No. 7,521,090 comprises poly(styrene-co-epoxydicyclopentadiene methacrylate) random copolymer, P(S-r-EDCPMA):

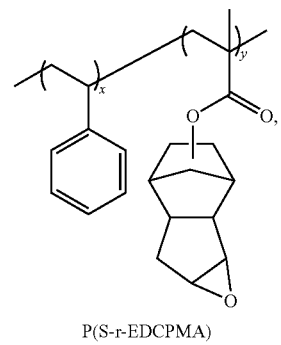

P(S-r-EDCPMA)

wherein x and y are each integers greater than 1. Other auxiliary polymers for orientation control layers include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinnamate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI). Other auxiliary polymers for orientation control layers and topcoats comprise polymer brush layers including those formed by hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing surface affinity materials. Other auxiliary polymers for orientation control layers and topcoats include other block copolymers capable of forming self-assembled monolayers.

The coating composition used to prepare the orientation control layer comprises at least a solvent and a disclosed random copolymer. The coating composition used to prepare the SA layer comprising a disclosed block copolymer comprises at least a solvent and a disclosed block copolymer. The foregoing compositions can additionally comprise other materials including surfactants, polymers, photoacid generators, and thermal acid generators. For example, an organosilicate resin can be included in the coating composition for an orientation control layer.

The polymer based orientation control layer, SA layer, and/or topcoat layer can be applied by any suitable method that is compatible with the processes and equipment used in microelectronics fabrication assembly lines. Exemplary non-limiting techniques include spin-coating, dip-coating, doctor blading, and spray coating.

Exemplary non-limiting casting solvents for preparing the above-described polymer base coating compositions include toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, and combinations of the foregoing solvents.

The random copolymer for orientation control has a weight average molecular weight (Mw) of 3,000 to 200,000 g/mol. Similarly, the random copolymer has a number average molecular weight (Mn) of 1,000 to 80,000. The random copolymer can also have a polydispersity (Mw/Mn) of 1.01 to about 3.0. Molecular weight, both Mw and Mn, can be determined by, for example, gel permeation chromatography (GPC) using a universal calibration method, calibrated to polystyrene standards.

The block copolymer for the directed self-assembly (SA material) has a weight-average molecular weight (Mw) of 3,000 to 200,000 g/mol. Similarly, the block copolymer has a number average molecular weight (Mn) of 1,000 to 80,000. The block copolymer can also have a polydispersity (Mw/Mn) of 1.01 to 3.

The morphology (e.g., shape, dimension, and orientation) of the self-assembled domains from block copolymer thin films is a function of block copolymer architecture (diblock, triblock, star polymer, bottlebrush block copolymer, miktoarm polymer, and others), composition (e.g., material, molecular weight, and volume ratio of different blocks), annealing conditions (e.g., temperature, environment, and annealing time), the interface properties (e.g., polymer-air interface and polymer substrate interface) as well as the defined geometry (e.g., film thickness and topography of the confinement). Therefore, by adjusting one or more parameters, the morphology can be adjusted to the need of specific applications.

Self-assembly of the block copolymer (i.e., phase separation and alignment of domains) can occur during film formation, during a post-application bake, or during a subsequent annealing process. Suitable annealing processes include thermal annealing, thermal gradient annealing, solvent vapor annealing or annealing by other gradient fields. More particularly, the SA layer comprising a block copolymer is thermally annealed at a temperature that is above the glass transition temperature ($T_g$) of the block copolymer but below the decomposition or degradation temperature ($T_d$) of the block copolymer. The thermal annealing step can be carried out at an annealing temperature of about 100° C. to about 300° C. The thermal annealing can be performed for a period of more than 0 hours to about 100 hours, and more particularly for about 1 hour to about 15 hours. The thermally annealed block copolymer self-assembles to form ordered domains whose orientation is preferably perpendicular to the underlying surface plane. In general, the SA layer can have a thickness of 100 to 10000 angstroms, more particularly 200 to 5000 angstroms, and even more particularly 300 to 3000 angstroms.

The difference in the etch rates between two ordered domain regions of the block copolymer allows the generation of additional patterns. Selectively removing by etching, solvent or other means, at least one self-assembled domain, creates a nano-scale relief pattern comprising, for example, a pattern of holes that can be transferred into the underlying substrate. Types of etching include any common etching applied in the manufacture of semiconductor devices, for example, dry-etching such as plasma etching, or wet-etching using selective solvents. Typically, dry etching processes are employed for etching at sub-50 nm dimensions. Prior to this pattern development/pattern transfer, the self-assembled layer of SA material can be optionally chemically modified to improve properties necessary for pattern transfer, such as etch resistance or mechanical properties.

The relief pattern of openings formed by selective removal of one of the domains can have a spatial frequency greater than that of a topographic and/or chemically patterned surface used to direct self-assembly of the block copolymer.

Etch resistant materials can be applied to a substrate surface, orientation control surface, surface of a resist feature, chemical pre-pattern, and/or a domain pattern of the block copolymer for control of relative etch rates. The etch-resistant material can be deposited from the vapor phase by a process including, chemical vapor deposition (CVD), plasma enhanced CVD, atomic layer deposition (ALD), sequential infiltration synthesis (SIS), sequential infiltration of metal salts, sputtering, thermal evaporation, electron beam evaporation, pulsed laser deposition, or other suitable deposition method that is compatible with the processes and equipment used in microelectronics fabrication.

Also disclosed is a film for orientation control comprising the random copolymer. Further disclosed is a layered structure comprising an SA layer comprising a self-assembled domain pattern of a disclosed block copolymer disposed on the film comprising the random copolymer. In an embodiment, the domain pattern comprises lamellar domains that are perpendicularly oriented relative to a surface of the film. In another embodiment, the layered structure is a semiconductor device.

The above-described processes can be used to form layered structures comprising metal wiring lines, holes for contacts or vias, insulation sections (e.g., damascene trenches or shallow trench isolation), and trenches for capacitor structures suitable for the design of integrated circuit devices. The method is especially useful in the context of creating patterned layers of oxides, nitrides or polysilicon.

The above-described methods advantageously allow self-assembled structures having reduced feature width and increased periodicity. The domain feature width can be from 1 to about 18 nm, from 5 to about 18 nm, or more particularly from 5 to 15 nm.

The following non-limiting examples are provided to further illustrate the disclosed polymers and their use in forming self-assembled layers.

EXAMPLES

Materials used in the following examples are listed in Table 1.

TABLE 1

| ABBREVIATION | DESCRIPTION | SUPPLIER |
|---|---|---|
| DBU | 1,8-Diazabicyclo[5,4,0]undec-7-ene | Sigma-Aldrich |
| BisMPA | Dimethylolpropionoic acid | Perstorp |
| BzOH | Benzyl alcohol | Sigma-Aldrich |
| DCM | Dichloromethane | Sigma-Aldrich |
| AcCh | Acetyl Chloride | Sigma-Aldrich |
| TEA | Triethylamine | Sigma-Aldrich |
| BriBr | α-Bromoisobutyryl bromide | Sigma-Aldrich |
| THF | Tetrahydrofuran | Sigma-Aldrich |
| MeOH | Methanol | Sigma-Aldrich |
| Sty | Styrene, MW 104.15 | Sigma-Aldrich |
| GMA | Glycidyl methacrylate, MW 142.2 | Sigma-Aldrich |
| GLY | Glycidol | Sigma-Aldrich |
| VBCl | Vinly Benzyl Chloride | Sigma-Aldrich |

TABLE 1-continued

| ABBRE-VIATION | DESCRIPTION | SUPPLIER |
|---|---|---|
| Tol | Toluene | Sigma-Aldrich |
| DPP | Diphenyl phosphate | Sigma-Aldrich |
| AIBN | Azobisisobutyronitrile | Sigma-Aldrich |
| EtG | Ethylene glycol | Sigma-Aldrich |
| AZPS-OH Mn = 4200 Mn = 6200 Mn = 10000 | Hydroxyl- end-functional polystyrene | AZ Electronic Materials |
| EtG | Ethylene glycol | Sigma-Aldrich |
| TMC | Trimethylene carbonate | Richman Chemicals |
| CuBr | Copper (I) bromide | Sigma-Aldrich |
| PMDETA | N,N,N'N',N"-pentamethyl-diethylenetriamine | Sigma-Aldrich |
| Anisole | Anisole | Sigma-Aldrich |
| Si Gel | Silica Gel | Sigma-Aldrich |
| EtiBr | Ethyl α-bromoisobutyrate | Sigma-Aldrich |
| HEMA | Hydroxyethyl methacrylate, MW 130.14 | Sigma-Aldrich |
| Lac | 3,6-Dimethyl-1,4-dioxane-2,5-dione | Sigma-Aldrich |
| Me6TREN | Tris[2-(dimethylamino)ethyl]amine | Sigma-Aldrich |
| PMMA-brush | AZ Electronics NLD-303; a solution containing hydroxy terminated poly(methyl methacrylate) brush polymer (PMMA-OH) whose hydroxyl (—OH) groups anchor the homopolymer brush to the silicon wafer surface during baking. | AZ Electronic Materials |

Herein, Mn is the number average molecular weight, Mw is the weight average molecular weight, and MW is the molecular weight of one molecule.

All solvents were of analytical grade, and used as received. Before transferring into the glove box, monomers and other reagents (e.g., initiator, monomer, etc.) were dried extensively by freeze-drying under high vacuum.

2-Hydroxyethyl 2-bromo-2-methylpropanoate (I-1), an atom transfer radical polymerization (ATRP) initiator, was prepared as previously reported by C. Koulic et al., Polymer, 2001, volume 42, number 7, pages 2947-2957.

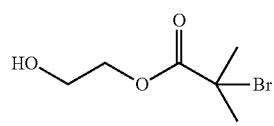

I-1

Vinyl benzyl alcohol (VBOH) was prepared as previously reported by Jackson, et al., Polymer Chemistry, 2011, volume 2, pages 2500-2511. The resulting crude product was distilled under vacuum at 90° C.

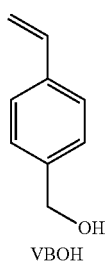

VBOH

Vinyl benzyl glycidyl ether (VBGE) was prepared as previously reported by Yasukawa, et al., J. Am. Chem. Soc. 2012, volume 134, pages 16963-16966.

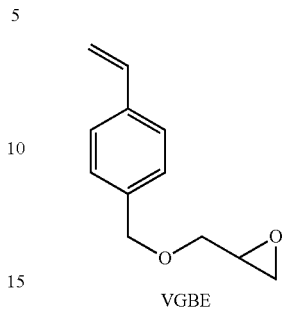

VGBE

Thiourea (TU) cocatalyst was synthesized as previous reported by Pratt, et al., Macromolecules 2006, volume 39, pages 7863-7871.

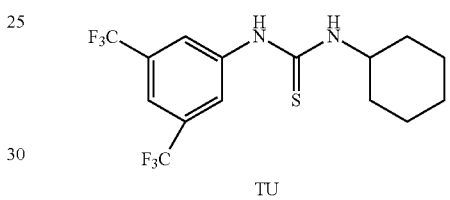

TU

Preparation of Orientation Control Material N3, P(Sty-r-MMA-r-GMA)

Poly(styrene-co-methyl methacrylate-co-glycidyl methacrylate) random copolymer, P(Sty-r-MMA-r-GMA), referred to as N3, was prepared using the procedure of U.S. Pat. No. 8,623,458 by free-radical polymerization of styrene, methyl methacrylate, and glycidyl methacrylate in a molar feed ratio of Sty:MMA:GMA 58:40:2. The isolated polymer composition as determined by $^{13}C$ NMR was Sty:MMA:GMA 58:40:2, Mn=12100, PDI: 1.59.

Preparation of Orientation Control Material N6, P(Sty-r-MMA-r-GMA)

Poly(styrene-co-methyl methacrylate-co-glycidyl methacrylate) random copolymer, P(Sty-r-MMA-r-GMA), referred to as N6, was prepared using the procedure of U.S. Pat. No. 8,623,458 by free-radical polymerization of styrene, methyl methacrylate, and glycidyl methacrylate in a molar feed ratio Sty:MMA:GMA 74:24:2. The isolated polymer composition as determined by $^{13}C$ NMR was Sty:MMA:GMA 70:28:2 (mole ratio), Mn=11600, PDI: 1.84.

Preparation of Orientation Control Material N22, P(Sty-r-MMA-r-GMA)

Poly(styrene-co-methyl methacrylate-co-glycidyl methacrylate) random copolymer, P(Sty-r-MMA-r-GMA), referred to as N22, was prepared using the procedure of U.S. Pat. No. 8,623,458 by free-radical polymerization of styrene, methyl methacrylate, and glycidyl methacrylate in a molar feed ratio Sty:MMA:GMA 28:70:2. The isolated polymer composition as determined by $^{13}C$ NMR was Sty:MMA:GMA 28:70:2 mole ratio, Mn=9500, PDI: 1.54.

Example 1

Synthesis of random copolymer P(Sty-r-HEMA-r-GMA), referred to as P-1, x:y:z=88:6:6 Mole Ratio.

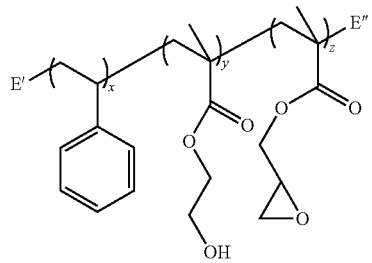

P-1

The P-1 end groups E' and E" are not shown. Styrene (Sty, 14.4 g, 138.0 mmol), hydroxy ethyl methacrylate (HEMA, 1.0 g, 7.68 mmol), glycidyl methacrylate (GMA, 1.09 g, 7.66 mmol), THF (50 g), and azobisisobutyronitrile (AIBN, 0.757 g, 4.61 mmol, 3 mol % based on total moles of vinyl monomers) were combined in a 250 ml round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in MeOH, and was dried under vacuum at 50° C. for 24 hours. Mn=6200, Mw=8700, PDI=1.40. The product Sty:HEMA:GMA x:y:z mole ratio was calculated by $^{13}$C inverse gated NMR as x:y:z=88:6:6 (mole ratio). Based on the Mn and the product monomer mole ratio, the degree of polymerization (DP) ratio of the repeat units was calculated to be x':y':z'=50.5:3.5:3.5 (Sty:HEMA:GMA, respectively).

Non-limiting end groups E' and/or E" include isobutyronitrile (NC—C(Me)$_2$-*) and hydrogen (H—*).

Example 2

Synthesis of random copolymer P(Sty-r-VBOH-r-VBGE), referred to as P-2, x:y:z=85:8:7 (mole ratio) by atom transfer radical polymerization (ATRP).

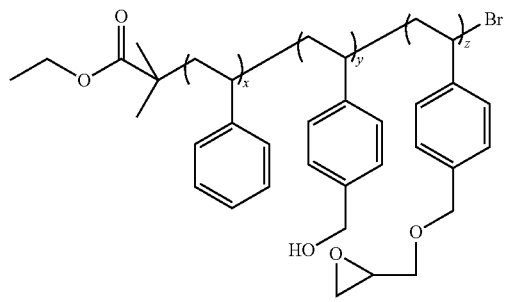

P-2

To a 100 ml Schlenk flask equipped with a magnetic stir-bar, styrene (15.0 g, 144.0 mmol), vinyl benzyl alcohol (VBOH, 1.81 g, 13.53 mmol), vinyl benzyl glycidyl ether (VBGE, 2.25 g, 11.83 mmol), anisole (20.0 g), CuBr (0.21 g, 0.845 mmol), and Ethyl α-bromoisobutyrate (EtiBr, 0.164 g, 0.854 mmol, MW=195.1) were added. The flask was sealed with a rubber septum and was purged by bubbling nitrogen for one hour. At this point, 0.146 g (0.854 mmol) of PMDETA was added and the reaction flask was placed in an oil-bath set at 110° C. for 150 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer was collected in a frit funnel and was dried under vacuum for 24 hours at 50° C. Mn=5700, Mw=6300, PDI=1.10. The product Sty:VBOH:VBGE x:y:z=85:8:7 (mole ratio) was calculated by $^1$H NMR. Based on the Mn and the mole ratio, the DP ratio Sty:VBOH:VBGE x':y':z' was 41.6:3.9:3.4 (DP ratio).

Example 3

Synthesis of TMC-functional random graft copolymer G1-1 from macroinitiator P-1 (Example 1, STY:HEMA:GMA x:y:z=88:6:6 (mole ratio), x':y':z'=50.5:3.5:3.5 (DP ratio)) for orientation control.

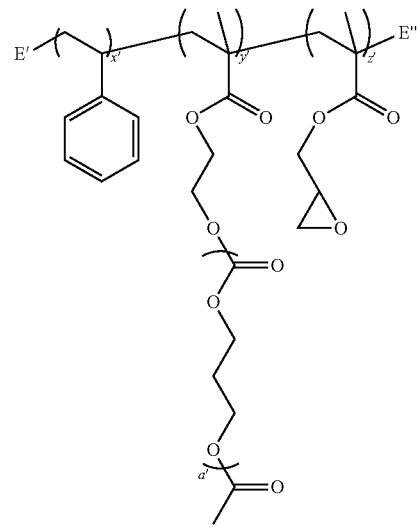

G1-1, x':(y'a') = 73:27 (Sty:TMC)

The quantity y'a' (i.e., the product of numbers y' and a', y'×a') represents the total average number of repeat units derived from TMC in random graft copolymer G1-1 (without correcting Mn for end groups E' and E").

P-1 (0.2 g, Example 1), trimethylene carbonate (TMC, 0.060 g, 0.588 mmol) and dichloromethane (DCM, 0.2 g) were added to an oven dried 4 ml glass vial equipped with a magnetic stir bar. The reaction mixture was stirred until the macroinitiator and TMC were completely dissolved in DCM, upon which 1,8-diazabicyclo[5.4.0]undec-7-ene (DBU, ~10 mg) was added. The reaction mixture was stirred at room temperature (rt) for 1 hour in a glove box. The reaction was stopped by bringing the reaction vial out of the glove box and by adding DCM (0.5 ml), triethylamine (TEA, 0.27 g, 2.72 mmol) and acetyl chloride (~60 mg, 0.764 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol for two more times. The solids were collected in a frit funnel and dried under vacuum at 40° C. for two hours to obtain random graft copolymer G1-1, where the Sty:TMC mole ratio x':y'a' =73:27 was determined by $^1$H NMR. The average value of a' was calculated as follows:

x'/y'=50.5/3.5 (DP ratio of the P-1 macroinitiator), x'/(y'a')=73/27 (Sty:TMC mole ratio of G1-1 by $^1$H NMR), rearranging, x'/y'=73a'/27 substituting, 50.5/3.5=73a'/27, and solving, a'=5.33.

Therefore, G1-1 has a side chain polycarbonate having an average number of carbonate repeat units a'=5.33, based on the Mn of G1-1.

Examples 4-13

Preparation of random graft copolymers G1-2 to G1-11 for orientation control. These polymers were prepared using the general procedure of Example 3 and macroinitiator P-1 of (Example 1) at various Sty:TMC (x':y'a') mole ratios. G1-2 to G1-11 differ from G1-1 by the x':y'a' mole ratio, summarized in Table 2.

The quantity y'c' (i.e., the product of numbers y' and c', y'×c') represents the total average number of repeat units derived from TMC in random graft copolymer G2-1.

Macroinitiator P-2 (0.1 g), TMC (0.10 g, 0.980 mmol), and DCM (0.4 g) were added to an oven dried 4 ml glass vial equipped with a magnetic stir bar. The reaction mixture was stirred until the macroinitiator and TMC were completely dissolved in DCM, upon which DBU (~10 mg) was added as the ring opening polymerization (ROP) catalyst. The reaction mixture was stirred at room temperature (rt) for 1.25 hours in a glove box. The reaction was stopped by bringing the reaction vial out of the glove box and by adding DCM (0.5 ml), TEA (0.27 g, 2.72 mmol), and acetyl chloride (~60 mg, 0.764 mmol). The reaction was further stirred for two hours at room temperature. The resulting polymer was

TABLE 2

| Ex. | Random Graft Polymer Name | TMC (g) | DCM (g) | DBU (mg) | P-1 Initiator (g) | Temp | Time (hours) | GPC Mn (kDa) | Mw (kDa) | PDI | Sty:TMC Mole Ratio[a] | $a'^{b}$ | Monomer % Conversion. |
|---|---|---|---|---|---|---|---|---|---|---|---|---|---|
| 3 | G1-1 | 0.06 | 0.2 | ~10 | 0.2 | rt | 1 | — | — | — | 73:27 | 5.3 | >99 |
| 4 | G1-2 | 0.1 | 0.32 | ~10 | 0.2 | rt | 1.5 | — | — | — | 60:40 | 9.6 | >99 |
| 5 | G1-3 | 0.46 | 1.50 | ~10 | 0.2 | rt | 2 | 23.6 | 44.0 | 1.87 | 24:76 | 45.7 | >99 |
| 6 | G1-4 | 0.035 | 0.52 | ~10 | 0.2 | rt | 0.45 | — | — | — | 88:12 | 2.0 | >99 |
| 7 | G1-5 | 0.06 | 0.37 | ~13 | 0.2 | rt | 1 | 9.3 | 13.5 | 1.44 | 73:27 | 5.3 | >99 |
| 8 | G1-6 | 0.1 | 0.45 | ~10 | 0.2 | rt | 1.5 | 11.4 | 18 | 1.57 | 59:41 | 10.0 | >99 |
| 9 | G1-7 | 0.06 | 0.72 | ~10 | 0.2 | rt | 1 | — | — | — | 73:27 | 5.3 | >99 |
| 10 | G1-8 | 0.1 | 0.9 | ~10 | 0.2 | rt | 1.4 | — | — | — | 66:34 | 7.4 | ~90 |
| 11 | G1-9 | 0.15 | 0.9 | ~16 | 0.2 | rt | 1 | 12.1 | 15.9 | 1.31 | 62:38 | 8.8 | ~50 |
| 12 | G1-10 | 0.15 | 0.9 | ~14 | 0.2 | rt | 0.75 | — | — | — | 62:38 | 8.8 | ~50 |
| 13 | G1-11 | 0.15 | 0.9 | ~14 | 0.2 | rt | 1.4 | — | — | — | 43:57 | 19.1 | ~65 |

[a]Sty:TMC mole ratio = x':(y'a') as determined by NMR
[b]a' is based on Mn of the random graft copolymer Example 14

Synthesis of TMC-functional random graft copolymer G2-1 using macroinitiator P-2 (Example 2, Sty:VBOH: VBGE x:y:z=144:13.5:11.8 (mole ratio, feed), x':y':z'=41.6: 3.9:3.4 (DP ratio)) for orientation control.

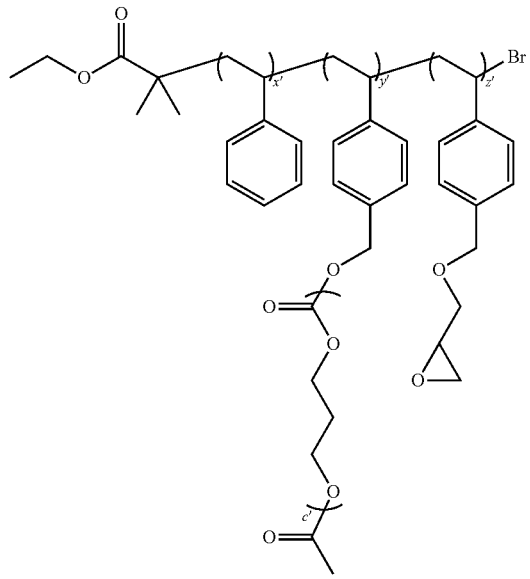

G2-1, x':(y'c') = 47:53 (Sty:TMC)

isolated by precipitating the reaction mixture in methanol. The product was collected in a frit funnel by removing methanol under vacuum and the resulting solids were redissolved in THF to form a 20 wt % solution and reprecipitated twice in methanol. The solids were collected in a frit funnel and dried under vacuum at 40° C. for two hours to obtain G2-1. The Sty:TMC mole ratio x':y'c'=47:53 was determined by $^1$H NMR. The average value of c' was calculated as follows:

x'/y'=41.6/3.9 (DP ratio of the P-2 macroinitiator), x'/(y'c')=47/53 (Sty:TMC mole ratio of G2-1 by $^1$H NMR), rearranging, x'/y'=47c'/53 substituting, 41.6/3.9=47c'/53, and solving, c'=12.0.

Therefore, G2-1 has a side chain polycarbonate having an average of c'=12.0 carbonate repeat units.

Example 15

Preparation of random graft copolymer G2-2 for orientation control. Random graft copolymer G2-2 was prepared using the general procedure of Example 14 from macroinitiator P-2 (Example 2). The Sty:TMC mole ratio was x':y'c'=33:67, and c' was calculated to be 21.6.

Table 3 summarizes the preparations of G2-1 and G2-2.

TABLE 3

| Ex. | Random Graft Polymer Name | TMC (g) | DCM (g) | DBU (mg) | P-2 Initiator (g) | Temp | Time (hours) | Sty:TMC Ratio[a] | c'[b] | Monomer % Conversion |
|---|---|---|---|---|---|---|---|---|---|---|
| 14 | G2-1 | 0.10 | 0.40 | ~10 | 0.10 | rt | 1.25 | 47:53 | 12.0 | <60 |
| 15 | G2-2 | 0.20 | 0.60 | ~10 | 0.10 | rt | 2.0 | 33:67 | 21.6 | <60 |

[a]Sty:TMC mole ratio = x':(y'c') as determined by NMR
[b]c' is based on Mn of the random graft copolymer

Example 16

Synthesis of lactide-functional graft polymer G3-1 using macroinitiator P-1 (Example 1, STY:HEMA:GMA x:y:z=88:6:6 (mole ratio), x':y':z'=50.5:3.5:3.5 (DP ratio)) for orientation control.

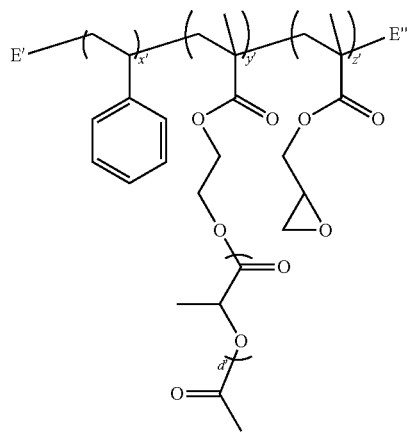

G3-1, x':(y'd') = 36:64 (Sty:Lac)

The quantity y'd' (i.e., the product of numbers y' and d', y'×d') represents the total average number of repeat units derived from lactide (Lac) in random graft copolymer G3-1.

To an oven dried 4 ml glass vial equipped with a magnetic stir bar, macroinitiator P-1 (0.2 g), lactide (Lac, 0.4 g, 2.77 mmol), DCM (2.1 g) and of thiourea cocatalyst TU (50 mg, 0.135 mmol) were added. The reaction mixture was stirred until the macroinitiator, Lac and TU were completely dissolved in DCM, upon which tris[2-(dimethylamino)ethyl] amine (M6TREN, 30 mg) was added as ring opening polymerization (ROP) catalyst. The reaction mixture was stirred at room temperature for 2.5 hours in a glove box. The reaction was stopped by bringing the reaction vial out of the glove box and by adding 0.5 ml of DCM, 0.27 g (02.72 mmol) of TEA and ~60 mg (0.764 mmol) of acetyl chloride. The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol for two more times. The solids were collected in a frit funnel and dried under vacuum at 40° C. for two hours to obtain the resulting polymer G3-1. The Sty:Lac mole ratio x':y'd'=36:64 was determined by $^1$H NMR. The average value of d' was calculated as follows:

x'/y'=50.5/3.5 (DP ratio of the P-1 macroinitiator),
x'/(y'd')=36:64, (Sty:Lac mole ratio of G3-1 by $^1$H NMR)
rearranging, x'/y'=36d'/64,
substituting, 50.5/3.5=36d'/64, and
solving, d'=25.6.

Therefore, G3-1 has a side chain polylactide having an average of d'=25.6 lactide repeat units.

Example 17

Preparation of random graft copolymer G3-2 for orientation control. Random graft copolymer G3-2 was prepared using the general procedure of Example 16 from macroinitiator P-1 (Example 1), and had a Sty:Lac mole ratio x':y'd'=72:28 by $^1$H NMR, and d'=5.6.

Table 4 summarizes the preparations of G3-1 and G3-2.

TABLE 4

| Ex. | Random Graft Polymer Name | Lactide (g) | DCM (g) | M6TREN (mg) | TU (mg) | P-1 Initiator (g) | Temp | Time (hours) | Sty:Lac Ratio[a] | d'[b] |
|---|---|---|---|---|---|---|---|---|---|---|
| 16 | G3-1 | 0.40 | 2.1 | ~30 | 50 | 0.20 | rt | 2.5 | 36:64 | 25.6 |
| 17 | G3-2 | 0.10 | 1.0 | ~30 | 50 | 0.20 | rt | 0.75 | 72:28 | 5.6 |

[a]Sty:Lac mole ratio = x':(y'd') as determined by NMR
[b]d' is based on Mn of the random graft copolymer

Example 18

Synthesis of block polymer BCP-1 for self-assembly, also referred to as PS-b-PTMC, where PS=polystyrene block, Mn=6200, x'=57 (DP) and PTMC is the poly(trimethylene carbonate) block, Mn=8400, b'=82 (DP).

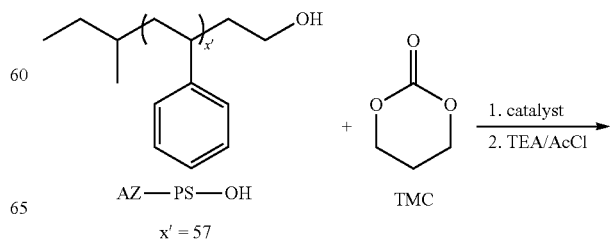

x' = 57

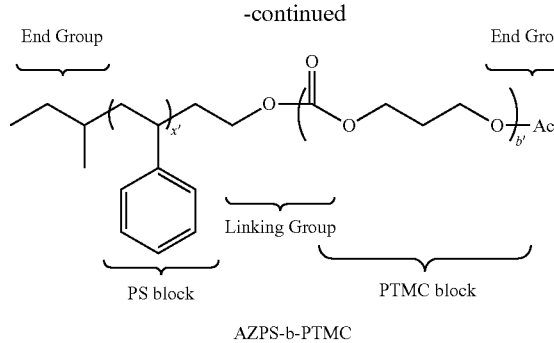

AZPS-b-PTMC
BCP-1, x':b' = 57:82 (DP ratio)

Hydroxy-terminated polystyrene macroinitiator (AZPS-OH, 0.70 g, 0.113 mmol, Mn=6200, PDI=1.02, obtained from AZ-Electronic Materials, Branchburg, N.J.), TMC (1.76 g, 17.25 mmol) and DCM (2.94 ml) were added to an oven dried 20 ml round bottom flask equipped with a magnetic stir bar. The reaction mixture was stirred until the AZPS-OH macroinitiator and TMC were completely dissolved in DCM, upon which ring opening polymerization catalyst diphenylphosphate DPP (400 mg, 1.6 mmol) was added. The reaction mixture was stirred at room temperature for 22.5 hours in a glove box. The reaction was cooled at 0° C. using an ice-water bath. The reaction was stopped by adding DCM (6 ml), TEA (0.7 ml, 02.72 mmol) and acetyl chloride (0.25 ml, 3.52 mmol). The reaction was further stirred for two hours at room temperature. The product block polymer was isolated by precipitating the reaction mixture in methanol. The product was collected in a frit funnel by removing methanol under vacuum. The resulting solids were redissolved in THF to form a 20 wt % solution and reprecipitated in methanol. The solid was collected in a frit funnel and dried under vacuum at 40° C. for two hours to obtain block copolymer BCP-1. Mn (GPC)=19300, Mw=19800, PDI=1.029. The PS block had Mn=6200 (by NMR) and degree of polymerization (DP)=57.4. The PTMC block had Mn=8500 and DP=83, indicating 50% conversion of TMC. The crude BCP-1 was further fractionated to remove any unreacted homopolymer of TMC. Crude BCP-1 (0.2 g) was dissolved in THF to form a 20 wt % solution and precipitated in methanol:acetonitrile (200 ml, 60:40 v/v). The precipitated solid and solvent were centrifuged at 4000 RPM at 0° C. followed by decanting the solvent and drying the isolated solids in a vacuum oven at 40° C. for two hours. BCP-1 Mn (GPC)=19,300, Mw=19,900, PDI=1.03. Mn (NMR): PS block (Mn 6200, DP 57), PTMC block (Mn 8400, DP 82), x':b'=57:82 (DP ratio). BCP-1 had a Sty:TMC mole ratio=41:59 based on Mn=14600 (NMR). BCP-1 had a PS block:PTMC block weight ratio of 42:58 based on Mn=14600 (NMR).

Example 19

Synthesis of block copolymer BCP-2 (PS-b-PLA) for self-assembly, where the PS block Mn=10000, x'=95 (DP), and the poly(lactide) (PLA) block Mn=11400, e'=79 (DP).

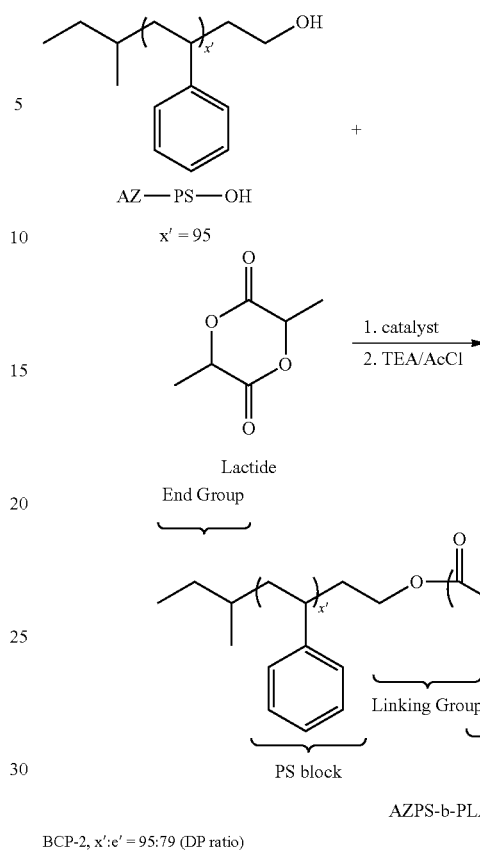

AZPS-b-PLA
BCP-2, x':e' = 95:79 (DP ratio)

To an oven dried 4 ml glass vial equipped with a magnetic stir bar, AZPS-OH (0.2 g, 0.02 mmol, Mn=10000, PDI=1.03, obtained from AZ-Electronic Materials, Branchburg, N.J.), Lac (0.254 g, 1.76 mmol), DCM (2.34 ml) and TU (37 mg, 0.1 mmol) were added. The reaction mixture was stirred until the AZ-PS-OH macroinitiator, Lac and TU were completely dissolved in DCM, upon which M6TREN (23 mg, 0.1 mmol) was added. The reaction mixture was stirred at room temperature for 1.5 hours in a glove box. The reaction vial brought out of the glove box and cooled at 0° C. by immersing it in an ice-water bath. The reaction was stopped by adding DCM (1 ml), TEA (0.1 ml, 1.35 mmol) and acetyl chloride (0.25 ml, 3.52 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. BCP-2 Mn (GPC)=29500, Mw=31100, PDI=1.05; Mn (NMR): polystyrene (PS) block Mn=10,000, x'=95 (DP), poly(lactides) (PLA) block Mn=11400, e'=79 (DP). BCP-2 was not fractionated to remove homopolymer. The Sty:Lac mole ratio of BCP-2 was 55:45 based on Mn=21400 (NMR). The PS block:PLA block weight ratio of BCP-2 was 47:53 based on Mn=21400 (NMR).

Underlayer and Composite Layer Film Preparations

Examples 20-24

Thin film preparation of underlayers (ULs) with random graft copolymers G1-2, G1-3, G1-7, G1-8 and G1-10 (see above Table 2).

The following general procedure was used to prepare a thin film underlayer on a silicon wafer. A solution was prepared by dissolving the random graft copolymer (95 parts by weight) and p nitro benzylsulphonic acid triflate salt (p-NBT, 5 parts by weight) in propylene glycol monomethyl ether acetate (PGMEA, 10,000 parts by weight) to form a 1.0 wt % solution based on total dry solids. p-NBT is a thermal acid generator and was added to promote the grafting and partial crosslinking of a thin film of the random graft copolymer on the silicon wafer substrate when baked (annealed). The solutions were passed through a 0.2 mm polytetrafluoroethylene (PTFE) filter prior to spin coating the solution on a silicon wafer at 2000 rpm spin rate. After forming the thin film, the coated wafer was baked at 190° C. for 3 minutes and cooled to room temperature. The initial baked thin film (underlayer) had a thickness of 20 nm, measured with a Nanospec Reflectometer. The underlayer was then given a solvent rinse by casting PGMEA on top of the coated wafer, letting the solvent puddle for 30 seconds, and spin drying the treated wafer at 2000 rpm for 30 seconds. The rinse was intended to remove any excess random graft copolymer that was not crosslinked or grafted to the wafer surface. The final film thickness of the underlayer was 10 nm after the solvent rinse. Table 5 summarizes the underlayers (ULs) prepared in this study.

TABLE 5

| Example | UL Name | Random Copolymer | Sty:TMC mole ratio[a] | (x') | DP[b] (y') | (a') |
|---|---|---|---|---|---|---|
| 20 | UL-1 | G1-3 | 24:76 | 50.5 | 3.5 | 45.7 |
| 21 | UL-2 | G1-2 | 60:40 | 50.5 | 3.5 | 9.6 |
| 22 | UL-3 | G1-10 | 62:38 | 50.5 | 3.5 | 8.8 |
| 23 | UL-4 | G1-8 | 66:34 | 50.5 | 3.5 | 7.4 |
| 24 | UL-5 | G1-7 | 73:27 | 50.5 | 3.5 | 5.3 |

[a]Sty:TMC mole ratio = x':(y'a') as determined by NMR
[b]a' is based on Mn of the random graft copolymer Examples 25-29

Thin film preparation and self-assembly of block copolymer BCP-1 (PS-b-PTMC, Example 18) on various underlayers of Table 5.

BCP-1 (Example 18, PS block Mn 6200, PTMC block Mn 8400) has a TMC volume fraction of 0.52. This block copolymer represents a lamellae forming block copolymer. A solution was prepared by dissolving BCP-1 in PGMEA at a concentration of 1.2 wt % based on total weight of the solution. The solution was filtered using a 0.2 micrometer PTFE filter and was spin coated at 2000 rpm rate on each of the underlayer films of Examples 20-24. The resulting composite film layers containing the BCP-1 film layer on the different underlayers were subsequently annealed at 140° C. for 5 minutes and immediately cooled to room temperature. The resulting self-assembled BCP-1 film thickness was about 23 nm, as measured using a Nanospec Reflectometer. The BCP-1 films were also characterized by atomic force microscopy (AFM) using a Digital Instruments 3100 AFM with a 1 N/m spring constant silicon nitride cantilever operated in a tapping mode. Scan size and speed were set at 2 μm×2 μm (μm=micrometer or micron) area and 1 Hz respectively. Experimental details of each of the composite layers are summarized in Table 6.

TABLE 6

| Example | Composite Layer Name | UL | BCP Name | Step height (nm) | Wetting of BCP domains UL surface | Air Interface | Neutral UL? (Y/N) |
|---|---|---|---|---|---|---|---|
| 25 | CL-1 | UL-1 | BCP-1 | 18.6 | PTMC | PS | N |
| 26 | CL-2 | UL-2 | BCP-1 | 9.3 | PS & PTMC | PS | Y |
| 27 | CL-3 | UL-3 | BCP-1 | 10 | PS & PTMC | PS | Y |
| 28 | CL-4 | UL-4 | BCP-1 | 10 | PS & PTMC | PS | Y |
| 29 | CL-5 | UL-5 | BCP-1 | 18.6 | PS | PS | N |

Self-assembled BCP-1 has a single, highly preferential air-polymer interface, where the PS block always wets the air interface owing to its low interfacial energy to air. Hence, the air-polymer interface is non-neutral with respect to self-assembled BCP-1 (i.e., the air interface is preferential to the PS block). This results in parallel orientation relative to the wafer surface of the BCP-1 lamellae (domains) under each of the test conditions. The AFM characterization shows that self-assembly of BCP-1 forms island-hole morphologies having step heights of 1.0 Lo (18.6 nm) or 0.5 Lo (9.3 nm) vertical height/depth depending on the composition of the underlayer (orientation control layer). Lo refers to the bulk periodicity of the lamellae. Composite films in which the self-assembled BCP-1 layer has a vertical depth and height of about 19 nm correspond to a spacing period of about 1.0 Lo.

Underlayer UL-1 (formed with random copolymer G1-3 (Example 5) having Sty:TMC mole ratio of 24:76 represents a TMC-philic UL surface. The self-assembled BCP-1 layer morphology on UL-1 (CL-1, Example 25) showed deep holes of 1.0 Lo (~18.6 nm) corresponding to 'classical' asymmetric wetting phenomenon (FIG. 1, AFM image). That is, the UL surface was preferential to the PTMC domain of BCP-1, and the air interface was preferential to the PS domain of BCP-1). Underlayer UL-1 is also a non-neutral composition for the block copolymer BCP-1 based on the underlayer being preferential to the PTMC domain.

Figure 2:
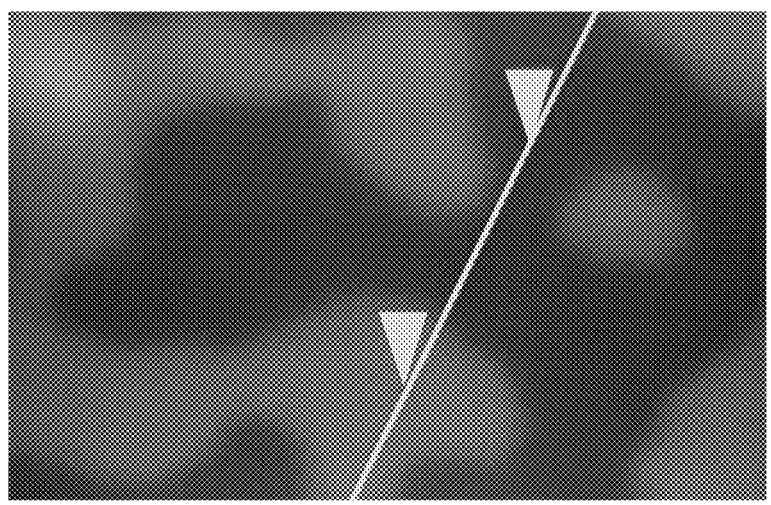
FIG. 2 is an AFM image of the self-assembled BCP-1 thin-film of composite layer CL-2 (Example 26). The AFM analysis indicates a step height of 9.3 nm (~0.5 Lo). This indicates that underlayer UL-2 (Example 21) formed with random copolymer G1-2 (Example 4) is a neutral underlayer composition for the self-assembled domains of block copolymer BCP-1 (Example 18).
Figure 3:
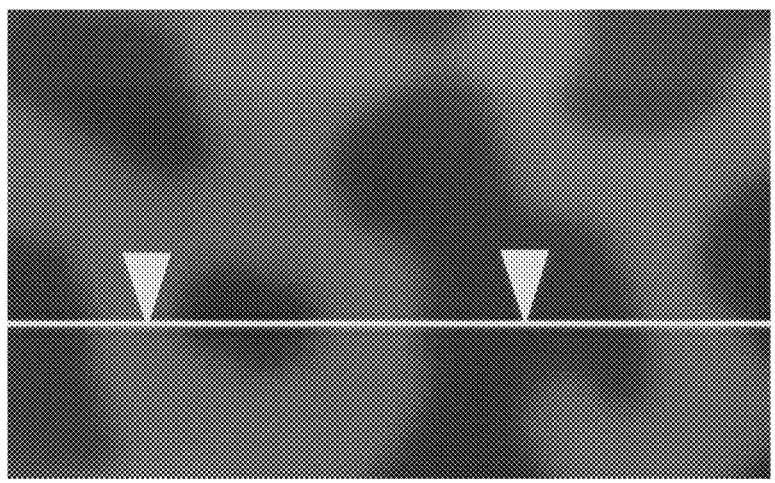
FIG. 3 is an AFM image of the self-assembled BCP-1 thin-film of composite layer CL-3 (Example 27). The AFM analysis indicates a step height of 10 nm (~0.5 Lo). This indicates that underlayer UL-3 (Example 22) formed with random copolymer G1-10 (Example 12) is a neutral underlayer composition for the self-assembled domains of block copolymer BCP-1 (Example 18).
Figure 4:
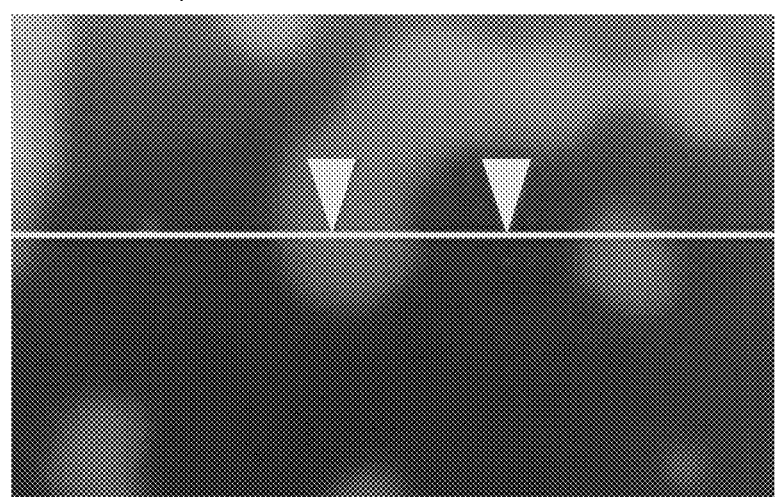
FIG. 4 is an AFM image of the self-assembled BCP-1 thin-film of composite layer CL-4 (Example 28). The AFM analysis indicates a step height of 10 nm (~0.5 Lo). This indicates that underlayer UL-4 (Example 23) formed with random copolymer G1-8 (Example 10) is a neutral underlayer composition for the self-assembled domains of block copolymer BCP-1 (Example 18).

UL-2 to UL-4 formed with G1-2 (Example 4), G1-10 (Example 12) and G1-8 (Example 10) having Sty:TMC mole ratios of 60:40, 62:38, and 66:34, respectively, respectively, were neutral to BCP-1 (wet by both the PS and PTMC domains). The self-assembled BCP-1 layer morphologies on these underlayers (composite layers CL-2 to CL-4) were islands having step heights of 0.5 Lo, indicating the neutral wetting preference of the UL surface (FIG. 2 to FIG. 4, AFM images). This observation is in accordance with a recent study by Kim, et. al., ACS Nano, 2013, volume 7, number 11, pages 9905-9919, which demonstrated formation of surface topography ("islands" and "holes") with 0.5 Lo step heights of self-assembled block copolymers having only one neutral interface.

Figure 5:
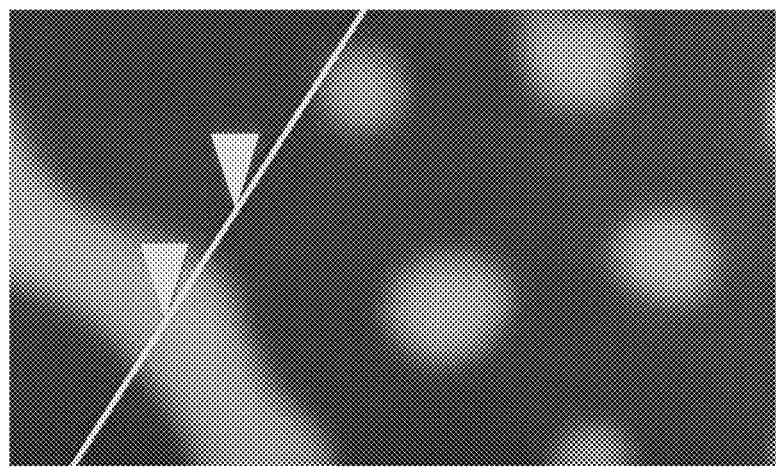
FIG. 5 is an AFM image of the self-assembled BCP-1 thin-film of composite layer CL-5 (Example 29). The AFM analysis indicates a step height of 18.6 nm (~1.0 Lo). This indicates that underlayer UL-5 (Example 24) formed with random copolymer G1-7 (Example 9) is a non-neutral underlayer composition for the self-assembled domains of block copolymer BCP-1 (Example 18).
Figure 6:
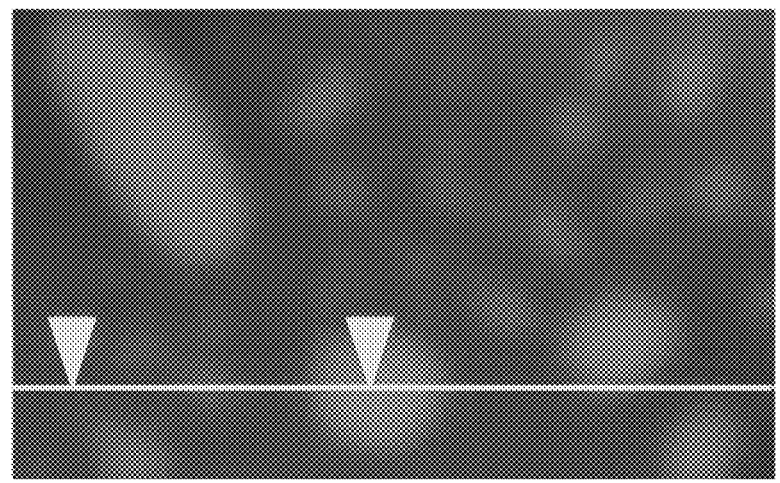
FIG. 6 is an AFM image of the self-assembled BCP-1 thin-film of composite layer CL-6 (Example 35, comparative). The AFM analysis indicates a step height of 18.5 nm (~1.0 Lo). The results indicate UL-6 is a non-neutral underlayer composition for the self-assembled domains of block copolymer BCP-1 (Example 18). UL-6 (Example 30, comparative) was prepared with a hydroxy terminated homo-poly(methyl methacrylate) brush polymer (PMMA-OH) that was grafted to the wafer substrate (Table 7, MMA=100%, AZ Electronics NLD-303).
Figure 7:
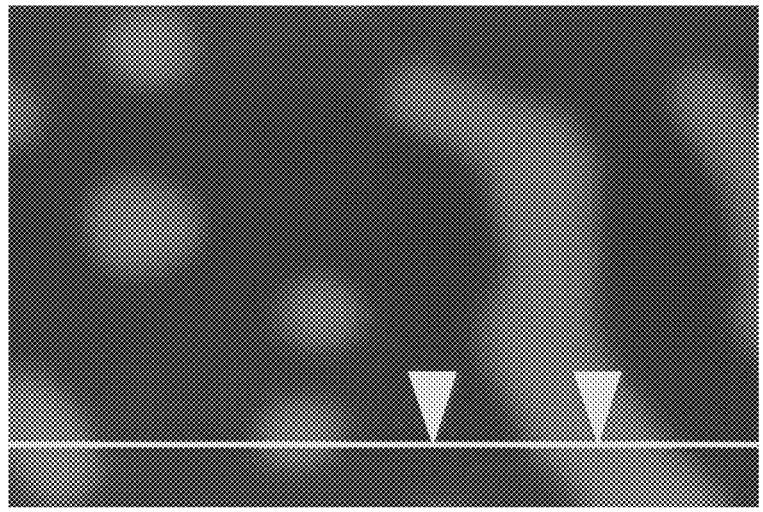
FIG. 7 is an AFM image of the self-assembled BCP-1 thin-film of composite layer CL-7 (Example 36, comparative). The AFM analysis shows a step height of 18.5 nm (~1.0 Lo). This indicates that underlayer UL-7 (Example 31, comparative) formed with random copolymer N22 (Table 7, Sty:MMA:GMA=28:70:2 mole ratio), is a non-neutral underlayer composition for the self-assembled domains of block copolymer BCP-1 (Example 18).
Figure 8:
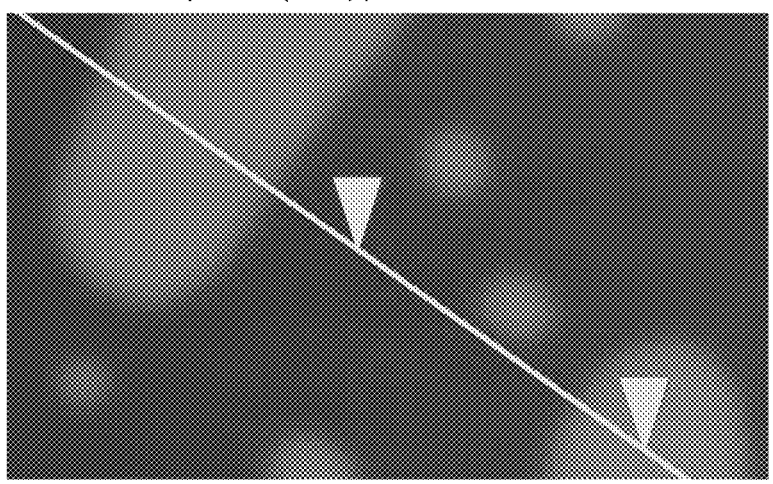
FIG. 8 is an AFM image of the self-assembled BCP-1 thin-film of composite layer CL-8 (Example 37, comparative). The AFM analysis indicates a step height of 18.5 nm (~1.0 Lo). This indicates that underlayer UL-8 (Example 32, comparative) formed with random copolymer N3 (Table 7, Sty:MMA:GMA=58:40:2 mole ratio) is a non-neutral underlayer composition for the self-assembled domains of block copolymer BCP-1 (Example 18).
Figure 9:
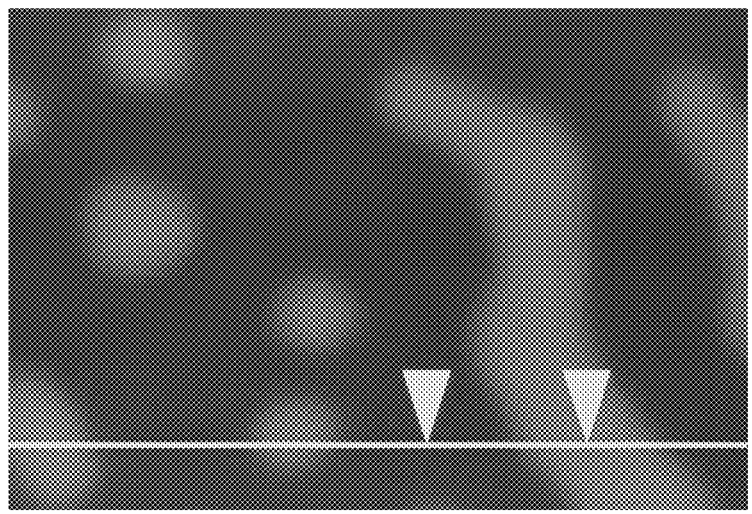
FIG. 9 is an AFM image of the self-assembled BCP-1 thin-film of composite layer CL-9 (Example 38, comparative). The AFM analysis indicates a step height of 18.5 nm (~1.0 Lo). This indicates that underlayer UL-9 (Example 33, comparative) formed with random copolymer blend (Table 7, Sty:MMA:GMA=66:32:2 mole ratio) is a non-neutral underlayer composition for the self-assembled domains of block copolymer BCP-1 (Example 18).
Figure 10:
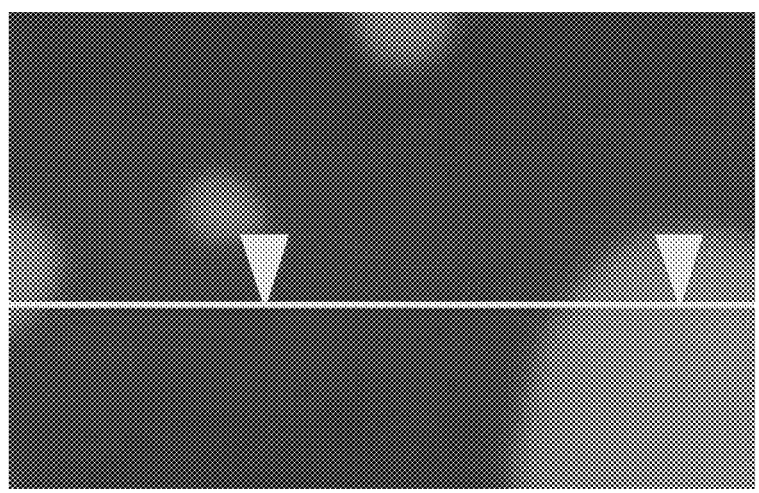
FIG. 10 is an AFM image of the self-assembled BCP-1 thin-film of composite layer CL-10 (Example 39, comparative). The AFM analysis indicates a step height of 18.5 nm (~1.0 Lo). This indicates that underlayer UL-10 (Example 34, comparative) formed with random copolymer N6 (Table 7, Sty:MMA:GMA=74:24:2 mole ratio) is a non-neutral underlayer composition for the self-assembled domains of block copolymer BCP-1 (Example 18).
Figure 11:
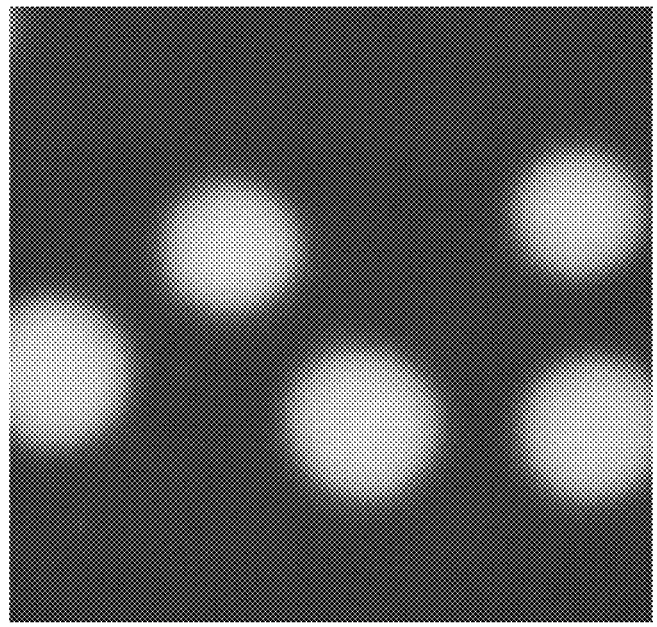
FIG. 11 is an AFM image of the self-assembled BCP-2 thin-film of composite layer CL-11 (Example 45, comparative). The AFM analysis indicates a step height of 20.0 nm (~1.0 Lo). This indicates that underlayer UL-11 (Example 40, comparative) formed with random copolymer G3-1 (Example 16) is a non-neutral underlayer composition for the self-assembled domains of block copolymer BCP-2 (Example 19).
Figure 12:
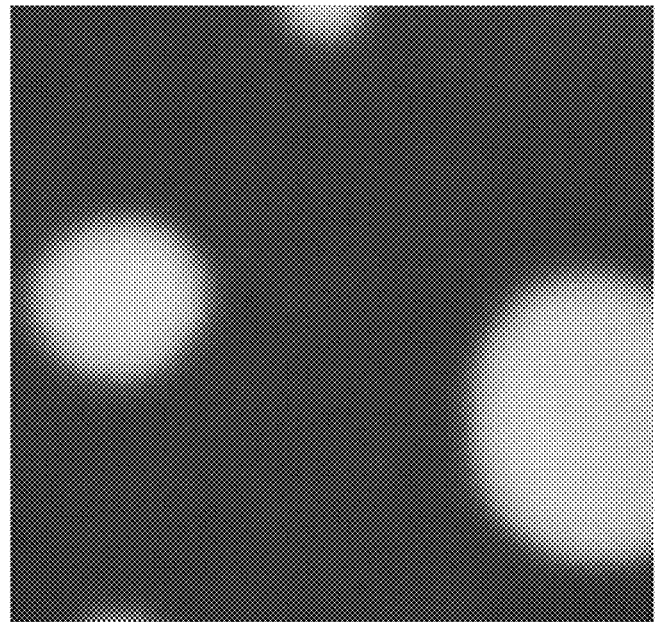
FIG. 12 is an AFM image of the self-assembled BCP-2 thin-film of composite layer CL-12 (Example 46, comparative). The AFM analysis indicates a step height of 20.0 nm (~1.0 Lo). This indicates that underlayer UL-12 (Example 41, comparative) formed with a blend of random copolymer G3-1 (Example 16) and G3-2 (Example 17, 50/50 w/w) is a non-neutral underlayer composition for the self-assembled domains of block copolymer BCP-2 (Example 19).
Figure 13:
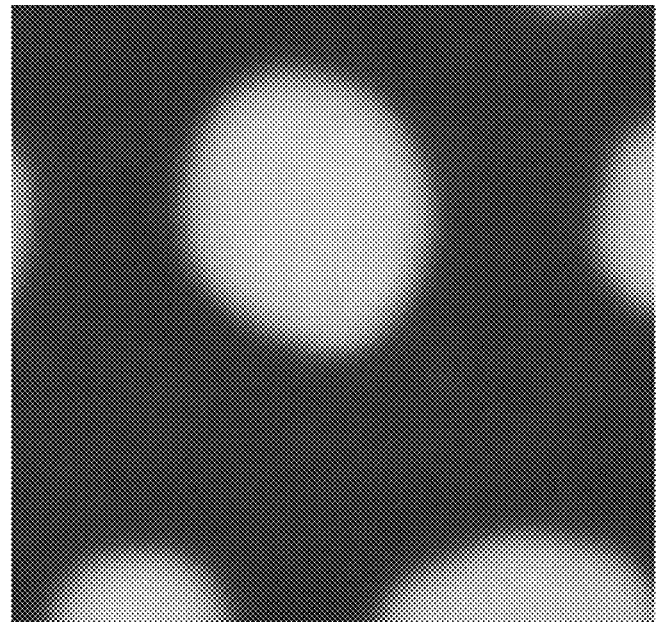
FIG. 13 is an AFM image of the self-assembled BCP-2 thin-film of composite layer CL-13 (Example 47, comparative). The AFM analysis indicates a step height of 20.0 nm (~1.0 Lo). This indicates that underlayer UL-13 (Example 42, comparative) formed with a blend of random copolymer G3-1 (Example 16) and G3-2 (Example 17), 30/70 w/w, is a non-neutral underlayer composition for the self-assembled domains of block copolymer BCP-2 (Example 19).
Figure 14:
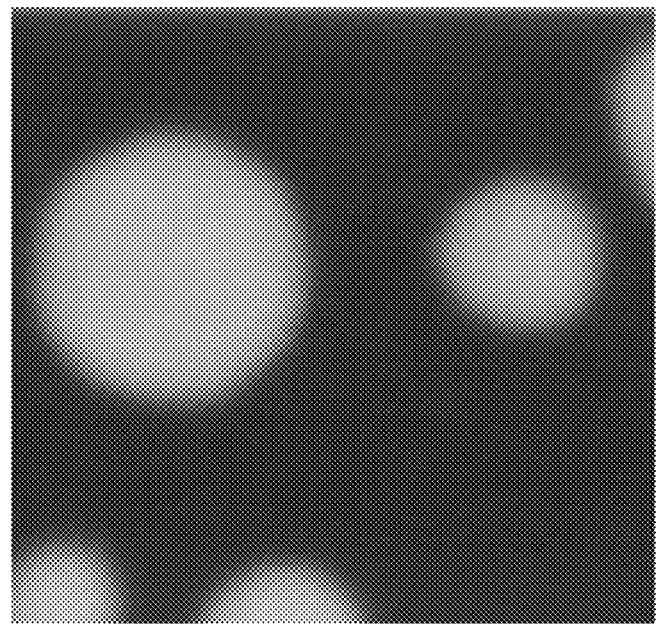
FIG. 14 is an AFM image of the self-assembled BCP-2 thin-film of composite layer CL-14 (Example 48, comparative). The AFM analysis indicates a step height of 20.0 nm (~1.0 Lo). This indicates that underlayer UL-14 (Example 43, comparative) formed with a blend of random copolymer G3-1 (Example 16) and G3-2 (Example 17), 20/80 w/w, is a non-neutral underlayer composition for the self-assembled domains of block copolymer BCP-2 (Example 19).
Figure 15:
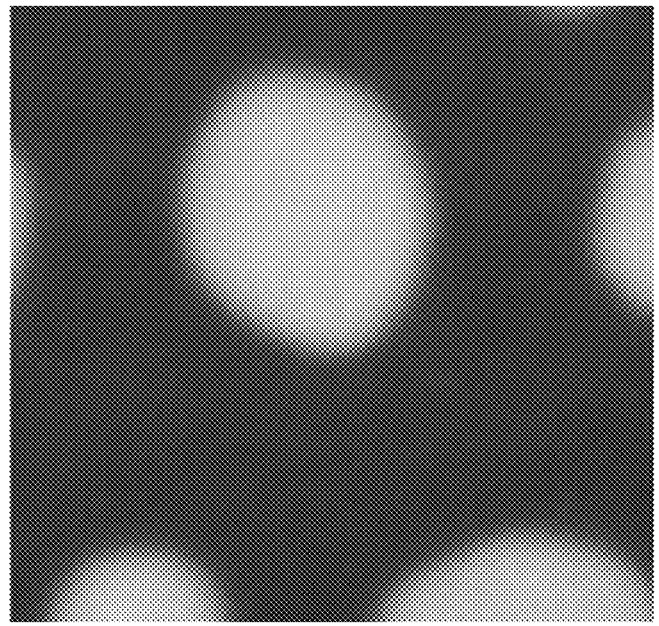
FIG. 15 is an AFM image of the self-assembled BCP-2 thin-film of composite layer CL-15 (Example 49, comparative). The AFM analysis indicates a step height of 20.0 nm (~1.0 Lo). This indicates that underlayer UL-15 (Example 44, comparative) formed with random graft copolymer G3-2 (Example 17) is a non-neutral underlayer composition for the self-assembled domains of block copolymer BCP-2 (Example 19).

UL-5 formed with G1-7 (Example 9) having PS:TMC mole ratio of 73:27 represents the PS-philic UL surface. The self-assembled BCP-1 layer morphology on UL-5 (Example 29) on this underlayer (composite layers CL-5) showed islands with step height 1.0 Lo (about 18.6 nm) corresponding to 'classical' symmetric wetting phenomenon (FIG. 5, AFM image). That is, the UL surface and the air interface were both non-neutral interfaces to BCP-1, preferentially wetted by the PS domain of BCP-1.

solids. p-NBT is a thermal acid generator and was added to promote the grafting and partial crosslinking of the random copolymer on a silicon wafer substrate when baked in the form of thin film. The solutions were passed through a 0.2 micrometer PTFE filter. For UL-9, solutions were blended in different weight ratios (w/w) to obtain the Sty:MMA:GMA mole ratio listed in Table 7. The resulting compositions were then spin coated on the silicon wafer at 3000 rpm spin rate. After the thin film was formed, the wafer was baked at 215° C. for 2 minutes and cooled to room temperature. A solvent rinse was then conducted by casting PGMEA on top of the baked wafer and letting it puddle for 30 seconds prior to spin drying at 3000 rpm for 30 seconds to form underlayers UL-7 to UL-10. The final film thicknesses of the underlayer films was about 7 nm after the solvent rinse.

Table 7 summarizes the preparations of underlayers UL-6 to UL-10.

TABLE 7

| Example | UL Name | Polymer | Polymer Mn | Sty:MMA:GMA Mole Ratio | Coating Condition % Solution, rpm/seconds | UL Film Bake ° C./ minutes |
|---|---|---|---|---|---|---|
| 30 (comp) | UL-6 | PMMA brush (AZ) | | 0:100:0 | 1500 rpm/30 sec | 250/2 |
| 31 (comp) | UL-7 | N22 | 9500 | 28:70:2 | 1%, 3000 rpm/30 sec | 215/2 |
| 32 (comp) | UL-8 | N3 | 12100 | 58:40:2 | 1%, 3000 rpm/30 sec | 215/2 |
| 33 (comp) | UL-9 | N3 + N6 = 50:50 Blend | | 66:32:2 | 1%, 3000 rpm/30 sec | 215/2 |
| 34 (comp) | UL-10 | N6 | 11600 | 74:24:2 | 1%, 3000 rpm/30 sec | 215/2 |

Examples 30-34 (Comparative)

Preparation of underlayer thin films UL-6 to UL-10 using random copolymers of styrene (Sty), methyl methacrylate (MMA), and glycidyl methacrylate (GMA), referred to as P(Sty-MMA-GMA).

UL-6 is a comparative example utilizing a hydroxy-terminated homopolymer of methyl methacrylate, referred to as PMMA-OH brush polymer. PMMA-OH was received from AZ Electronic Materials in the form of a solution in PGMEA (solution code NLD-303). The solution contained no pNBT and was used as received. The polymer solution was spin coated with 1500 rpm on a silicon wafer. The coated wafer was baked at 250° C. for 2 minutes prior to a solvent rinse to form UL-6. Film thickness of the baked underlayer films was measured as 5 nm with Nanospec Reflectometer.

UL-7 to UL-10 were formed using various P(Sty-MMA-GMA) random copolymers as shown below in Table 7. A coating solution was prepared by dissolving the solid P(Sty-MMA-GMA) material and p-NBT (p nitro benzylsulphonic acid, triflate salt) in 95/5 w/w ratio in PGMEA at 1.0 wt %

Examples 35-39 (Comparative)

Formation of composite layers CL-6 to CL-10 using block copolymer BCP-1 (PS-b-PTMC, Example 18) and underlayers UL-6 to UL-10 of Table 7.

Solid block copolymer BCP-1 (Example 18) was dissolved in PGMEA at a concentration of 1.2 wt % based on total weight of the solution. The solution was filtered (0.2 micrometer PTFE filter) and spin coated at 2000 rpm rate on each of underlayers UL-6 to UL-10 of Table 7. The BCP-1 thin films on the different underlayers were subsequently annealed at 140° C. for 5 minutes and immediately cooled to room temperature, thereby forming composite layers CL-6 to Cl-10 comprising a layer of self-assembled BCP-1. The self-assembled BCP-1 film thickness was about 23 nm as measured in a Nanospec Reflectometer. The composite films were characterized by AFM using a Digital Instruments 3100 AFM with a 1 N/m spring constant silicon nitride cantilever operated in a tapping mode. Scan size and speed were set at 2 μm×2 μm area and 1 Hz, respectively. The composite layers CL-6 to Cl-7 are summarized in Table 8.

TABLE 8

| Example | Composite Layer Name | Block Copolymer (BCP) | UL Sample | BCP Step height (nm) | Wetting by BCP domains | | Neutral UL? (Y/N) |
|---|---|---|---|---|---|---|---|
| | | | | | UL Surface | Air Interface | |
| 35 (comp) | CL-6 | BCP-1 | UL-6 | 18.5 | PS | PS | N |
| 36 (comp) | CL-7 | BCP-1 | UL-7 | 18.5 | PS | PS | N |
| 37 (comp) | CL-8 | BCP-1 | UL-8 | 18.5 | PS | PS | N |

TABLE 8-continued

| Example | Composite Layer Name | Block Copolymer (BCP) | UL Sample | BCP Step height (nm) | Wetting by BCP domains UL Surface | Air Interface | Neutral UL? (Y/N) |
|---|---|---|---|---|---|---|---|
| 38 (comp) | CL-9 | BCP-1 | UL-9 | 18.5 | PS | PS | N |
| 39 (comp) | CL-10 | BCP-1 | UL-10 | 18.5 | PS | PS | N |

The AFM characterization of the self-assembled BCP-1 film layers of CL-6 to CL-10 (FIG. 6 to FIG. 10, respectively, AFM images) had an island morphology with only 1.0 Lo vertical height (about 19 nm). This step height corresponds to the spacing period of the BCP-1 lamellar domains (1.0 Lo). That is, for the range of 100 mole % MMA (UL-6) to 26 mole % MMA (UL-10) of the underlayer composition, only 1.0 Lo island morphology was obtained with the high-chi block copolymer BCP-1, indicating that the PS block of BCP-1 preferentially wets both the air and UL interfaces (symmetric wetting). None of the combinations of styrene and methyl methacrylate of the underlayers UL-6 to UL-10 was neutral (non-preferential) with respect to the PS and PTMC blocks of BCP-1.

Examples 40-44 (Comparative)

Preparation of underlayer thin films UL-11 to UL-15 using lactide-functional random graft copolymers G3-1 (Example 16) and G3-2 (Example 17), and blends of G3-1 and G3-2.

The following procedure is representative. Separate solutions of each of the lactide-functional random graft copolymer G3-1 and G3-2 were prepared by dissolving the graft copolymer (95 parts by weight) and p-NBT (5 parts by weight) in PGMEA to a concentration of 1.0 wt % solids based on total weight of the solution. The solutions were passed through a 0.2 micrometer PTFE filter. The solutions were blended at various ratios (w/w) to get various mole % PS compositions of the resulting blends, as listed in Table 9 below.

Solutions of G3-1 and G3-2 and their blends were separately spin coated on respective silicon wafers at 2000 rpm spin rate. The coated wafers were baked at 190° C. for 3 minutes and cooled to room temperature. A solvent rinse was then conducted by casting PGMEA on top of the wafer and letting it puddle for 30 seconds prior to spin drying the wafer at 2000 rpm for 30 seconds. The rinse was intended to remove any excess random graft copolymer that was not crosslinked. Table 9 summarizes the film preparation conditions of underlayers UL-11 to UL-15.

TABLE 9

| Example | UL Name | Solution 1 | Solution 2 | Solution 1/2 (w/w) | Final PS mole % | Sty:Lac Mole Ratio |
|---|---|---|---|---|---|---|
| 40 (comp) | UL-11 | G3-1 | G3-2 | 100/0 | 36% | 36:64 |
| 41 (comp) | UL-12 | G3-1 | G3-2 | 50/50 | 54% | 54:46 |
| 42 (comp) | UL-13 | G3-1 | G3-2 | 30/70 | 61% | 61:39 |
| 43 (comp) | UL-14 | G3-1 | G3-2 | 20/80 | 65% | 65:35 |
| 44 (comp) | UL-15 | G3-1 | G3-2 | 0/100 | 72% | 72:28 |

Examples 45-49 (Comparative)

Preparation of composite layers CL-11 to CL-15 using block copolymer BCP-2 (PS-b-PLA, Example 19) and the underlayer films of Table 9.

A solution was prepared by dissolving solid BCP-2 (Example 19) in PGMEA at 1.2 wt % based on total weight of the solution. The solution was filtered with a 0.2 micrometer PTFE filter and spin coated at 2000 rpm rate on the various underlayer films of Table 9. The initial films were subsequently annealed at 140° C. for 5 minutes and cooled to room temperature. The annealed samples were then characterized by AFM. AFM characterization was performed with a Digital Instruments 3100 AFM with a 1 N/m spring constant silicon nitride cantilever operated in a tapping mode. Scan size and speed were set at 2 micrometer×2 micrometer area and 2.5 Hz respectively. The results are summarized in Table 10.

TABLE 10

| Example | Composite Layer Name | UL Name | Block Copolymer (BCP) | BCP Step height (nm) | Wetting of BCP domains UL Surface | Air Interface | Neutral UL? (Y/N) |
|---|---|---|---|---|---|---|---|
| 45 (comp) | CL-11 | UL-11 | BCP-2 | 20 | PS | PS | N |
| 46 (comp) | CL-12 | UL-12 | BCP-2 | 20 | PS | PS | N |
| 47 (comp) | CL-13 | UL-13 | BCP-2 | 20 | PS | PS | N |
| 48 (comp) | CL-14 | UL-14 | BCP-2 | 20 | PS | PS | N |
| 49 (comp) | CL-15 | UL-15 | BCP-2 | 20 | PS | PS | N |

The AFM characterization of composite layers CL-11 to CL-15 (FIG. 11 to FIG. 15, respectively, AFM images) showed that the self-assembled block copolymer BCP-2 (PS-b-PLA) formed the same island type of morphology on the various underlayers (mole percent styrene=36%, 54%, 61%, 65%, and 72%) with measured island height of 20 nm, which corresponded to the spacing period of the PS-b-PLA (1.0 Lo). The spacing period of the BCP-2 domains was estimated by comparing the molecular weight of BCP-2 (PS-b-PLA) to a PS-b-PLA block copolymer of similar molecular weight whose spacing period was reported by Keen, et. al., Langmuir 2012, volume 28, pages 15876-15888. This indicated that none of the various underlayer compositions UL-12 to UL-15 was neutral with respect to the self-assembled domains of BCP-2, causing parallel orientation of the BCP-2 lamellae and island formation having step height of 1.0 Lo.

Table 11 summarizes the composite layers and the wetting properties of the underlayer compositions with respect to the self-assembled domains of block copolymers BCP-1 and BCP-2.

a range of about 60:40 to 66:34. For the block copolymer BCP-1, the Sty:TMC mole ratio was 41:59 (Example 18).

When the underlayer had a Sty:TMC mole ratio of 24:76 (Example 25) or 73:27 (Example 29), non-neutral wetting of the underlayer was observed.

Neutral wetting was not observed when the underlayer and block copolymer both contained a polyester chain (i.e., poly(lactide) chain, comparative Examples 45-49).

Example 50 (Comparative)

Synthesis of block polymer BCP-3 (PS-b-PDMC) for self-assembly, where PS=polystyrene block, Mn=6200, x'=57 (DP) and PDMC is the poly(dimethyl trimethylene carbonate) block, Mn=7550, b'=58 (DP).

TABLE 11

| Ex. | Composite Layer Name | Underlayer (UL)[a] | | | | Block Copolymer Layer[a] | | BCP Step height (nm) | Wetting of BCP domains[b] | | Neutral UL? (Y/N) |
|---|---|---|---|---|---|---|---|---|---|---|---|
| | | Name | Polymer | mole ratio | DP ratio | BCP Name | DP ratio | | UL surface | Air Interface | |
| 25 | CL-1 | UL-1 | G1-3 | Sty:TMC 24:76 | Sty:TMC 50.5:160 | BCP-1 | Sty:TMC 57:82 | 18.6 | PTMC | PS | N |
| 26 | CL-2 | UL-2 | G1-2 | Sty:TMC 60:40 | Sty:TMC 50.5:33.6 | BCP-1 | Sty:TMC 57:82 | 9.3 | PS & PTMC | PS | Y |
| 27 | CL-3 | UL-3 | G1-10 | Sty:TMC 62:38 | Sty:TMC 50.5:30.8 | BCP-1 | Sty:TMC 57:82 | 10 | PS & PTMC | PS | Y |
| 28 | CL-4 | UL-4 | G1-8 | Sty:TMC 66:34 | Sty:TMC 50.5:25.9 | BCP-1 | Sty:TMC 57:82 | 10 | PS & PTMC | PS | Y |
| 29 | CL-5 | UL-5 | G1-7 | Sty:TMC 73:27 | Sty:TMC 50.5:18.6 | BCP-1 | Sty:TMC 57:82 | 18.6 | PS | PS | N |
| 35 (comp) | CL-6 | UL-6 | PMMA brush | Sty:MMA 0:100 | | BCP-1 | Sty:TMC 57:82 | 18.5 | PS | PS | N |
| 36 (comp) | CL-7 | UL-7 | N22 | Sty:MMA 28:70 | | BCP-1 | Sty:TMC 57:82 | 18.5 | PS | PS | N |
| 37 (comp) | CL-8 | UL-8 | N3 | Sty:MMA 58:40 | | BCP-1 | Sty:TMC 57:82 | 18.5 | PS | PS | N |
| 38 (comp) | CL-9 | UL-9 | N3 + N6 50:50 Blend | Sty:MMA 66:32 | | BCP-1 | Sty:TMC 57:82 | 18.5 | PS | PS | N |
| 39 (comp) | CL-10 | UL-10 | N6 | Sty:MMA 70:28 | | BCP-1 | Sty:TMC 57:82 | 18.5 | PS | PS | N |
| 45 (comp) | CL-11 | UL-11 | G3-1 | Sty:Lac 36:64 | | BCP-2 | Sty:Lac 57:79 | 20 | PS | PS | N |
| 46 (comp) | CL-12 | UL-12 | G3-1/ G3-2 | Sty:Lac 54:46 | | BCP-2 | Sty:Lac 57:79 | 20 | PS | PS | N |
| 47 (comp) | CL-13 | UL-13 | G3-1/ G3-2 | Sty:Lac 61:39 | | BCP-2 | Sty:Lac 57:79 | 20 | PS | PS | N |
| 48 (comp) | CL-14 | UL-14 | G3-1/ G3-2 | Sty:Lac 65:35 | | BCP-2 | Sty:Lac 57:79 | 20 | PS | PS | N |
| 49 (comp) | CL-15 | UL-15 | G3-2 | Sty:Lac 72:28 | | BCP-2 | Sty:Lac 57:79 | 20 | PS | PS | N |

[a]Lac = lactide, Sty = styrene, TMC = trimethylene carbonate
[b]PS = poly(styrene), PTMC = poly(trimethylene carbonate)

For perpendicular orientation of lamellae relative to the underlayer surface, it is desirable for the underlayer to be neutral (non-preferential) with respect to the domains of the self-assembled block copolymer (i.e., each domain wets the underlayer). This condition was satisfied for high-chi lamellae-forming block copolymer BCP-1 using underlayers UL-2 to UL-4 (Examples 26-28). For these underlayers, the styrene:trimethylene carbonate (Sty:TMC) mole ratio was in a range between 24:76 to about 73:27, more particularly in

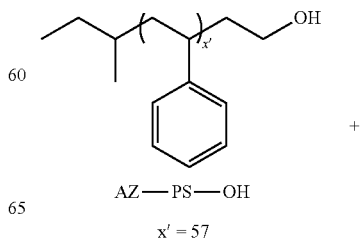

AZ—PS—OH x' = 57

+

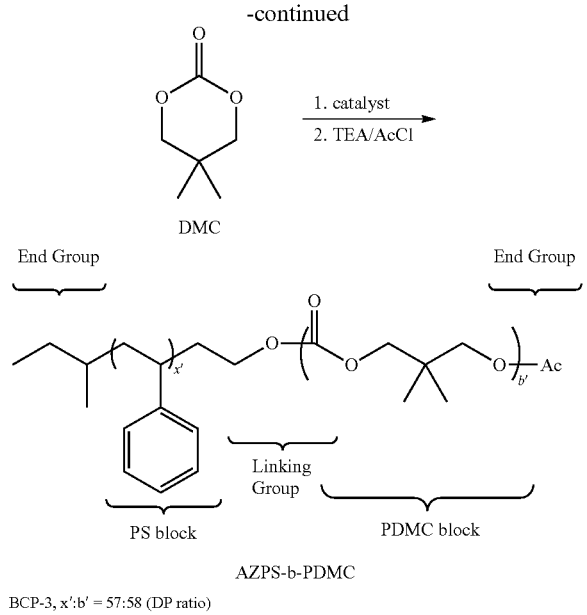

based on Mn=13750 (NMR). BCP-3 had a PS block:PDMC block weight ratio of 45:55 based on Mn=13750 (NMR).

Examples 51-52 (Comparative), Formation of Composite Layers CL-16 and CL-17, Respectively BCP-3 (Example 50, PS block Mn 6200, PDMC block Mn 7550) represents a lamellae forming block copolymer. A solution was prepared by dissolving BCP-3 in PGMEA at a concentration of 1.2 wt % based on total weight of the solution. The solution was filtered using a 0.2 micrometer PTFE filter and was spin coated at 2000 rpm rate on each of the underlayer films UL-3 and UL-4 of Examples 22 and 23, respectively. The resulting composite film layers containing the BCP-3 film layer on the different underlayers were subsequently annealed at 140° C. for 5 minutes and immediately cooled to room temperature. The BCP-3 films were also characterized by atomic force microscopy (AFM) using a Digital Instruments 3100 AFM with a 1 N/m spring constant silicon nitride cantilever operated in a tapping mode. Scan size and speed were set at 5 μm×5 μm (μm=micrometer or micron) area and 1 Hz respectively. Experimental details of each of the composite layers are summarized in Table 12.

TABLE 12

| | | Underlayer (UL)[a] | | Block Copolymer Layer[a] | | BCP | Wetting of BCP domains[b] | | Neutral |
|---|---|---|---|---|---|---|---|---|---|
| Example. | Composite Layer Name | Name | Polymer | Repeat Units/mole ratio | Block Copolymer (BCP) | BCP Blocks/DP ratio | Step height (nm) | UL surface | Air-interface | UL? (Y/N) |
| 51 (comp) | CL-16 | UL-3 | G1-10 | Sty:TMC 62:38 | BCP-3 | Sty:DMC 57:58 | 0 | PS | PS | N |
| 52 (comp) | CL-17 | UL-4 | G1-8 | Sty:TMC 66:34 | BCP-3 | Sty:DMC 57:58 | 0 | PS | PS | N |

Hydroxy-terminated polystyrene macroinitiator (AZPS-OH, 0.20 g, 0.0322 mmol, Mn=6200, PDI=1.02, obtained from AZ-Electronic Materials, Branchburg, N.J.), DMC (0.496 g, 3.81 mmol), and DCM (1.1 ml) were added to an oven dried 4 ml glass vial equipped with a magnetic stir bar. The reaction mixture was stirred until the AZPS-OH macroinitiator and DMC were completely dissolved in DCM, upon which ring opening polymerization catalyst diphenylphosphate DPP (75 mg, 0.303 mmol) was added. The reaction mixture was stirred at room temperature for 23 hours in a glove box. The reaction was stopped by adding DCM (2 ml), TEA (0.7 ml, 02.72 mmol) and acetyl chloride (0.25 ml, 3.52 mmol). The reaction was further stirred for two hours at room temperature. The product block polymer was isolated by precipitating the reaction mixture in methanol. The product was collected in a frit funnel by removing methanol under vacuum. The resulting solids were redissolved in THF to form a 20 wt % solution and reprecipitated in methanol. The solid was collected in a frit funnel and dried under vacuum at 40° C. for two hours to obtain block copolymer BCP-3. Mn (GPC)=16300, Mw=17100, PDI=1.05. The PS block had an Mn=6200 (by NMR) and a degree of polymerization (DP)=57.4. The PDMC block had an Mn=7550 and DP=58, indicating 46% conversion of DMC. This block copolymer was not fractionated to further purify the polymer. BCP-3 had a Sty:DMC mole ratio=50:50

Figure 16:
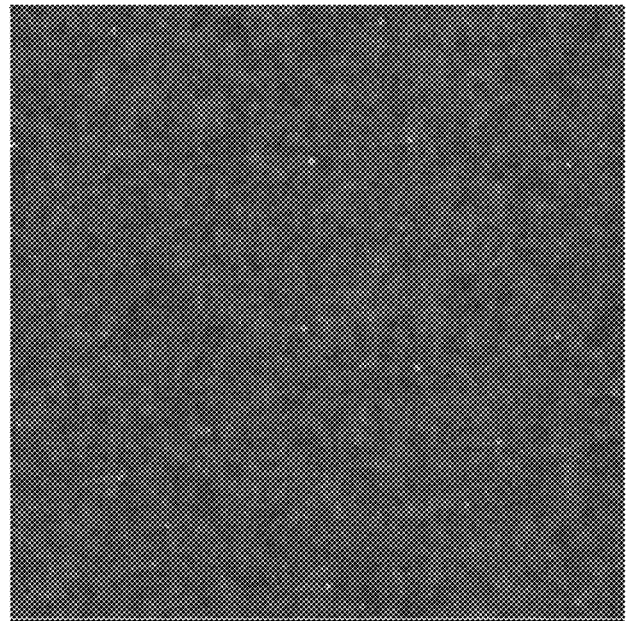
FIG. 16 is an AFM image of the self-assembled BCP-3 thin-film of composite layer CL-16 (Example 51, comparative). The film was flat and had no islands or holes. This indicates that underlayer UL-3 (Example 22) formed with random graft copolymer G1-10 (Example 12) is not neutral to BCP-3.

FIG. 16 (AFM image) shows a composite film, CL-16 (Example 51, comparative), formed with BCP-3 on UL-3 (Example 22) that was prepared from random graft copolymer G1-10 (Example 12). The film was flat having no island-hole morphology. This indicates that the underlayer composition of Example 22 was not neutral for PS-b-PDMC block copolymer.

Figure 17:
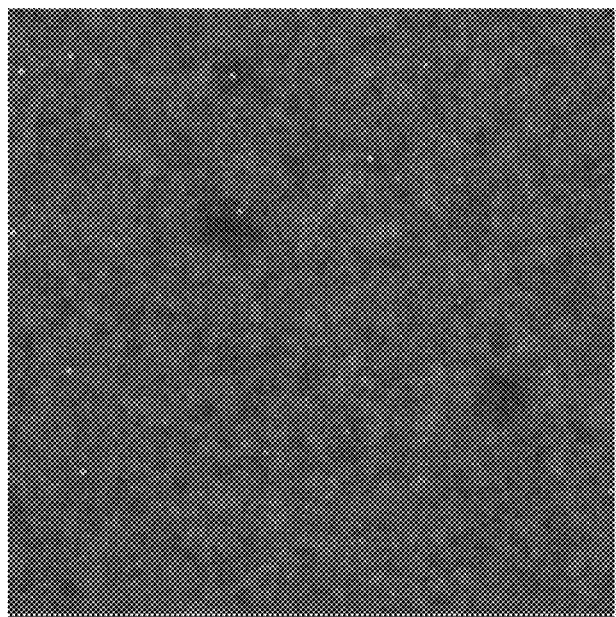
FIG. 17 is an AFM image of the self-assembled BCP-3 thin-film of composite layer CL-17 (Example 52, comparative). The film was flat and had no islands or holes. This indicates that underlayer UL-4 (Example 23) formed with random graft copolymer G1-8 (Example 10) is not neutral to BCP-3.

FIG. 17 (AFM image) shows a composite film, CL-17 (Example 52, comparative), formed with BCP-3 on UL-4 (Example 23) that was prepared from random graft copolymer G1-10 (Example 10). The film was flat having no island-hole morphology. This shows that the underlayer composition of Example 23 was not neutral for PS-b-PDMC block copolymer.

The above results indicate that neutral wetting properties of the underlayer are favored when carbonate repeat units of the polymer of the orientation control layer have the same chemical structures as carbonate repeat units of the polycarbonate block of the block copolymer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A polymer, comprising:
   i) a divalent first repeat unit of formula (A-1):

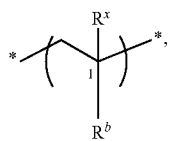

(A-1)

wherein
   $R^x$ is a monovalent radical selected from the group consisting of H, methyl, ethyl, and trifluoromethyl (*—CF$_3$), and
   $R^b$ is a monovalent radical comprising an aromatic ring;
   ii) a divalent second repeat unit of formula (A-2):

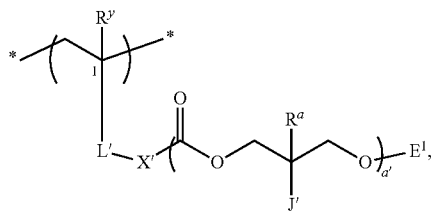

(A-2)

wherein
   a' represents numbers of repeat units enclosed by the parentheses and has an average value of 1 or more,
   $E^1$ is a monovalent end group independently selected from the group consisting of hydrogen and monovalent radicals comprising 1-10 carbons,
   each J' is an independent monovalent radical selected from the group consisting of hydrogen and monovalent radicals comprising 1 to 10 carbons,
   L' is an independent divalent radical linking group comprising 1 to 10 carbons,
   each $R^a$ is an independent monovalent radical selected from the group consisting of hydrogen, methyl, and ethyl,
   $R^y$ is a monovalent radical selected from the group consisting of H, methyl, ethyl, and trifluoromethyl (*—CF$_3$), and
   X' is an independent divalent radical selected from the group consisting of *—O—*, *—S—*, *—N(H)—*, and *—N(R")—*, wherein R" is a monovalent radical comprising 1 to 6 carbons; and
   iii) a divalent third repeat unit of formula (A-3):

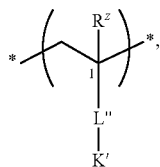

(A-3)

wherein
   $R^z$ is a monovalent radical selected from the group consisting of H, methyl, ethyl, and trifluoromethyl (*—CF$_3$),
   L" is an independent divalent linking group comprising 1 to 10 carbons, and
   K' is a monovalent radical selected from the group consisting of active carboxylic ester groups, halide groups, sulfonate esters, and groups containing an epoxide group, wherein K' is capable of reacting with a nucleophile to form a covalent bond;
   and wherein the first repeat unit, the second repeat unit, and the third repeat of the polymer are linked covalently in a random distribution.

2. The polymer of claim 1, wherein the polymer is suitable for use as an orientation control layer used in a lithographic process that includes self-assembly of a block copolymer disposed on the orientation control layer, wherein the block copolymer comprises a polycarbonate block.

3. The polymer of claim 1, wherein the polymer comprises the first repeat unit and the second repeat unit in a first repeat unit: second repeat unit mole ratio between 24:76 and 73:27 based on total moles of the first repeat unit and the second repeat unit.

4. The polymer of claim 1, wherein L'-X' is selected from the group consisting of

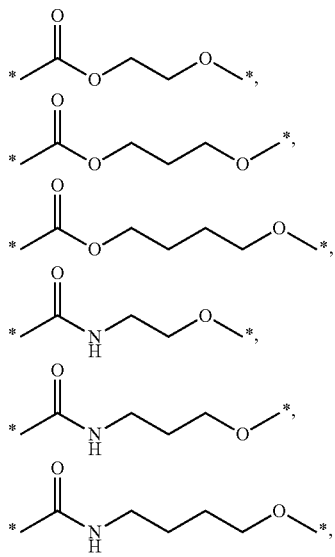

and combinations thereof, wherein the starred bond of the carbonyl group of L'-X' is linked to carbon 1 of formula (A-2).

5. The polymer of claim 1, wherein the second repeat unit is selected from the group consisting of

[chemical structure]

[chemical structure with $CO_2R^f$]

and
combinations thereof, wherein a' has an average value of about 1 to about 40 and $R^f$ is a monovalent radical comprising 1 to 10 carbons.

6. The polymer of claim 1, wherein the first repeat unit is a styrene repeat unit and the second repeat unit is a trimethylene carbonate repeat unit.

7. The polymer of claim 1, wherein $R^x$ is hydrogen and $R^b$ is phenyl of formula (A-1).

8. The polymer of claim 1, wherein $R^z$ is methyl and L"-K' is

[chemical structure]

of formula (A-3).

9. A method, comprising:
forming an initial layer disposed on a surface of a substrate, the initial layer comprising the polymer of claim 1 and a solvent, the substrate comprising a nucleophilic group capable of reacting with K' of the third repeat unit to form a derivative of the polymer, the derivative comprising a divalent linking group K" covalently linked to the substrate; and
treating the initial layer to remove the solvent, thereby forming an article (modified substrate) comprising an orientation control layer disposed on the surface of the substrate, wherein i) the orientation control layer comprises the derivative of the polymer comprising the linking group K" covalently linked to the substrate and ii) the orientation control layer is suitable for a lithographic process that includes self-assembly of a block copolymer disposed on the orientation control layer, the block copolymer comprising a polycarbonate block.

10. The method of claim 9, wherein the initial layer comprises a member of the group consisting of thermal acid generators (TAGs), photo-acid generators (PAGs), catalysts, and combinations thereof.

11. The method of claim 10, wherein said treating comprises baking the initial layer at a temperature and for a period of time suitable for covalently linking the polymer of claim 1 to the substrate.

12. The method of claim 9, wherein each block of the block copolymer is capable of wetting the orientation control layer.

13. The method of claim 9, wherein the block copolymer is capable of forming a domain pattern having a bulk periodicity (Lo) in the range of about 4 nm to about 40 nm.

14. The method of claim 9, wherein carbonate repeat units of the polymer of claim 1 have the same chemical structures as carbonate repeat units of the polycarbonate block of the block copolymer.

15. The method of claim 9, wherein carbonate repeat units of the polymer of claim 1 have chemical structures different than those of the carbonate repeat units of the polycarbonate block of the block copolymer.

16. The method of claim 9, wherein the block copolymer comprises:
i) a first block comprising a repeat unit of formula (B-1):

(B-1)

[chemical structure with $R^w$ and $R^d$]

wherein a) $R^w$ is a monovalent radical selected from the group consisting of H, methyl, ethyl, and trifluoromethyl (*—$CF_3$) and b) $R^d$ is a monovalent radical comprising an aromatic ring, and
ii) a second block comprising a repeat unit of formula (B-2):

(B-2)

[chemical structure with $R^e$ and J"]

wherein a) $R^e$ is an independent monovalent radical selected from the group consisting of hydrogen, methyl, and ethyl and b) J" is an independent monovalent radical selected from the group consisting of hydrogen and monovalent radicals comprising 1 to 10 carbons,
and wherein the first block and the second block of the block copolymer are covalently linked.

17. The method of claim 16, wherein $R^w$ of formula (B-1) is hydrogen, and $R^d$ is phenyl.

18. The method of claim 16, wherein J" and $R^e$ are hydrogen of formula (B-2).

19. An article (modified substrate), comprising:
a substrate; and
an orientation control layer disposed on a surface of the substrate, the orientation control layer comprising a derivative of the polymer of claim 1 which is covalently linked to the surface of the substrate, wherein the derivative comprises:
i) a divalent first repeat unit of formula (A-1):

(A-1)

[chemical structure with $R^x$ and $R^b$]

wherein
$R^x$ is a monovalent radical selected from the group consisting of H, methyl, ethyl, and trifluoromethyl (*—$CF_3$), and
$R^b$ is a monovalent radical comprising an aromatic ring;

ii) a divalent second repeat unit of formula (A-2):

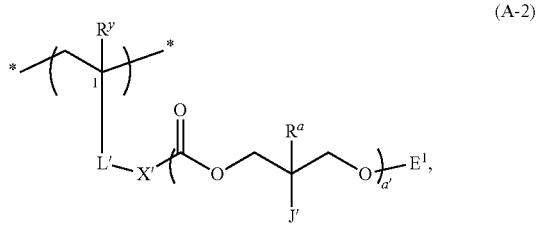

(A-2)

wherein
- a' represents numbers of repeat units enclosed by the parentheses and has an average value of 1 or more,
- $E^1$ is a monovalent end group independently selected from the group consisting of hydrogen and monovalent radicals comprising 1-10 carbons,
- each J' is an independent monovalent radical selected from the group consisting of hydrogen and monovalent radicals comprising 1 to 10 carbons,
- L' is an independent divalent radical linking group comprising 1 to 10 carbons,
- each $R^a$ is an independent monovalent radical selected from the group consisting of hydrogen, methyl, and ethyl,
- $R^y$ is a monovalent radical selected from the group consisting of H, methyl, ethyl, and trifluoromethyl (*—CF$_3$), and
- X' is an independent divalent radical selected from the group consisting of *—O—*, *—S—*, *—N(H)—*, and *—N(R")—*, wherein R" is a monovalent radical comprising 1 to 6 carbons; and (iii) a trivalent third repeat unit of formula (A-8):

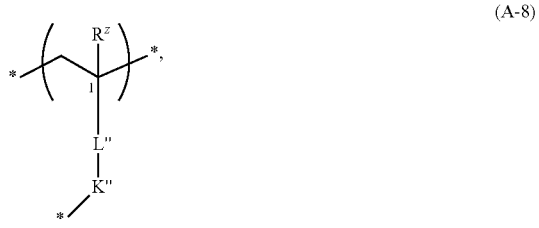

(A-8)

wherein
- $R^z$ is a monovalent radical selected from the group consisting of H, methyl, ethyl, and trifluoromethyl (*—CF$_3$),
- L" is an independent divalent linking group comprising 1 to 10 carbons, and
- K" is a divalent linking group covalently linked to the surface of the substrate, wherein K" is a product of a reaction of a nucleophilic group of the substrate with K' of the polymer of claim 1;

and wherein
- the first repeat unit, the second repeat unit, and the third repeat of the derivative are linked covalently in a random distribution, and
- the orientation control layer is neutral wetting with respect to a block copolymer comprising a polycarbonate block.

20. The article of claim 19, wherein the substrate comprises a silicon wafer.

21. The article of claim 19, wherein the substrate comprises an anti-reflection layer.

22. The article of claim 19, wherein the second repeat unit of the derivative is selected from the group consisting of

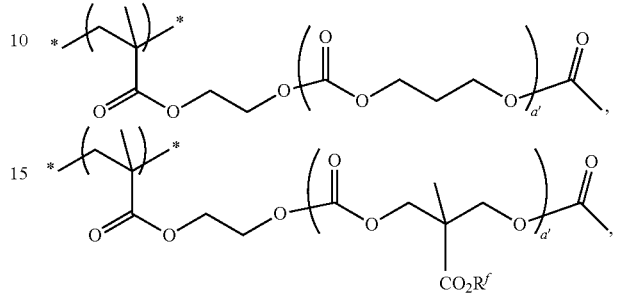

and combinations thereof, wherein a' has an average value of about 1 to about 40 and $R^f$ is a monovalent radical comprising 1 to 10 carbons.

23. A method of self-assembly, comprising:
- forming a layer comprising a block copolymer disposed on the orientation control layer of the article of claim 19, wherein the block copolymer comprises a polycarbonate block for self-assembly and the orientation control layer is neutral wetting to the block copolymer; and
- inducing the block copolymer to self-assemble, thereby forming a layered structure comprising a pattern of phase separated lamellar domains of the block copolymer disposed on the orientation control layer, wherein the orientation control layer is in contact with each block of the block copolymer.

24. The method of claim 23, wherein the block copolymer further comprises a poly(styrene) block.

25. The method of claim 23, wherein the block copolymer has a structure according to formula (B-3):

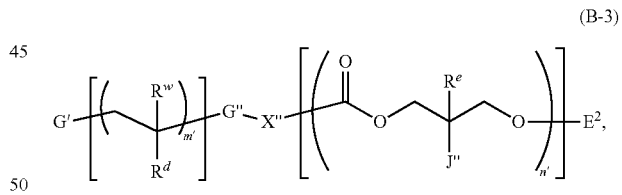

(B-3)

wherein
- subscripts m' and n' represent numbers of respective repeat units enclosed in parentheses,
- m' and n' independently have an average value greater than 1,
- $E^2$ is a monovalent radical end group selected from the group consisting of hydrogen and groups comprising 1-10 carbons,
- G' is a monovalent radical end group selected from the group consisting of hydrogen, halides, and groups comprising 1-10 carbons,
- G" is a divalent radical linking group comprising 1-10 carbons,
- each J" is an independent monovalent radical selected from the group consisting of hydrogen and monovalent radicals comprising 1 to 10 carbons, each $R^d$ is an independent monovalent radical comprising an aromatic ring, each $R^w$ is an independent monovalent radical selected from the group consisting of H, methyl, ethyl, and trifluoromethyl (*—$CF_3$), each $R^e$ is an independent monovalent radical selected from the group consisting of hydrogen, methyl, and ethyl, and each X" is an independent divalent radical selected from the group consisting of *—O—*, *—S—*, *—N(H)—*, and *—N(R")—*, wherein R" is a monovalent radical comprising 1 to 6 carbons.

26. The method of claim 25, wherein each $R^d$ is phenyl, each $R^e$ is hydrogen and each J" is hydrogen.

27. The method of claim 23, wherein the block copolymer is substantially free of any polycarbonate homopolymer and/or polycarbonate random copolymer.

\* \* \* \* \*